(12) United States Patent
Shibazaki

(10) Patent No.: US 8,947,639 B2
(45) Date of Patent: Feb. 3, 2015

(54) EXPOSURE METHOD AND APPARATUS MEASURING POSITION OF MOVABLE BODY BASED ON INFORMATION ON FLATNESS OF ENCODER GRATING SECTION

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/469,828

(22) Filed: May 11, 2012

(65) Prior Publication Data

US 2012/0224158 A1 Sep. 6, 2012

Related U.S. Application Data

(62) Division of application No. 13/191,829, filed on Jul. 27, 2011, now Pat. No. 8,203,697, which is a division of application No. 11/896,412, filed on Aug. 31, 2007, now Pat. No. 8,013,982.

(60) Provisional application No. 60/853,743, filed on Oct. 24, 2006.

(30) Foreign Application Priority Data

Aug. 31, 2006 (JP) .................. 2006-236975

(51) Int. Cl.
*G03B 27/58* (2006.01)
*G03F 7/20* (2006.01)
(52) U.S. Cl.
CPC .......... *G03F 7/0775* (2013.01); *G03F 7/70516* (2013.01)
USPC ........................................ 355/72

(58) Field of Classification Search
CPC .................. G03F 7/70775; G03F 7/70516
USPC ............... 355/72, 73–76, 52, 53; 356/616
See application file for complete search history.

(56) References Cited

U.S. PATENT DOCUMENTS

| 4,215,938 A | 8/1980 | Farrand et al. |
| 4,346,164 A | 8/1982 | Tabarelli et al. |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Sep. 14, 2012 Office Action issued in Japanese Patent Application No. 2008-532135 (with translation).

(Continued)

*Primary Examiner* — Chia-how Michael Liu
(74) *Attorney, Agent, or Firm* — Oliff PLC

(57) ABSTRACT

A drive unit drives a wafer stage in a Y-axis direction based on a measurement value of an encoder that measures position information of the wafer stage in the Y-axis direction and based on information on the flatness of a scale that is measured by the encoder. In this case, the drive unit can drive the wafer stage in a predetermined direction based on a measurement value after correction in which a measurement error caused by the flatness of the scale included in the measurement value of the encoder is corrected based on the information on the flatness of the scale. Accordingly, the wafer stage can be driven with high accuracy in a predetermined direction using the encoder, without being affected by the unevenness of the scale.

80 Claims, 33 Drawing Sheets

(56) References Cited

U.S. PATENT DOCUMENTS

| | | |
|---|---|---|
| 4,465,368 A | 8/1984 | Matsuura et al. |
| 4,480,910 A | 11/1984 | Takanashi et al. |
| 4,737,920 A | 4/1988 | Ozawa |
| 4,780,617 A | 10/1988 | Umatate et al. |
| 5,021,649 A | 6/1991 | Nishimura et al. |
| 5,070,250 A | 12/1991 | Komatsu et al. |
| 5,160,849 A | 11/1992 | Ota et al. |
| 5,247,165 A | 9/1993 | Hiruta et al. |
| 5,448,332 A | 9/1995 | Sakakibara et al. |
| 5,461,237 A | 10/1995 | Wakamoto et al. |
| 5,489,986 A | 2/1996 | Magome et al. |
| 5,523,843 A | 6/1996 | Yamane et al. |
| 5,581,324 A | 12/1996 | Miyai et al. |
| 5,583,609 A | 12/1996 | Mizutani et al. |
| 5,610,683 A | 3/1997 | Takahashi |
| 5,610,715 A | 3/1997 | Yoshii et al. |
| 5,625,453 A | 4/1997 | Matsumoto et al. |
| 5,650,840 A | 7/1997 | Taniguchi |
| 5,715,039 A | 2/1998 | Fukuda et al. |
| 5,825,043 A | 10/1998 | Suwa |
| 5,917,580 A | 6/1999 | Ebinuma et al. |
| 6,008,610 A | 12/1999 | Yuan et al. |
| 6,020,964 A | 2/2000 | Loopstra et al. |
| 6,262,796 B1 | 7/2001 | Loopstra et al. |
| 6,341,007 B1 | 1/2002 | Nishi et al. |
| 6,381,004 B1 | 4/2002 | Hagiwara et al. |
| 6,495,847 B1 | 12/2002 | Asano et al. |
| 6,501,532 B2 | 12/2002 | Suzuki |
| 6,611,316 B2 | 8/2003 | Sewell |
| 6,639,686 B1 | 10/2003 | Ohara |
| 6,674,510 B1 | 1/2004 | Jasper et al. |
| 6,778,257 B2 | 8/2004 | Bleeker et al. |
| 6,819,425 B2 | 11/2004 | Kwan |
| 7,023,610 B2 | 4/2006 | Ohtsuki et al. |
| 7,025,498 B2 | 4/2006 | Del Puerto |
| 7,075,616 B2 | 7/2006 | Derksen et al. |
| 7,102,729 B2 | 9/2006 | Renkens et al. |
| 7,161,659 B2 | 1/2007 | Van Den Brink et al. |
| 7,224,436 B2 | 5/2007 | Derksen et al. |
| 7,230,682 B2 | 6/2007 | Shimizu et al. |
| 7,253,875 B1 | 8/2007 | Luttikhuis et al. |
| 7,256,871 B2 | 8/2007 | Loopstra et al. |
| 7,257,902 B2 | 8/2007 | Gao et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,348,574 B2 | 3/2008 | Pril et al. |
| 7,349,069 B2 | 3/2008 | Beems et al. |
| 7,362,446 B2 | 4/2008 | Van Der Pasch et al. |
| 7,405,811 B2 | 7/2008 | Beems et al. |
| 7,408,655 B2 | 8/2008 | Loopstra et al. |
| 7,483,120 B2 | 1/2009 | Luttikhuis et al. |
| 7,515,719 B2 | 4/2009 | Hooley et al. |
| 7,528,965 B2 | 5/2009 | Loopstra et al. |
| 7,602,489 B2 | 10/2009 | Van Der Pasch et al. |
| 7,619,207 B2 | 11/2009 | Loopstra et al. |
| 7,636,165 B2 | 12/2009 | Klaver et al. |
| 7,710,540 B2 | 5/2010 | Loopstra et al. |
| 7,859,686 B2 | 12/2010 | Loopstra et al. |
| 7,880,901 B2 | 2/2011 | Loopstra et al. |
| 8,013,982 B2 | 9/2011 | Shibazaki |
| 8,203,697 B2 | 6/2012 | Shibazaki |
| 8,675,171 B2 | 3/2014 | Shibazaki |
| 2001/0013927 A1 | 8/2001 | Itoh et al. |
| 2001/0028456 A1 | 10/2001 | Nishi |
| 2001/0029674 A1 | 10/2001 | Cutler |
| 2002/0021450 A1 | 2/2002 | Aoki |
| 2002/0041377 A1 | 4/2002 | Hagiwara et al. |
| 2002/0041380 A1 | 4/2002 | Kwan |
| 2002/0061469 A1 | 5/2002 | Tanaka |
| 2003/0011771 A1 | 1/2003 | Moriyama |
| 2003/0025890 A1 | 2/2003 | Nishinaga |
| 2004/0130691 A1 | 7/2004 | Boonman et al. |
| 2004/0165159 A1 | 8/2004 | Lof et al. |
| 2004/0263846 A1 | 12/2004 | Kwan |
| 2005/0030507 A1 | 2/2005 | Teunissen et al. |
| 2005/0128461 A1 | 6/2005 | Beems et al. |
| 2005/0168714 A1 | 8/2005 | Renkens et al. |
| 2005/0190375 A1 | 9/2005 | Akimoto |
| 2006/0023178 A1 | 2/2006 | Loopstra et al. |
| 2006/0023194 A1 | 2/2006 | Loopstra et al. |
| 2006/0092419 A1 | 5/2006 | Gui |
| 2006/0139595 A1 | 6/2006 | Koenen et al. |
| 2006/0139660 A1 | 6/2006 | Kwan |
| 2006/0170892 A1 | 8/2006 | Koenen et al. |
| 2006/0227309 A1 | 10/2006 | Loopstra et al. |
| 2006/0238731 A1 | 10/2006 | Beems et al. |
| 2006/0238733 A1 | 10/2006 | Beems et al. |
| 2007/0035267 A1 | 2/2007 | Gao et al. |
| 2007/0051160 A1 | 3/2007 | Pril et al. |
| 2007/0052976 A1 | 3/2007 | Pril et al. |
| 2007/0076218 A1 | 4/2007 | Van Empel et al. |
| 2007/0195296 A1 | 8/2007 | Van Der Pasch et al. |
| 2007/0211235 A1 | 9/2007 | Shibazaki |
| 2007/0223007 A1 | 9/2007 | Klaver et al. |
| 2007/0256471 A1 | 11/2007 | Loopstra et al. |
| 2007/0258079 A1 | 11/2007 | Kamidi et al. |
| 2007/0263191 A1 | 11/2007 | Shibazaki |
| 2007/0263197 A1 | 11/2007 | Luttikhuis et al. |
| 2007/0288121 A1 | 12/2007 | Shibazaki |
| 2008/0043212 A1 | 2/2008 | Shibazaki |
| 2008/0074681 A1 | 3/2008 | Loopstra et al. |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094604 A1 | 4/2008 | Shibazaki |
| 2008/0105026 A1 | 5/2008 | Loopstra et al. |
| 2008/0106722 A1 | 5/2008 | Shibazaki |
| 2008/0123067 A1 | 5/2008 | Yoda et al. |
| 2008/0218713 A1 | 9/2008 | Shibazaki |
| 2008/0240501 A1 | 10/2008 | Wijst et al. |
| 2008/0246936 A1 | 10/2008 | Loopstra et al. |
| 2008/0309950 A1 | 12/2008 | Kwan |
| 2009/0033900 A1 | 2/2009 | Kanaya |
| 2009/0207422 A1 | 8/2009 | Loopstra et al. |
| 2009/0268178 A1 | 10/2009 | Shibazaki |
| 2010/0220335 A1 | 9/2010 | Loopstra et al. |
| 2011/0075154 A1 | 3/2011 | Loopstra et al. |

FOREIGN PATENT DOCUMENTS

| | | |
|---|---|---|
| EP | 0 482 553 A2 | 10/1991 |
| EP | 0 482 553 A2 | 4/1992 |
| EP | 1 079 223 A1 | 2/2001 |
| EP | 1 420 298 A2 | 5/2004 |
| EP | 1 621 933 A2 | 2/2006 |
| EP | 1 630 585 A1 | 3/2006 |
| EP | 2 003 680 A1 | 12/2008 |
| EP | 2 071 612 A1 | 6/2009 |
| JP | 57-117238 A | 7/1982 |
| JP | 58-202448 A | 11/1983 |
| JP | 59-019912 A | 2/1984 |
| JP | 61-044429 A | 3/1986 |
| JP | 62-065326 A | 3/1987 |
| JP | 63-157419 A | 6/1988 |
| JP | 63-292005 A | 11/1988 |
| JP | 03-167419 A | 7/1991 |
| JP | 04-265805 A | 9/1992 |
| JP | 04-305915 A | 10/1992 |
| JP | 04-305917 A | 10/1992 |
| JP | 05-062877 A | 3/1993 |
| JP | 05-129184 A | 5/1993 |
| JP | 06-124873 A | 5/1994 |
| JP | 06-283403 A | 10/1994 |
| JP | 07-190741 A | 7/1995 |
| JP | 07-220990 A | 8/1995 |
| JP | 07-270122 A | 10/1995 |
| JP | 08-316125 A | 11/1996 |
| JP | 09-318321 A | 12/1997 |
| JP | 10-063011 A | 3/1998 |
| JP | 10-214783 A | 8/1998 |
| JP | 10-223528 A | 8/1998 |
| JP | 10-303114 A | 11/1998 |
| JP | 10-340846 A | 12/1998 |

(56) References Cited

FOREIGN PATENT DOCUMENTS

| | | |
|---|---|---|
| JP | 11-16816 A | 1/1999 |
| JP | 11-176727 A | 7/1999 |
| JP | 2000-058436 A | 2/2000 |
| JP | A-2001-188017 | 7/2001 |
| JP | 2001-313250 A | 11/2001 |
| JP | 2002-14005 A | 1/2002 |
| JP | 2002-090114 A | 3/2002 |
| JP | 2002-151405 A | 5/2002 |
| JP | 3303386 B | 7/2002 |
| JP | 2003-022959 A | 1/2003 |
| JP | A-2003-249443 | 9/2003 |
| JP | 2003-347184 A | 12/2003 |
| JP | 2004-101362 A | 4/2004 |
| JP | 2004-519850 A | 7/2004 |
| JP | 2005-268608 A | 9/2005 |
| JP | A-2005-249452 | 9/2005 |
| JP | 2005-308592 A | 11/2005 |
| JP | A-2006-54452 | 2/2006 |
| JP | A-2007-71874 | 3/2007 |
| JP | 2007-093546 A | 4/2007 |
| JP | A-2012-138621 | 7/2012 |
| WO | WO 98/040791 A1 | 9/1998 |
| WO | WO 99/46835 A1 | 9/1999 |
| WO | WO 99/49504 A1 | 9/1999 |
| WO | WO 99/60361 A1 | 11/1999 |
| WO | WO 01/35168 A1 | 5/2001 |
| WO | WO 02/069049 A2 | 9/2002 |
| WO | WO 03/065428 A1 | 8/2003 |
| WO | WO 2004/019128 A2 | 3/2004 |
| WO | WO 2004/053955 A1 | 6/2004 |
| WO | WO 2004/092833 A2 | 10/2004 |
| WO | WO 2004/107011 A1 | 12/2004 |
| WO | WO 2005/074014 A1 | 8/2005 |
| WO | WO 2005/090902 A1 | 9/2005 |
| WO | WO 2005/124834 A1 | 12/2005 |
| WO | WO 2006/038952 A2 | 4/2006 |
| WO | WO 2006/057263 A1 | 6/2006 |

OTHER PUBLICATIONS

Sep. 14, 2012 Office Action issued in Japanese Patent Application No. 2008-532137 (with translation).
Sep. 14, 2012 Office Action issued in Japanese Patent Application No. 2008-533143 (with translation).
European Search Report for European Application No. EP 07 80 6512 mailed Mar. 21, 2011.
Original and English-language translation of Chinese Office Action for Chinese Application No. 2007-800099231 mailed Feb. 5, 2010.
Written Opinion for PCT Application No. PCT/JP2007/067039 mailed Dec. 11, 2007.
International Search Report for PCT Application No. PCT/JP2007/067039 mailed Dec. 11, 2007.
Written Opinion for PCT Application No. PCT/W2007/067063 mailed Dec. 11, 2007.
International Search Report for PCT Application No. PCT/JP2007/067124 mailed Dec. 11, 2007.
Written Opinion for PCT Application No. PCT/JP2007/067124 mailed Dec. 11, 2007.
International Search Report for PCT Application No. PCT/JP2007/067074 mailed Dec. 11, 2007.
Written Opinion for PCT Application No. PCT/JP2007/067074 mailed Dec. 11, 2007.
International Search Report for PCT Application No. PCT/JP2007/067123 mailed Dec. 11, 2007.
Written Opinion for PCT Application No. PCT/JP2007/067123 mailed Dec. 11, 2007.
Office Action for U.S. Appl. No. 11/896,577 mailed Mar. 1, 2011.
Office Action for U.S. Appl. No. 11/896,577 mailed Sep. 10, 2010.
Office Action for U.S. Appl. No. 11/896,579 mailed Jul. 9, 2010.
Office Action for U.S. Appl. No. 11/896,579 mailed Dec. 30, 2010.
Office Action for U.S. Appl. No. 11/896,411 mailed Mar. 3, 2011.
Office Action for U.S. Appl. No. 11/896,411 mailed Sep. 8, 2010.
Office Action for U.S. Appl. No. 11/896,448 mailed May 13, 2010.
Office Action for U.S. Appl. No. 11/896,448 mailed Sep. 30, 2009.
Office Action for U.S. Appl. No. 11/896,448 mailed Jan. 28, 2009.
English-language translation of JP 2005-268608 A, dated Sep. 29, 2005.
English-language translation of Chinese Office Action from Chinese Application No, 2007-800104390 mailed Feb. 12, 2010.
English-language translation of Chinese Office Action from Chinese Application No. 2007-800102592 mailed Jan. 29, 2010.
English-language translation of Chinese Office Action from Chinese Application No. 2007-80009833.2 mailed Mar. 1, 2010.
Written Opinion for PCT/JP2007/050821 with English-language translation.
Aug. 15, 2011 Office Action issued in U.S. Appl. No. 11/896,579.
Aug. 17, 2011 Office Action issued in U.S. Appl. No. 11/896,577.
Jul. 13, 2011 Chinese Office Action issued in Chinese Application No. 200780010439.0 (with translation).
Dec. 22, 2011 Office Action issued in Chinese Patent Application No. 2007800098332 (with translation).
Jan. 11, 2012 Office Action issued in Chinese Patent Application No. 200780009923.1 (with English Translation).
Mar. 9, 2012 Office Action issued in Japanese Patent Application No. 2008-533142 (with English Translation).
Mar. 22, 2012 Office Action issued in Japanese Patent Application No. 2008-532138 (with English Translation).
Jun. 5, 2012 Office Action issued in U.S. Appl. No. 11/896,448.
Dec. 10, 2012 Office Action issued in Japanese Patent Application No. 2008-532135 (with translation).
Nov. 22, 2012 Office Action issued in Japanese Patent Application No. 2008-532137 (with translation).
Dec. 10, 2012 Office Action issued in Japanese Patent Application No. 2008-533143 (with translation).
Dec. 21, 2012 Office Action issued in U.S. Appl. No. 13/469,869.
Sep. 18, 2013 Office Action issued in Japanese Patent Application No. 2012-079012 (with translation).
Aug. 30, 2013 Office Action issued in U.S. Appl. No. 11/896,411.
Jul. 1, 2013 Office Action issued in U.S. Appl. No. 13/469,869.
Jan. 24, 2014 Office Action issued in U.S. Appl. No. 11/896,577.
May 12, 2014 Office Action issued in U.S. Appl. No. 13/363,079.
May 27, 2014 Office Action issued in Japanese Patent Application No. 2013-160145 (with translation).
Apr. 25, 2014 European Search Report issued in European Patent Application No. 07 80 6596.8.
Apr. 24, 2014 European Search Report issued in European Patent Application No. 07 80 6597.6.
Mar. 19, 2013 Office Action issued in U.S. Appl. No. 11/896,411.
May 7, 2014 Office Action issued in Japanese Patent Application No. 2013-162193 (with translation).
Apr. 10, 2014 Search Report issued in European Patent Application No. 07806536.4.
Apr. 10, 2014 Search Report issued in European Patent Application No. 07806547.1.
McCarthy, Kevin, "Accuracy in Positioning Systems", New England Affiliated Technologies, reprinted from The Motion Control Technology Conference Proceedings, Mar. 19-21, 1991.
Nov. 12, 2013 Office Action issued in Japanese Patent Application No. 2012-245015 (with translation).
U.S. Appl. No. 14/168,299, filed Jan. 30, 2014.
U.S. Appl. No. 13/469,869, filed May 11, 2012.
U.S. Appl. No. 13/363,079, filed Jan. 31, 2012.
U.S. Appl. No. 14/067,503, filed Oct. 30, 2013.
U.S. Appl. No. 14/067,110, filed Oct. 30, 2013.
Apr. 30, 2010 Office Action issued in U.S. Appl. No. 11/896,412.
Aug. 11, 2010 Office Action issued in U.S. Appl. No. 11/896,412.
Nov. 20, 2012 Office Action issued in U.S. Appl. No. 11/896,448.
Sep. 2, 2014 Office Action issued in Japanese Application No. 2014-000972 (with English Translation).

EXPOSURE METHOD AND APPARATUS MEASURING POSITION OF MOVABLE BODY BASED ON INFORMATION ON FLATNESS OF ENCODER GRATING SECTION

CROSS-REFERENCE TO RELATED APPLICATIONS

This is a Division of application Ser. No. 13/191,829 filed Jul. 27, 2011, which is a Division of application Ser. No. 11/896,412 filed Aug. 31, 2007 (now U.S. Pat. No. 8,013,982 issued Sep. 6, 2011), which in turn claims the benefit of U.S. Provisional Application No. 60/853,743 filed Oct. 24, 2006 and Japanese Patent Application No. 2006-236975 filed Aug. 31, 2006. The disclosure of the prior applications is hereby incorporated by reference herein in their entirety.

BACKGROUND OF THE INVENTION

1. Field of the Invention

The present invention relates to movable body drive methods and movable body drive systems, pattern formation methods and apparatuses, exposure methods and apparatuses, and device manufacturing methods, and more particularly to a movable body drive method and a movable body drive system that drive a movable body within a moving plane, a pattern formation method using the movable body drive method and a pattern formation apparatus equipped with the movable body drive system, an exposure method using the movable body drive method and an exposure apparatus equipped with the movable body drive system, and a device manufacturing method using the pattern formation method.

2. Description of the Background Art

Conventionally, in a lithography process in the manufacturing of microdevices (electron devices or the like) such as semiconductor devices and liquid crystal display devices, exposure apparatuses such as a reduction projection exposure apparatus by a step-and-repeat method (a so-called stepper) and a reduction projection exposure apparatus by a step-and-scan method (a so-called scanning stepper (which is also called a scanner) are relatively frequently used.

In these types of exposure apparatuses, in order to transfer a pattern of a reticle (or mask) to a plurality of shot areas on a wafer, a wafer stage that holds the wafer is driven in XY two-dimensional directions by, for example, a linear motor or the like. In particular, in the case of the scanning stepper, not only the wafer stage but also a reticle stage is driven by a linear motor or the like in a scanning direction in a predetermined stroke. Generally, position measurement of the reticle stage or the wafer stage is performed using a laser interferometer whose measurement values have good stability for a long period and which has a high resolution.

However, more accurate position control has been required due to finer patterns to cope with higher integration of semiconductors, and recently the short-term fluctuation of the measurement values caused by variation in the temperature of the atmosphere on the beam optical path of the laser interferometer has been accounting for a large share of the overlay budget.

Meanwhile, as a measurement apparatus other than the laser interferometer to be used for position measurement of a stage, an encoder can be cited, but because the encoder uses scales and the scales lack mechanical long-term stability (due to drift of scale pitch, fixed position drift, thermal expansion, and the like), and therefore, the encoder suffers from the disadvantages of lacking the linearity of the measurement values and being inferior in the long-term stability, compared with the laser interferometer.

In view of the disadvantages of the laser interferometer and the encoder as described above, various types of apparatuses that measure the position of a stage using both a laser interferometer and an encoder (position detection sensor that uses a diffraction grating) have been proposed (refer to Kokai (Japanese Unexamined Patent Application Publications) No. 2002-151405 and No. 2004-101362, and the like).

Further, although a measurement resolution of a conventional encoder was inferior to that of an interferometer, recently encoders having the measurement resolution equal or superior to the laser interferometers have come out (e.g. refer to Kokai (Japanese Unexamined Patent Application Publication) No. 2005-308592 and the like), and the technique of combining the laser interferometer and the encoder has been gathering attention.

However, in the case position measurement within the moving plane of a wafer stage on which a scale (grating) is arranged is performed using an encoder head, for example, in an exposure apparatus, the accuracy of the grating is similar to that of a movable mirror without bending correction, and therefore from the viewpoint of accuracy, it is obvious that the result of the position measurement without any correction can hardly be used for the position setting. That is, correction in view of the accuracy error of the grating is required. Further, in actual, since a grating surface is not a complete plane and the error component due to the uneven surface of the grating surface is also included in a count value, this error component also needs to be corrected. Moreover, there is the inconvenience that the measurement error of the encoder occurs due to not only the scale (e.g. flatness of the grating surface, or grating formation error) but also a head unit (e.g. gradient of the head, or optical characteristics), a relative displacement of the head and the scale in directions different from a measurement direction in which the encoder measures the position of the wafer stage, or the like.

SUMMARY OF THE INVENTION

The present invention has been made in consideration of the situation described above, and according to a first aspect of the present invention, there is provided a first movable body drive method in which a movable body is driven substantially along a predetermined plane, the method including: a process of measuring position information of the movable body in a predetermined direction within a plane parallel to the predetermined plane using an encoder that has a head that irradiates a detection light to a scale having a grating whose periodic direction is the predetermined direction and receives a reflected light from the scale, and of driving the movable body in the predetermined direction based on the measurement value and information on flatness of the scale.

With this method, position information of the movable body in a predetermined direction parallel to the predetermined plane is measured by using the encoder having a head that irradiates a detection light to a scale having a grating whose periodic direction is the predetermined direction and receives a reflected light from the scale, and the movable body can be driven in the predetermined direction based on the measurement value after correction in which a measurement error caused by the flatness of the scale included in the measurement value of the encoder has been corrected based on information on the flatness of the scale. Accordingly, the movable body can be driven in the predetermined direction with high accuracy using the encoder without being affected by the unevenness of the scale.

According to a second aspect of the present invention, there is provided a second movable body drive method in which a movable body is driven within a moving plane including first and second axes that are orthogonal to each other, the method including: a first moving process of moving the movable body in a direction parallel to the first axis, based on a measurement value of a first interferometer that measures position information of the movable body in a direction parallel to the second axis by irradiating a measurement beam to a reflection surface arranged on the movable body, and a measurement value of a second interferometer that measures position information of the movable body in a direction parallel to the first axis by irradiating a measurement beam to a reflection surface arranged on the movable body; a process of deciding correction information of grating pitch of a scale that is sequentially placed facing a head unit according to the movement of the movable body in the first moving process, based on a measurement value of the second interferometer, a measurement value of an encoder and information on flatness of the scale, the head unit constituting the encoder that measures position information of the movable body in a direction parallel to the first axis based on a measurement value of a head that faces the scale arranged on the movable body having a grating in a predetermined pitch whose periodic direction is the direction parallel to the first axis, and including a plurality of the heads that are placed at a predetermined distance along a direction parallel to the second axis; and a process of driving the movable body in a direction parallel to the first axis, while correcting a measurement value obtained from the head unit based on the correction information of grating pitch.

With this method, the movable body is moved in a direction parallel to the first axis, based on the measurement value of the first interferometer that measures position information of the movable body in a direction parallel to the second axis and the measurement value of the second interferometer that measures position information of the movable body in a direction parallel to the first axis. Then, correction information of grating pitch of the scale that is sequentially placed facing the head unit according to the movement of the movable body in the first moving process is decided based on the measurement value of the second interferometer, the measurement value of the encoder and information on the flatness of the scale, the head unit constituting an encoder that measures position information of the movable body in a direction parallel to the first axis based on the measurement value of the head facing the scale that is arranged on the movable body and has a grating in a predetermined pitch whose periodic direction is a direction parallel to the first axis, and including a plurality of the heads placed at a predetermined distance in a direction parallel to the second axis. In this case, a measurement error caused by the flatness of the scale included in the measurement value of the encoder can be corrected based on information on the flatness of the scale, and correction information of the grating pitch can be decided based on the measurement value of the encoder after the correction and the measurement value of the second interferometer. Then, while correcting the measurement value obtained from the head unit based on the correction information of grating pitch, the movable body is driven in a direction parallel to the first axis. Accordingly, the movable body can be driven in a predetermined direction with high accuracy using the encoder without being affected by the unevenness of the scale and an error of grating pitch of the scale.

According to a third aspect of the present invention, there is provided a pattern formation method, including: a process of mounting an object on a movable body that can move within a moving plane; and a process of driving the movable body using either one of the first and second movable body drive methods of the present invention in order to form a pattern on the object.

With this method, by forming a pattern on the object that is mounted on the movable body that is driven with high accuracy using either one of the first and second movable body drive methods of the present invention, the pattern can be formed on the object with high accuracy.

According to a fourth aspect of the present invention, there is provided a first device manufacturing method including a pattern formation process, wherein in the pattern formation process, a pattern is formed on a substrate using the pattern formation method of the present invention.

According to a fifth aspect of the present invention, there is provided a first exposure method in which a pattern is formed on an object by irradiation of an energy beam, the method including: driving a movable body on which the object is mounted, using either one of the first and second movable body drive methods of the present invention, for relative movement of the energy beam and the object.

With this method, for the relative movement of the energy beam irradiated to the object and the object, the movable body on which the object is mounted is driven with high accuracy using either one of the first and second movable body drive methods of the present invention.

According to a sixth aspect of the present invention, there is provided a second exposure method in which an object is exposed with an energy beam, the method including: mounting the object on a movable body that can move in at least first and second directions that are orthogonal within a predetermined plane; and driving the movable body within the predetermined plane, based on measurement information of an encoder system in which one of a grating section and a head unit is arranged on a surface of the movable body on which the object is mounted and the other of the grating section and the head unit is arranged facing the surface of the movable body and which measures position information of the movable body within the predetermined plane, and based on information on flatness of the grating section.

With this method, the movable body can accurately be driven within a predetermined plane using the encoder system without being affected by the flatness of the grating section, and therefore the object mounted on the movable body can be exposed with high accuracy.

According to a seventh aspect of the present invention, there is provided a third exposure method in which an object is exposed with an energy beam, the method including: mounting the object on a movable body that can move in at least first and second directions that are orthogonal within a predetermined plane; and controlling a position of the movable body within the predetermined plane so that a measurement error of an encoder system, in which one of a grating section and a head unit is arranged on a surface of the movable body on which the object is mounted and the other of the grating section and the head unit is arranged facing the surface of the movable body and which measures position information of the movable body within the predetermined plane, is compensated, based on measurement information of the encoder system and correction information in accordance with characteristic information of the grating section and the head unit.

With this method, the position of the movable body can accurately be controlled within a predetermined plane using the encoder system without being affected by a measurement error of the encoder system caused by the grating section and (characteristics) of the head unit, and therefore the object mounted on the movable body can be exposed with high accuracy.

According to an eighth aspect of the present invention, there is provided a fourth exposure method in which an object is exposed with an energy beam, the method including: mounting the object on a movable body that can move in at least first and second directions that are orthogonal within a predetermined plane; and controlling a position of the movable body within the predetermined plane, based on measurement information of an encoder system in which one of a grating section and a head unit is arranged on a surface of the movable body on which the object is mounted and the other of the grating section and the head unit is arranged facing the surface of the movable body and which measures position information of the movable body within the predetermined plane, and based on correction information to compensate a measurement error of the encoder system that occurs due to flatness of the grating section.

With this method, the position of the movable body can accurately be controlled within a predetermined plane using the encoder system without being affected by a measurement error of the encoder system that occurs due to the flatness of the grating section, and therefore the object mounted on the movable body can be exposed with high accuracy.

According to a ninth aspect of the present invention, there is provided a fifth exposure method in which an object is exposed with an energy beam, the method including: mounting the object on a movable body that can move in at least first and second directions that are orthogonal within a predetermined plane; and controlling a position of the movable body within the predetermined plane, based on measurement information of an encoder system in which one of a grating section and a head unit is arranged on a surface of the movable body on which the object is mounted and the other of the grating section and the head unit is arranged facing the surface of the movable body and which measures position information of the movable body within the predetermined plane, and based on correction information to compensate a measurement error of the encoder system that occurs due to the grating section and a displacement of the movable body in a different direction from the first and second directions.

With this method, the position of the movable body can accurately be controlled within a predetermined plane using the encoder system without being affected by a measurement error of the encoder system that occurs due to the grating section and a displacement of movable body in a direction different from the first and second directions, and therefore the object mounted on the movable body can be exposed with high accuracy.

According to a tenth aspect of the present invention, there is provided a sixth exposure method in which an object is exposed with an energy beam, the method including:

mounting the object on a movable body that can move in at least first and second directions that are orthogonal within a predetermined plane and also can incline with respect to the predetermined plane; and controlling a position of the movable body within the predetermined plane, based on measurement information of an encoder system in which one of a grating section and a head unit is arranged on a surface of the movable body on which the object is mounted and the other of the grating section and the head unit is arranged facing the surface of the movable body and which measures position information of the movable body within the predetermined plane, and based on correction information to compensate a measurement error of the encoder system that occurs due to the grating section and inclination of the movable body.

With this method, the position of the movable body can accurately be controlled within a predetermined plane using the encoder system without being affected by a measurement error of the encoder system that occurs due to the grating section and the inclination of the movable body, and therefore the object mounted on the movable body can be exposed with high accuracy.

According to an eleventh aspect of the present invention, there is provided a seventh exposure method in which an object is exposed with an energy beam, the method including: mounting the object on a movable body that can move in at least first and second directions that are orthogonal within a predetermined plane; and controlling a position of the movable body within the predetermined plane, based on measurement information of an encoder system in which one of a grating section and a head unit is arranged on a surface of the movable body on which the object is mounted and the other of the grating section and the head unit is arranged facing the surface of the movable body and which measures position information of the movable body within the predetermined plane, and based on correction information to compensate a measurement error of the encoder system that occurs due to the grating section and the head unit.

With this method, the position of the movable body can accurately be controlled within a predetermined plane using the encoder system without being affected by a measurement error of the encoder system that occurs due to the grating section and the head unit, and therefore the object mounted on the movable body can be exposed with high accuracy.

According to a twelfth aspect of the present invention, there is provided an eighth exposure method in which an object is exposed with an energy beam, the method including: mounting the object on a movable body that can move in at least first and second directions that are orthogonal within a predetermined plane; preparing an encoder system in which one of a grating section and a head unit is arranged on a surface of the movable body on which the object is mounted and the other of the grating section and the head unit is arranged facing the surface of the movable body and which measures position information of the movable body within the predetermined plane, and an interferometer system that measures position information of the movable body in at least the first and second directions; and deciding correction information used to compensate a measurement error of the encoder system in the first direction that occurs due to a formation error of the grating section, based on measurement information of the encoder system and the interferometer system obtained by moving the movable body in the first direction and based on information on flatness of the grating section, and controlling a position of the movable body in the first direction based on the measurement information of the encoder system and the correction information.

With this method, the position of the movable body can accurately be controlled within a predetermined plane using the encoder system without being affected by a measurement error of the encoder system that occurs due to a formation error of the grating section, and therefore the object mounted on the movable body can be exposed with high accuracy.

According to a thirteenth aspect of the present invention, there is provided a second device manufacturing method including a lithography process, wherein in the lithography process, a sensitive object is exposed and a pattern is formed on the sensitive object using either one of the second to eighth exposure methods of the present invention.

According to a fourteenth aspect of the present invention, there is provided a first movable body drive system that drives a movable body substantially along a predetermined plane, the system comprising: an encoder that has a head that irradiates a detection light to a scale having a grating whose periodic direction is a predetermined direction within a plane parallel to the predetermined plane and receives a reflected light from the scale, and measures position information of the movable body in the predetermined direction; and a drive unit that drives the movable body in the predetermined direction based on a measurement value of the encoder and information on flatness of the scale.

With this system, the drive unit drives the movable body in a predetermined direction based on the measurement value of the encoder that measures position information of the movable body in the predetermined direction and information on the flatness of the scale to which a detection light from the head of the encoder is irradiated. In this case, the drive unit can drive the movable body in the predetermined direction, based on the measurement value after correction in which a measurements error caused by the flatness of the scale included in the measurement error of encoder has been corrected based on the information on the flatness of the scale. Accordingly, the movable body can be driven in a predetermined direction with high accuracy using the encoder without being affected by the unevenness of the scale.

According to a fifteenth aspect of the present invention, there is provided a second movable body drive system that drives a movable body within a moving plane including first and second axes that are orthogonal to each other, the system comprising: a first interferometer that measures position information of the movable body in a direction parallel to the second axis by irradiating a measurement beam to a reflection surface arranged at the movable body; a second interferometer that measures position information of the movable body in a direction parallel to the first axis by irradiating a measurement beam to a reflection surface arranged at the movable body; a scale that has a grating in a predetermined pitch whose periodic direction is a direction parallel to the first axis, and is placed on the movable body; a head unit that has a plurality of heads placed at a predetermined distance along a direction parallel to the second axis, and constitutes, together with the scale, an encoder that measures position information of the movable body in a direction parallel to the first axis; a decision unit that moves the movable body in a direction parallel to the first axis based on a measurement value of the first interferometer and a measurement value of the second interferometer, and decides correction information of grating pitch of the scale that is sequentially placed facing the head unit according to the movement based on a measurement value of the second interferometer, a measurement value of the encoder and information on flatness of the scale; and a controller that drives the movable body in a direction parallel to the first axis while correcting a measurement value obtained from the head unit based on the correction information of the grating pitch.

With this system, the decision unit moves the movable body in a direction parallel to the first axis, based on the measurement value of the first interferometer that measures position information of the movable body in a direction parallel to the second axis and the measurement value of the second interferometer that measures position information of the movable body in a direction parallel to the first axis. Further, based on the measurement value of the second interferometer, the measurement value of the encoder and information on the flatness of the scale, the decision unit decides correction information of grating pitch whose periodic direction is a direction parallel to the first axis that the scale has, which is sequentially placed facing the head unit according to the movement of the movable body, the head unit constituting, together with the scale placed on the movable body, the encoder that measures position information of the movable body in a direction parallel to the first axis and having a plurality of heads placed at predetermined distance along a direction parallel to the second axis. In this case, the decision unit can correct a measurement error caused by the flatness of the scale included in the measurement value of the encoder based on information on the flatness of the scale, and can decide correction information of grating pitch based on the measurement value of the encoder after the correction and the measurement value of the second interferometer. Then, the controller drives the movable body in a direction parallel to the first axis while correcting the measurement value obtained from the head unit based on the correction information of the grating pitch. Accordingly, the movable body can be driven in a predetermined direction with high accuracy using the encoder without being affected by the unevenness of the scale and the error of grating pitch of the scale.

According to a sixteenth aspect of the present invention, there is provided a pattern formation apparatus, comprising: a movable body on which an object is mounted and which can move within a moving plane, holding the object; and either one of the first and second movable body drive systems of the present invention that drives the movable body for pattern formation on the object.

With this apparatus, by the patterning unit generating a pattern on the object on the movable body that is driven with high accuracy by either one of the first and second movable body drive systems of the present invention, the pattern can be formed on the object with high accuracy.

According to a seventeenth aspect of the present invention, there is provided a first exposure apparatus that forms a pattern on an object by irradiation of an energy beam, the apparatus comprising: a patterning unit that irradiates the energy beam to the object; and either one of the first and second movable body drive systems, wherein driving of the movable body on which the object is mounted by the movable body drive system is performed for relative movement of the energy beam and the object.

With this apparatus, for the relative movement of the energy beam irradiated from the patterning unit to the object and the object, the movable body drive system of the present invention drives the movable body on which the object is mounted with high accuracy. Accordingly, a pattern can be formed on the object with high accuracy by scanning exposure.

According to an eighteenth aspect of the present invention, there is provided a second exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a drive unit that drives the movable body within the predetermined plane based on measurement information of the encoder system and information on flatness of the grating section.

With this apparatus, the movable body can accurately be driven within a predetermined plane using the encoder system without being affected by the flatness of the grating section, and therefore the object mounted on the movable body can be exposed with high accuracy.

According to a nineteenth aspect of the present invention, there is provided a third exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a controller that controls a position of the movable body within the predetermined plane so that a measurement error of the encoder system is compensated, based on measurement information of the encoder system and correction information in accordance with characteristic information of the grating section and the head unit.

With this apparatus, the position of the movable body can accurately be controlled within a predetermined plane using the encoder system without being affected by a measurement error of the encoder system caused by (the characteristics of) the grating section and the head unit, and therefore the object mounted on the movable body can be exposed with high accuracy.

According to a twentieth aspect of the present invention, there is provided a fourth exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a controller that controls a position of the movable body within the predetermined plane, based on correction information to compensate a measurement error of the encoder system that occurs due to flatness of the grating section and based on measurement information of the encoder system.

With this apparatus, the position of the movable body can accurately be controlled within a predetermined plane using the encoder system without being affected by a measurement error of the encoder system that occurs due to the flatness of the grating section, and therefore the object mounted on the movable body can be exposed with high accuracy.

According to a twenty-first aspect of the present invention, there is provided a fifth exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a controller that controls a position of the movable body within the predetermined plane, based on correction information to compensate a measurement error of the encoder system that occurs due to the grating section and a displacement of the movable body in a different direction from the first and second directions and based on measurement information of the encoder system.

With this apparatus, the position of the movable body can accurately be controlled within a predetermined plane using the encoder system without being affected by a measurement error of the encoder system that occurs due to the grating section and a displacement of the movable body in a direction different from the first and second directions, and therefore the object mounted on the movable body can be exposed with high accuracy.

According to a twenty-second aspect of the present invention, there is provided a sixth exposure apparatus that exposes an object with an energy beam, the apparatus comprising: a movable body that can move in at least first and second directions that are orthogonal within a predetermined plane and also can incline with respect to the predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a controller that controls a position of the movable body within the predetermined plane, based on correction information to compensate a measurement error of the encoder system that occurs due to the grating section and inclination of the movable body and based on measurement information of the encoder system.

With this apparatus, the position of the movable body can accurately be controlled within a predetermined plane using the encoder system without being affected by a measurement error of the encoder system that occurs due to the grating section and the inclination of the movable body, and therefore the object mounted on the movable body can be exposed with high accuracy.

According to a twenty-third aspect of the present invention, there is provided a seventh exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane; and a controller that controls a position of the movable body within the predetermined plane, based on correction information to compensate a measurement error of the encoder system that occurs due to the grating section and the head unit and based on measurement information of the encoder system.

With this apparatus, the position of the movable body can accurately be controlled within a predetermined plane using the encoder system without being affected by a measurement error of the encoder system that occurs due to the grating section and the head unit, and therefore the object mounted on the movable body can be exposed with high accuracy.

According to a twenty-fourth aspect of the present invention, there is provided an eighth exposure apparatus that exposes an object with an energy beam, the apparatus comprising: a movable body that can move in at least first and second directions that are orthogonal within a predetermined plane, holding the object; an encoder system in which one of a grating section and a head unit is arranged on a surface of the movable body on which the object is held and the other of the grating section and the head unit is arranged facing the surface of the movable body and which measures position information of the movable body within the predetermined plane;

an interferometer system that measures position information of the movable body in at least the first and second directions; and a controller that decides correction information used to compensate a measurement error of the encoder system in the first direction that occurs due to a formation error of the grating section, based on measurement information of the encoder system and the interferometer system obtained by moving the movable body in the first direction and based on information on the flatness of the grating section, and controls a position of the movable body in the first direction based on the measurement information of the encoder system and the correction information.

With this apparatus, the position of the movable body can accurately be controlled within a predetermined plane using the encoder system without being affected by a measurement error of the encoder system that occurs due to a formation error of the grating section, and therefore the object mounted on the movable body can be exposed with high accuracy.

BRIEF DESCRIPTION OF THE DRAWINGS

In the accompanying drawings.

DESCRIPTION OF THE EMBODIMENTS

First Embodiment

A first embodiment of the present invention will be described below, with reference to FIGS. 1 to 31.

Figure 1:
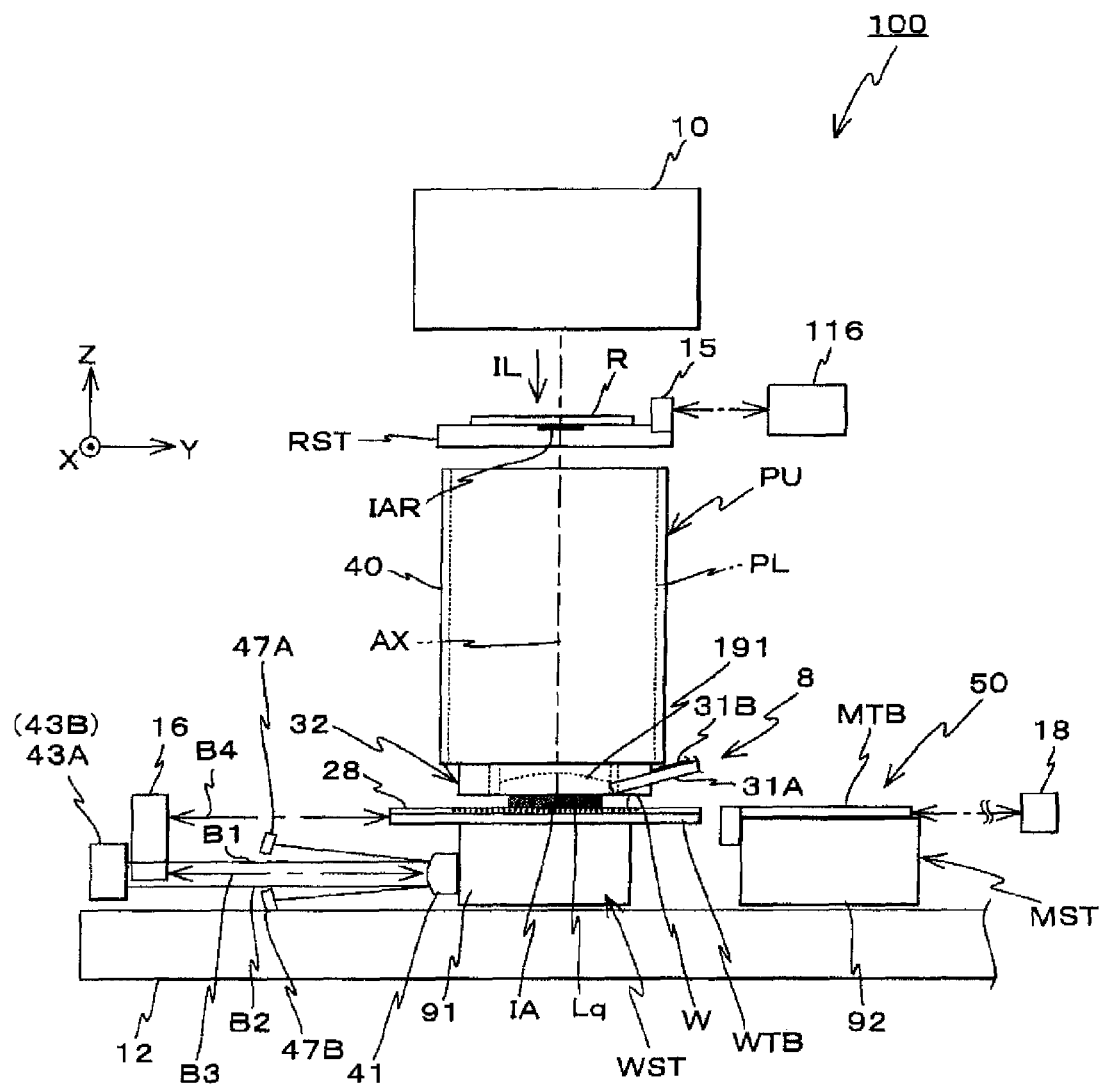
FIG. 1 is a view schematically showing the configuration of an exposure apparatus related to a first embodiment.

FIG. 1 schematically shows the configuration of an exposure apparatus 100 related to the first embodiment. Exposure apparatus 100 is a scanning exposure apparatus by a step-and-scan method, that is, a so-called scanner. As will be described later, in the embodiment, a projection optical system PL is arranged, and the following description will be made assuming that a direction parallel to an optical axis AX of projection optical system PL is a Z-axis direction, a direction in which a reticle and a wafer are relatively scanned within a plane orthogonal to the Z-axis direction is a Y-axis direction and a direction that is orthogonal to a Z-axis and a Y-axis is an X-axis direction, and rotation (tilt) directions around the X-axis, the Y-axis and the Z-axis are θx, θy and θz directions respectively.

Exposure apparatus 100 includes an illumination system 10, a reticle stage RST that holds a reticle R that is illuminated by an illumination light for exposure (hereinafter, referred to as "illumination light" or "exposure light") IL from illumination system 10, a projection unit PU that includes projection optical system PL that projects illumination light IL emitted from reticle R on a wafer W, a stage unit 50 that has a wafer stage WST and a measurement stage MST, their control system, and the like. On wafer stage WST, wafer W is mounted.

Illumination system 10 includes a light source and an illumination optical system that has an illuminance uniformity optical system containing an optical integrator and the like, and a reticle blind and the like (none of which is shown), as is disclosed in, for example, Kokai (Japanese Unexamined Patent Application Publication) No. 2001-313250 (the corresponding U.S. Patent Application Publication No. 2003/0025890) and the like. In illumination system 10, a slit-shaped illumination area IAR that is defined by the reticle blind (masking system) and extends in the X-axis direction on reticle R is illuminated by illumination light (exposure light) IL with substantially uniform illuminance. In this case, as illumination light IL, an ArF excimer laser light (wavelength: 193 nm) is used as an example. Further, as the optical integrator, for example, a fly-eye lens, a rod integrator (internal reflection type integrator), a diffraction optical element or the like can be used.

On reticle stage RST, reticle R having a pattern surface (the lower surface in FIG. 1) on which a circuit pattern and the like are formed is fixed by, for example, vacuum suction. Reticle stage RST is finely drivable within an XY plane and also drivable at designated scanning velocity in a predetermined scanning direction (which is the Y-axis direction being a horizontal direction of the page surface of FIG. 1), by a reticle stage drive system 11 (not shown in FIG. 1, refer to FIG. 6) including, for example, a linear motor or the like.

Position information of reticle stage RST within the moving plane (including rotation information in the θz direction) is constantly detected at a resolution of, for example, around 0.5 to 1 nm with a reticle laser interferometer (hereinafter, referred to as a "reticle interferometer") 116 via a movable mirror 15 (in actual, a Y movable mirror having a reflection surface orthogonal to the Y-axis direction and an X movable mirror having a reflection surface orthogonal to the X-axis direction are arranged). The measurement values of reticle interferometer 116 are sent to a main controller 20 (not shown in FIG. 1, refer to FIG. 6). Main controller 20 controls the position (and the velocity) of reticle stage RST by computing the position of reticle stage RST in the X-axis direction, the Y-axis direction and the θz direction based on the measurement values of reticle interferometer 116, and controlling reticle stage drive system 11 based on the computation results. Incidentally, instead of movable mirror 15, the end surface of reticle stage RST may be polished in order to form a reflection surface (corresponding to the reflection surface of movable mirror 15). Further, reticle interferometer 116 may be capable of also measuring position information of reticle stage RST in at least one of the Z-axis, θx and θy directions.

Projection unit PU is placed below reticle stage RST in FIG. 1. Projection unit PU includes a barrel 40 and projection optical system PL having a plurality of optical elements that are held in a predetermined positional relation within barrel 40. As projection optical system PL, for example, a dioptric system that is composed of a plurality of lenses (lens elements) that are arrayed along an optical axis AX direction parallel to the Z-axis direction is used. Projection optical system PL is, for example, both-side telecentric and has a predetermined projection magnification (such as one-quarter, one-fifth or one-eighth times). Therefore, when illumination area IAR is illuminated by illumination light IL from illumination system 10, illumination light IL having passed through reticle R whose pattern surface is placed substantially coincidentally with a first surface (object surface) of projection optical system PL forms a reduced image of a circuit pattern (a reduced image of part of a circuit pattern) of reticle R within illumination area IAR on an area (exposure area) IA that is conjugate with illumination area IAR on wafer W, which is placed on a second surface (image plane) side of projection optical system PL and whose surface is coated with resist (photosensitive agent), via projection optical system PL (projection unit PU) and liquid Lq (refer to FIG. 1). Then, by synchronous driving reticle stage RST and wafer stage WST, the reticle is moved in the scanning direction (Y-axis direction) relatively to illumination area IAR (illumination light IL) and also wafer W is moved in the scanning direction (Y-axis direction) relatively to the exposure area (illumination light IL), and thus scanning exposure is performed to one shot area (divided area) on wafer W and a pattern of the reticle is transferred to the shot area. That is, in the embodiment, a pattern is generated on wafer W by illumination system 10, the reticle and projection optical system PL, and the pattern is formed on the wafer by exposure of a sensitive layer (resist layer) on wafer W by illumination light IL. Although not shown in the drawing, projection unit PU is mounted on a barrel platform that is supported by three support columns via a vibration isolation mechanism. As is disclosed in, for example, the pamphlet of International Publication No. WO 2006/038952, however, projection unit PU may also be supported in a suspended state with respect to a main frame member (not shown) that is placed above projection unit PU, or a base member on which reticle stage RST is placed.

Figure 3:
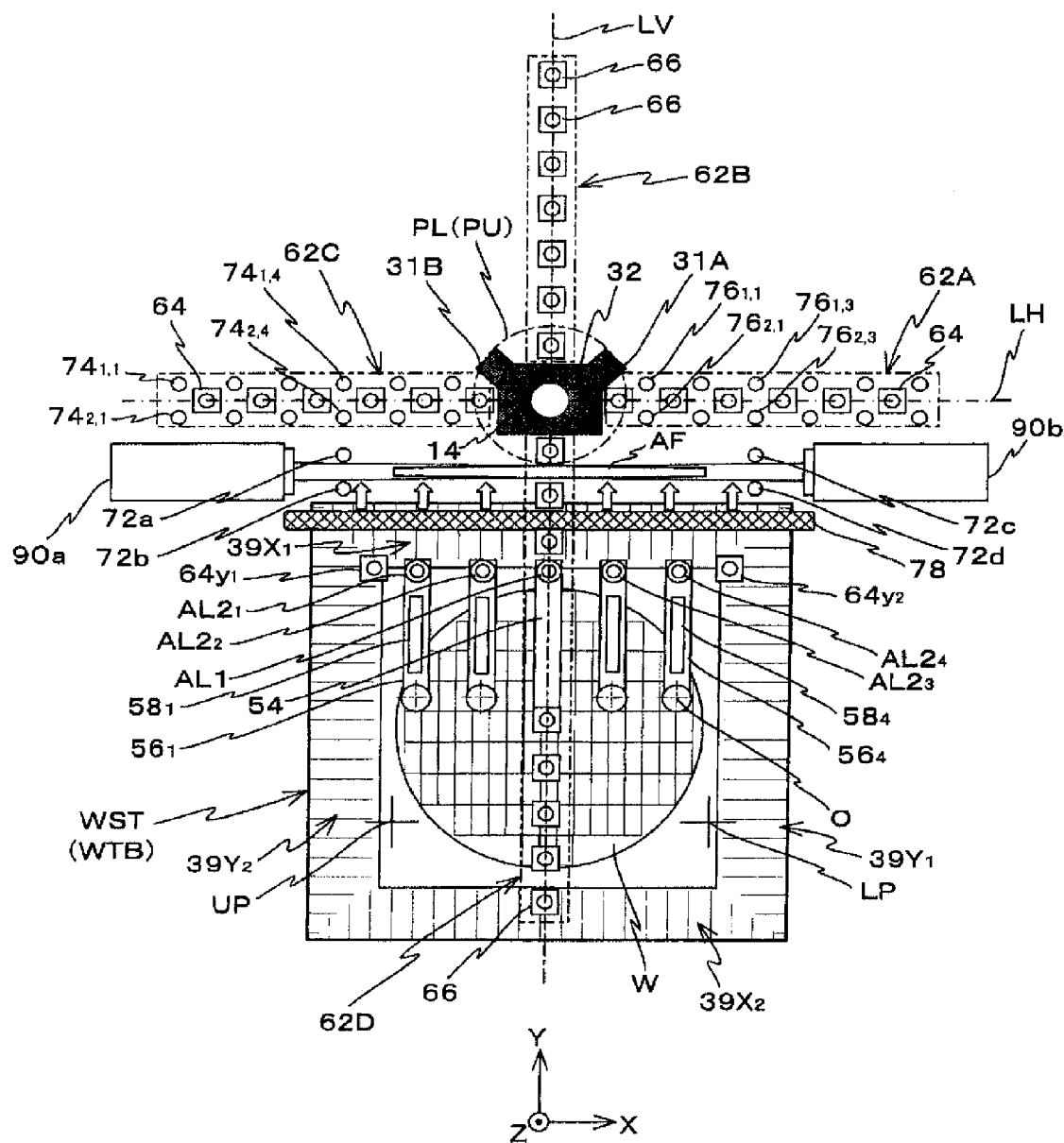
FIG. 3 is a plan view showing the placement of various measurement apparatuses (such as encoders, alignment systems, a multipoint AF system, and Z sensors) that are equipped in the exposure apparatus in FIG. 1.

Further, in exposure apparatus 100 of the embodiment, in order to perform exposure applying the liquid immersion method, a nozzle unit 32 that constitutes part of a local liquid immersion unit 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as is shown in FIG. 1, the lower end surface of nozzle unit 32 is set to be substantially flush with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. As is shown in FIG. 3, liquid supply pipe 31A and liquid recovery pipe 31B are inclined at an angle of 45 degrees with respect to the X-axis direction and the Y-axis direction in a planar view (when viewed from above) and are symmetrically placed with respect to a straight line LV in the Y-axis direction that passes through optical axis AX of projection optical system PL.

Figure 6:
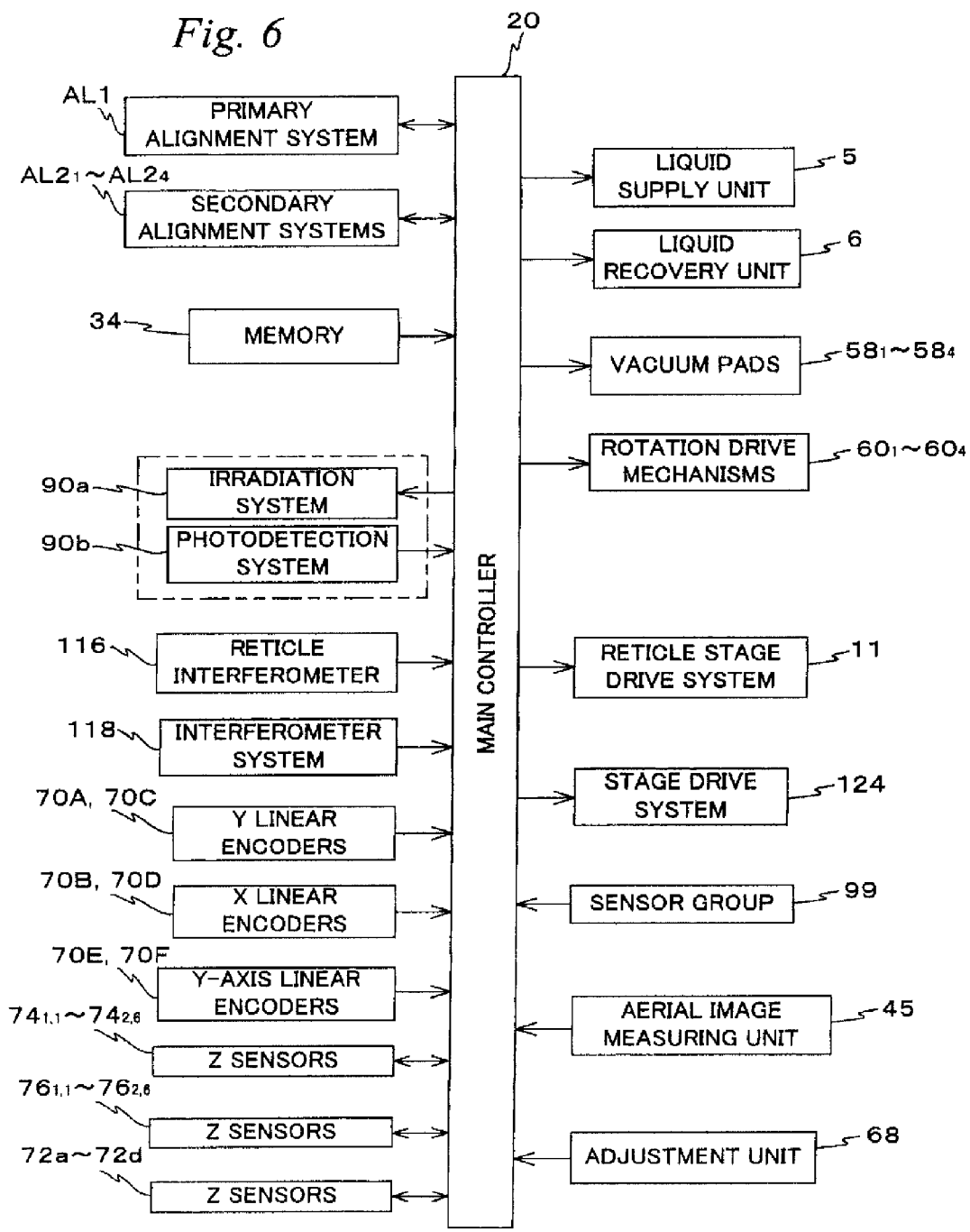
FIG. 6 is a block diagram showing the main configuration of a control system of the exposure apparatus related to the first embodiment.

One end of a supply pipe (not shown) is connected to liquid supply pipe 31A while the other end of the supply pipe is connected to a liquid supply unit 5 (not shown in FIG. 1, refer to FIG. 6), and one end of a recovery pipe (not shown) is connected to liquid recovery pipe 31B while the other end of the recovery pipe is connected to a liquid recovery unit 6 (not shown in FIG. 1, refer to FIG. 6).

Liquid supply unit 5 includes a liquid tank, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the liquid tank to nearly the same temperature as the temperature within the chamber (not shown) where the exposure apparatus is housed. Incidentally, the tank for supplying the liquid, the compression pump, the temperature controller, the valve, and the like do not all have to be equipped in exposure apparatus 100, and at least part of them can also be substituted by the equipment or the like available in the plant where exposure apparatus 100 is installed.

Liquid recovery unit 6 includes a liquid tank, a suction pump, a valve for controlling recovery/stop of the liquid via liquid recovery pipe 31B, and the like. As the valve, a flow rate control valve is preferably used to correspond to the valve of liquid supply unit 5. Incidentally, the tank for recovering the liquid, the suction pump, the valve, and the like do not all have to be equipped in exposure apparatus 100, and at least part of them can also be substituted by the equipment available in the plant where exposure apparatus 100 is installed.

In the embodiment, as the liquid described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, to the optical lenses or the like.

Refractive index n of the water with respect to the ArF excimer laser light is around 1.44. In the water the wavelength of illumination light IL is 193 nm×1/n, shorted to around 134 nm.

Liquid supply unit 5 and liquid recovery unit 6 each have a controller, and the respective controllers are controlled by main controller 20 (refer to FIG. 6). According to instructions from main controller 20, the controller of liquid supply unit 5 opens the valve connected to liquid supply pipe 31A to a predetermined degree to supply water Lq to the space between tip lens 191 and wafer W via liquid supply pipe 31A, the supply flow channel and the supply opening (refer to FIG. 1). Further, when the water is supplied, according to instructions from main controller 20, the controller of liquid recovery unit 6 opens the valve connected to liquid recovery pipe 31B to a predetermined degree to recover water Lq from the space between tip lens 191 and wafer W into liquid recovery unit 6 (the liquid tank) via the recovery opening, the recovery flow channel and liquid recovery pipe 31B. During the supply and recovery operations, main controller 20 gives commands to the controllers of liquid supply unit 5 and liquid recovery unit 6 so that the quantity of water Lq supplied to the space between tip lens 191 and wafer W constantly equals the quantity of water Lq recovered from the space. Accordingly, a constant quantity of water Lq is held in the space between tip lens 191 and wafer W (refer to FIG. 1). In this case, water Lq held in the space between tip lens 191 and wafer W is constantly replaced.

As is obvious from the above description, in the embodiment, local liquid immersion unit 8 is configured including nozzle unit 32, liquid supply unit 5, liquid recovery unit 6, liquid supply pipe 31A and liquid recovery pipe 31B, and the like. Local liquid immersion unit 5 fills the space between tip lens 191 and wafer W with water Lq using nozzle unit 32 and forms a local liquid immersion space (corresponding to a liquid immersion area 14) including an optical path space of illumination light IL. Accordingly, nozzle unit 32 is also called a liquid immersion space forming member, a containment member (or confinement member) or the like. Incidentally, part of local liquid immersion unit 8, for example, at least nozzle unit 32 may also be supported in a suspended state by a main frame (including the barrel platform described above) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, but in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in the similar manner to the above-described manner.

Incidentally, in the above description, one liquid supply pipe (nozzle) and one liquid recovery pipe (nozzle) are to be arranged as an example. However, the present invention is not limited to this, and a configuration having multiple nozzles as disclosed in, for example, the pamphlet of International Publication No. WO 99/49504, may also be employed, in the case such arrangement is possible taking into consideration a relation with adjacent members. Further, a configuration may also be employed in which the lower surface of nozzle unit 32 is placed closer to the image plane of projection optical system PL (i.e. closer to the wafer) than the outgoing surface of tip lens 191, or an optical path on the object plane side of tip lens 191 is also filled with water in addition to an optical path on the image plane side of tip lens 191. The point is that any configuration may be employed as far as the liquid can be supplied at least in the space between an optical member in the lowest end (tip lens) 191 constituting projection optical system PL and wafer W. For example, the liquid immersion mechanism disclosed in the pamphlet of International Publication No. WO 2004/053955, or the liquid immersion mechanism disclosed in the EP Patent Application Publication No. 1 420 298 can also be applied to the exposure apparatus of the embodiment.

Referring back to FIG. 1, stage unit 50 is equipped with wafer stage WST and measurement stage MST that are placed above a base board 12, an interferometer system 118 (refer to FIG. 6) including Y interferometers 16 and 18 and the like that measure position information of stages WST and MST, an encoder system (to be described later) that is used for measuring position information of wafer stage WST on exposure or the like, a stage drive system 124 (refer to FIG. 6) that drives stages WST and MST, and the like.

On the bottom surface of each of wafer stage WST and measurement stage MST, a noncontact bearing (not shown), for example, a vacuum preload type hydrostatic air bearing (hereinafter, referred to as an "air pad") is arranged at a plurality of points. Wafer stage WST and measurement stage MST are supported in a noncontact manner via a clearance of around several μm above base board 12, by static pressure of pressurized air that is blown out from the air pad toward the upper surface of base board 12. Further, stages WST and MST are independently drivable two-dimensionally in the Y-axis direction (a horizontal direction of the page surface of FIG. 1) and the X-axis direction (an orthogonal direction to the page surface of FIG. 1) within a predetermined plane (XY plane), by stage drive system 124.

Figure 2:
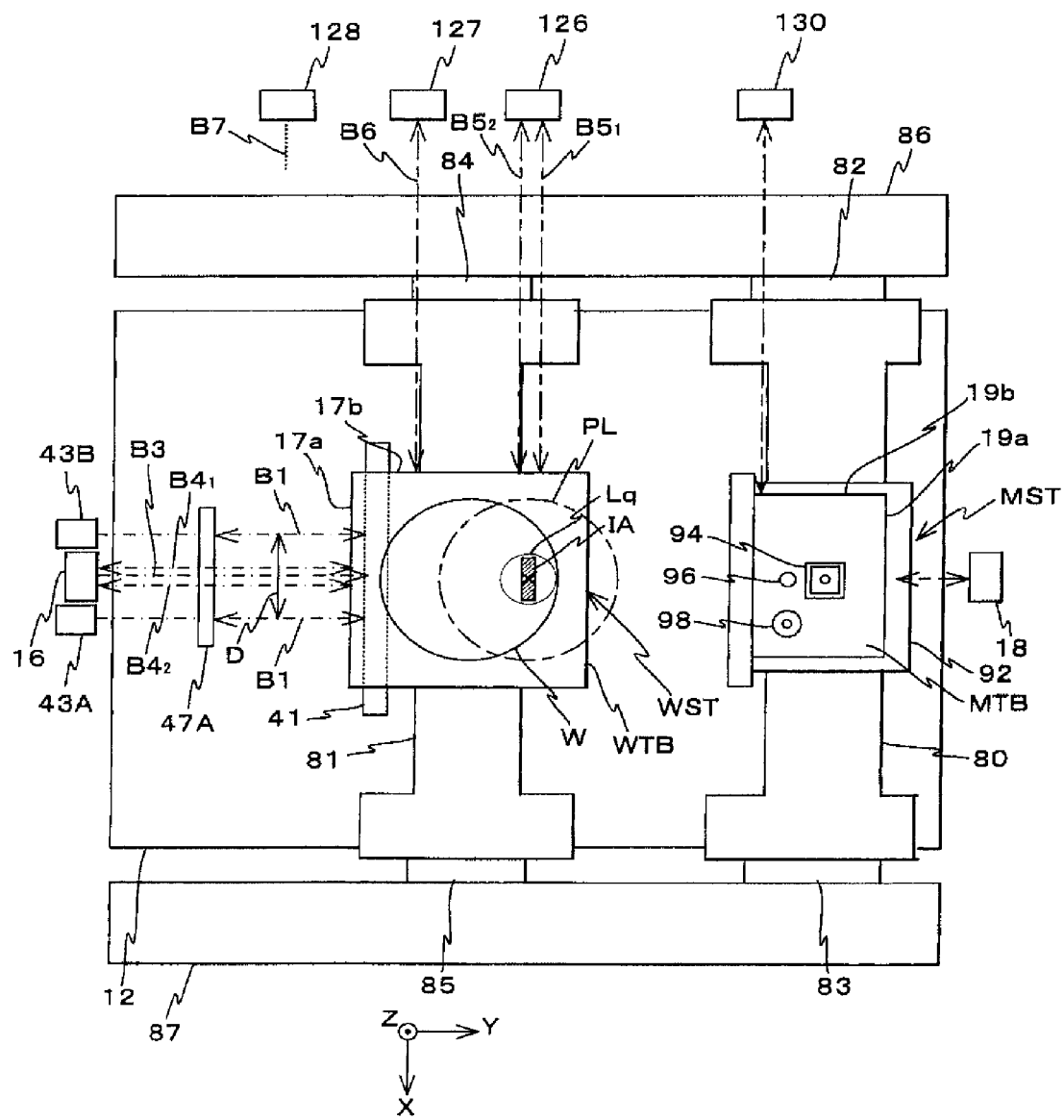
FIG. 2 is a plan view showing a stage unit in FIG. 1.

To be more specific, as is shown in the plan view in FIG. 2, on a floor surface, a pair of Y-axis stators 86 and 87 extending in the Y-axis direction are respectively placed on one side and the other side in the X-axis direction having base board 12 in between. Y-axis stators 86 and 87 are each composed of, for example, a magnetic pole unit that incorporates a permanent magnet group that is made up of plural pairs of a north pole magnet and a south pole magnet that are placed at a predetermined distance and alternately along the Y-axis direction. At Y-axis stators 86 and 87, two Y-axis movers 82 and 84, and two Y-axis movers 83 and 85 are respectively arranged in a noncontact engaged state. In other words, four Y-axis movers 82, 84, 83 and 85 in total are in a sate of being inserted in the inner space of Y-axis stator 86 or 87 whose XZ sectional surface has a U-like shape, and are severally supported in a noncontact manner via a clearance of, for example, around several μm via the air pad (not shown) with respect to corresponding Y-axis stator 86 or 87. Each of Y-axis movers 82, 84, 83 and 85 is composed of, for example, an armature unit that incorporates armature coils placed at a predetermined distance along the Y-axis direction. That is, in the embodiment, Y-axis movers 82 and 84 made up of the armature units and Y-axis stator 86 made up of the magnetic pole unit constitute moving coil type Y-axis linear motors respectively. Similarly, Y-axis movers 83 and 85 and Y-axis stator 87 constitute moving coil type Y-axis linear motors respectively. In the following description, each of the four Y-axis linear motors described above will be referred to as a Y-axis linear motor 82, a Y-axis linear motor 84, a Y-axis linear motor 83 and a Y-axis linear motor 85 as needed, using the same reference codes as their movers 82, 84, 83 and 85.

Movers 82 and 83 of two Y-axis linear motors 82 and 83 out of the four Y-axis linear motors are respectively fixed to one end and the other end in a longitudinal direction of an X-axis stator 80 that extends in the X-axis direction. Further, movers 84 and 85 of the remaining two Y-axis linear motors 84 and 85 are fixed to one end and the other end of an X-axis stator 81 that extends in the X-axis direction. Accordingly, X-axis stators 80 and 81 are driven along the Y-axis by a pair of Y-axis linear motors 82 and 83 and a pair of Y-axis linear motors 84 and 85 respectively.

Each of X-axis stators 80 and 81 is composed of, for example, an armature unit that incorporates armature coils placed at a predetermined distance along the X-axis direction.

One X-axis stator, X-axis stator 81 is arranged in a state of being inserted in an opening (not shown) formed at a stage main section 91 (not shown in FIG. 2, refer to FIG. 1) that constitutes part of wafer stage WST. Inside the opening of stage main section 91, for example, a magnetic pole unit, which has a permanent magnet group that is made up of plural pairs of a north pole magnet and a south pole magnet placed at a predetermined distance and alternately along the X-axis direction, is arranged. This magnetic pole unit and X-axis stator 81 constitute a moving magnet type X-axis linear motor that drives stage main section 91 in the X-axis direction. Similarly, the other X-axis stator, X-axis stator 80 is arranged in a state of being inserted in an opening formed at a stage main section 92 (not shown in FIG. 2, refer to FIG. 1) that constitutes part of measurement stage MST. Inside the opening of stage main section 92, a magnetic pole unit, which is similar to the magnetic pole unit on the wafer stage WST side (stage main section 91 side), is arranged. This magnetic pole unit and X-axis stator 80 constitute a moving magnet type X-axis linear motor that drives measurement stage MST in the X-axis direction.

In the embodiment, each of the linear motors described above that constitute stage drive system 124 is controlled by main controller 20 shown in FIG. 6. Incidentally, each linear motor is not limited to either one of the moving magnet type or the moving coil type, and the types can appropriately be selected as needed.

Incidentally, by making thrust forces severally generated by a pair of Y-axis linear motors 84 and 85 be slightly different, a yawing amount (a rotation amount in the θz direction) of wafer stage WST can be controlled. Further, by making thrust forces severally generated by a pair of Y-axis linear motors 82 and 83 be slightly different, a yawing amount of measurement stage MST can be controlled.

Wafer stage WST includes stage main section 91 described above and a wafer table WTB that is mounted on stage main section 91. Wafer table WTB and stage main section 91 are finely driven in the Z-axis direction, the θx direction and the θy direction via a Z-leveling mechanism (not shown) (e.g. including a voice coil motor or the like) relatively to base board 12 and X-axis stator 81. That is, wafer table WTB can move minutely and can be inclined (tilted) in the Z-axis direction with respect to the XY plane (or the image plane of projection optical system). Incidentally, in FIG. 6, stage drive system 124 is shown including each of the linear motors and the Z-leveling mechanism described above and a drive system of measurement stage MST. Further, wafer table WTB may be configured capable of minutely moving also in at least one of the X-axis, Y-axis and θz directions.

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of a wafer mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glasses or ceramics (such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as is shown in a plan view of wafer table WTB (wafer stage WST) in FIG. 4A, plate 28 has a first liquid repellent area 28a whose outer shape (contour) is rectangular enclosing the circular opening, and a second liquid repellent area 28b that has a rectangular frame (annular) shape placed around first liquid repellent area 28a. On first liquid repellent area 28a, for example, when an exposure operation is performed, at least part of a liquid immersion area 14 protruding from the surface of the wafer is formed, and on second liquid repellent area 28b, scales (grating sections) for an encoder system (to be described later) are formed. Incidentally, at least part of the surface of plate 28 does not have to be flush with the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to first liquid repellent area 28a and second liquid repellent area 28b respectively. In the embodiment, pure water is used as liquid Lq as is described above, and therefore, hereinafter first liquid repellent area 28a and second liquid repellent area 28b are also referred to as first water repellent plate 28a and second water repellent plate 28b.

In this case, exposure light IL is irradiated to first water repellent plate 28a on the inner side, while exposure light IL is hardly irradiated to second water repellent plate 28b on the outer side. Taking this fact into consideration, in the embodiment, a first water repellent area to which water repellent coat having sufficient resistance to exposure light IL (light in a vacuum ultraviolet region, in this case) is applied is formed on the surface of first water repellent plate 28a, and a second water repellent area to which water repellent coat having resistance to exposure light IL inferior to the first water repellent area is applied is formed on the surface of second water repellent plate 28b. In general, since it is difficult to apply water repellent coat having sufficient resistance to exposure light IL (light in a vacuum ultraviolet region, in this case) to a glass plate, it is effective to separate the water repellent plate into two sections in this manner, i.e. first water repellent plate 28a and second water repellent plate 28b around it. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Figure 4A:
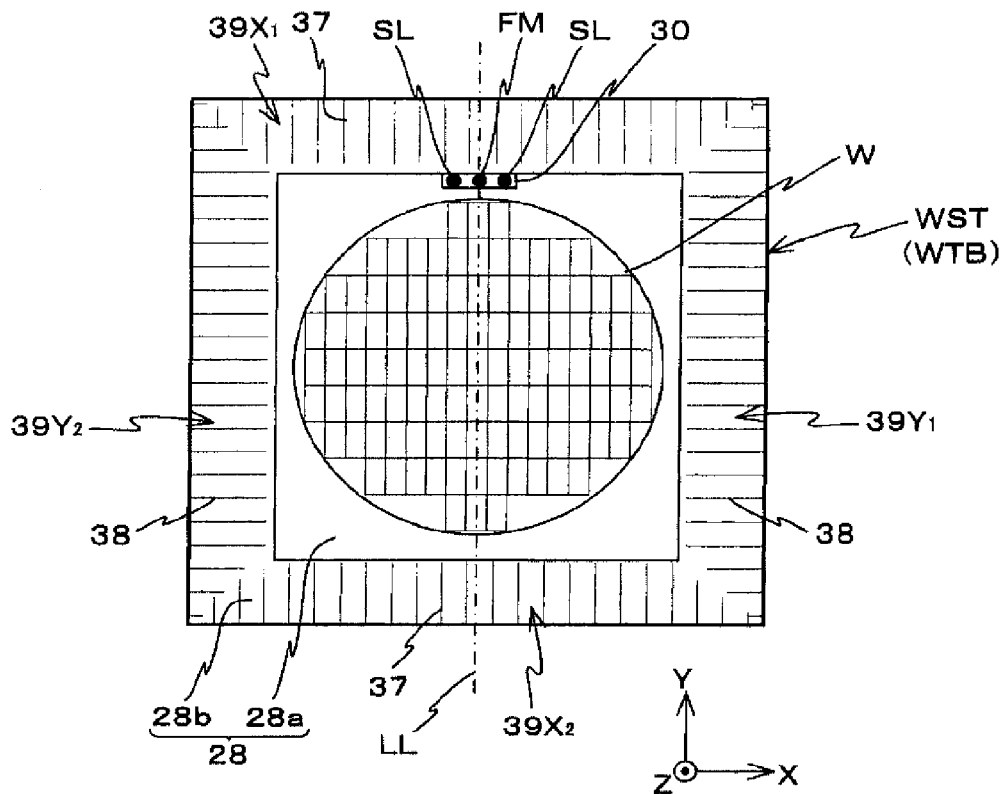
FIG. 4A is a plan view showing a wafer stage.

Further, as is obvious from FIG. 4A, at the end portion on the +Y side of first water repellent plate 28a, a rectangular cutout is formed in the center portion in the X-axis direction, and a measurement plate 30 is embedded inside the rectangular space (inside the cutout) that is enclosed by the cutout and second water repellent plate 28b. A fiducial mark FM is formed in the center in the longitudinal direction of measurement plate 30 (on a centerline LL of wafer table WTB), and a pair of aerial image measurement slit patterns SL are formed in the symmetrical placement with respect to the center of fiducial mark FM on one side and the other side in the X-axis direction of fiducial mark FM. As each of aerial image measurement slit patterns SL, an L-shaped slit pattern having sides along the Y-axis direction and X-axis direction can be used, as an example.

Figure 4B:
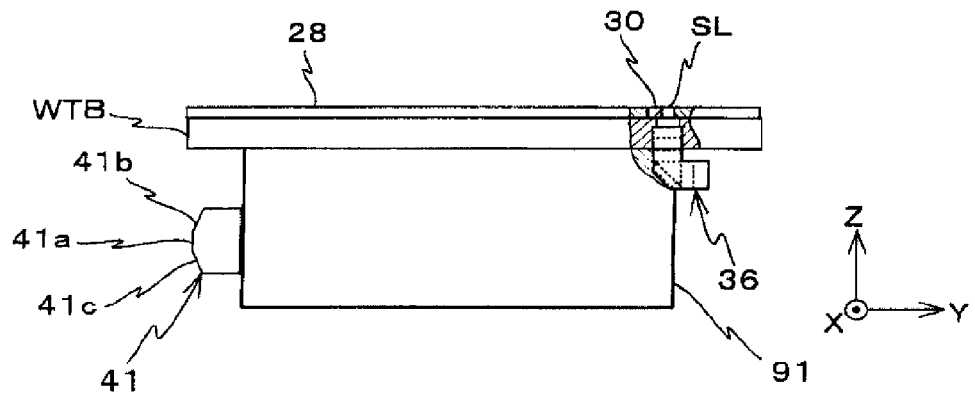
FIG. 4B is a schematic side view showing a partial cross section of wafer stage WST.

Further, as is shown in FIG. 4B, at a portion of wafer stage WST below each of aerial image measurement slit patterns SL, an L-shaped housing 36 inside which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted from above to below through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of second water repellent plate 28b, multiple grating lines are directly formed in a predetermine pitch along each of four sides. More specifically, in areas on one side and the other side in the X-axis direction of second water repellent plate 28b (both sides in the horizontal direction in FIG. 4A), Y scales $39Y_1$ and $39Y_2$ are formed respectively. Y scales $39Y_1$ and $39Y_2$ are each composed of a reflective grating (e.g. diffraction grating) having a periodic direction in the Y-axis direction in which grating lines 38 having the longitudinal direction in the X-axis direction are formed in a predetermined pitch along a direction parallel to the Y-axis (Y-axis direction).

Similarly, in areas on one side and the other side in the Y-axis direction of second water repellent plate 28b (both sides in the vertical direction in FIG. 4A), X scales $39X_1$ and $39X_2$ are formed respectively. X scales $39X_1$ and $39X_2$ are each composed of a reflective grating (e.g. diffraction grating) having a periodic direction in the X-axis direction in which grating lines 37 having the longitudinal direction in the Y-axis direction are formed in a predetermined pitch along a direction parallel to the X-axis (X-axis direction). As each of the scales, the scale made up of a reflective diffraction grating RG (FIG. 8A) that is created by, for example, hologram or the like on the surface of second water repellent plate 28b is used. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since second water repellent plate 28b itself constitutes the scales, a glass plate with a low coefficient of thermal expansion is to be used as second water repellent plate 28b. However, the present invention is not limited to this, and a scale member made up of a glass plate or the like with a low coefficient of thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Mirror finish is severally applied to the −Y end surface and the −X end surface of wafer table WTB, and a reflection surface 17a and a reflection surface 17b shown in FIG. 2 are formed. By severally projecting an interferometer beam (measurement beam) to reflection surface 17a and reflection surface 17b and receiving a reflected light of each beam, Y interferometer 16 and X interferometers 126, 127 and 128 (X interferometers 126 to 128 are not shown in FIG. 1, refer to FIG. 2) that constitute part of interferometer system 118 (refer to FIG. 6) measure a displacement of each reflection surface from a datum position (generally, a fixed mirror is placed on the side surface of projection unit PU, and the surface is used as a datum surface), that is, position information of wafer stage WST within the XY plane, and supply the measured position information to main controller 20. In the embodiment, as each of the interferometers, a multiaxial interferometer having a plurality of measurement axes is used as will be described later, except for some of the interferometers.

Meanwhile, as is shown in FIGS. 1 and 4B, a movable mirror 41 having a longitudinal direction in the X-axis direction is attached to the −Y side surface of stage main section 91 via a kinematic support mechanism (not shown).

A pair of Z interferometers 43A and 43B constituting part of interferometer system 118 (refer to FIG. 6) that irradiate measurement beams to movable mirror 41 are arranged opposing movable mirror 41 (refer to FIGS. 1 and 2). To be more specific, as is obvious when viewing FIGS. 2 and 4B together, movable mirror 41 is designed so that a length in the X-axis direction is longer than reflection surface 17a of wafer table WTB, by at least a distance between Z interferometers 43A and 43B. Further, movable mirror 41 is made up of a member having a hexagon sectional shape, which seems to be formed by uniting a rectangular and an isosceles trapezoid. Mirror finish is applied to the −Y side surface of movable mirror 41, and three reflection surfaces 41b, 41a and 41c are formed.

Reflection surface 41a constitutes an end surface on the −Y side of movable mirror 41 and extends parallel to the XZ plane and in the X-axis direction. Reflection surface 41b constitutes an adjacent surface on the +Z side of reflection surface 41a and extends parallel to a plane that is inclined at an angle of predetermined degrees in a clockwise direction in FIG. 4B with respect to XZ plane and in the X-axis direction. Reflection surface 41c constitutes an adjacent surface on the −Z side of reflection surface 41a and is arranged symmetrically with reflection surface 41b, with reflection surface 41a in between.

As is obvious when viewing FIGS. 1 and 2 together, Z interferometers 43A and 43B are respectively placed on one side and the other side of the X-axis direction of Y interferometer 16 at the substantially same distance from Y interferometer 16, and at positions that are slightly lower than Y interferometer 16.

As is shown in FIG. 1, from each of Z interferometers 43A and 43B, a measurement beam B1 along the Y-axis direction is projected toward reflection surface 41b, and also a measurement beam B2 along the Y-axis direction is projected toward reflection surface 41c (refer to FIG. 4B). In the embodiment, a fixed mirror 47A having a reflection surface orthogonal to measurement beam B1 that is reflected off reflection surface 41b and fixed mirror 47B having a reflection surface orthogonal to measurement beam B2 that is reflected off reflection surface 41c are arranged extending in the X-axis direction respectively, at positions that are spaced a predetermined distance apart from movable mirror 41 in the −Y direction, in a state of not interfering with measurement beams B1 and B2.

Fixed mirrors 47A and 47B are supported, for example, by the same support body (not shown) arranged on a frame (not shown) that supports projection unit PU. Incidentally, fixed mirrors 47A and 47B may also be arranged on the measurement frame described previously. Further, in the embodiment, movable mirror 41 having three reflection surfaces 41b, 41a and 41c, and fixed mirrors 47A and 47B are to be arranged, but the present invention is not limited to this. For example, a configuration may also be employed in which a movable mirror having an inclined surface at an angle of 45 degrees is arranged on the side surface of stage main section 91 and a fixed mirror is placed above wafer stage WST. In this case, the fixed mirror may be arranged on the support body or the measurement frame described above.

As is shown in FIG. 2, Y interferometer 16 projects measurement beams $B4_1$ and $B4_2$ to a reflection surface 17a of wafer table WTB along the measurement axes in the Y-axis direction that are spaced the same distance apart on the −X side and the +X side from a straight line parallel to the Y-axis passing through the projection center of projection optical system PL (optical axis AX, refer to FIG. 1), and receives a reflected light of each measurement beam, thereby detecting the position in the Y-axis direction (Y-position) of wafer table WTB at irradiation points of measurement beams $B4_1$ and $B4_2$. Incidentally, in FIG. 1, measurement beams $B4_1$ and $B4_2$ are representatively shown by a measurement beam B4.

Further, Y interferometer 16 projects measurement beam B3 toward reflection surface 41a along a measurement axis in the Y-axis direction spaced a predetermined distance apart in the Z-axis direction from measurement beams $B4_1$ and $B4_2$ between measurement beams $B4_1$ and $B4_2$, and receives measurement beam B3 reflected off reflection surface 41a, thereby detecting the Y-position of reflection surface 41a of movable mirror 41 (i.e. wafer stage WST).

Main controller 20 computes the Y-position (to be more accurate, a displacement $\Delta Y$ in the Y-axis direction) of reflection surface 17a, that is, of wafer table WTB (wafer stage WST), based on the average value of measurement values of measurement axes corresponding to measurement beams $B4_1$ and $B4_2$ of Y interferometer 16. In addition, main controller 20 computes a displacement (yawing amount) $\Delta \theta z^{(Y)}$ in the rotation direction around the Z-axis (θz direction) of wafer table WTB from the difference between the measurement values of the measurement axes corresponding to measurement beams B4$_1$ and B4$_2$. Further, main controller 20 computes a displacement (pitching amount) Δθx in the θx direction of wafer stage WST based on the Y-position (the displacement ΔY in the Y-axis direction) of reflection surface 17a and reflection surface 41a.

Further, as is shown in FIG. 2, X interferometer 126 projects measurement beams B5$_1$ and B5$_2$ to wafer table WTB along the two measurement axes that are spaced the same distance apart from a straight line LH in the X-axis direction passing through the optical axis of projection optical system PL, and main controller 20 computes the position in the X-axis direction (X-position, to be more accurate, a displacement AX in the X-axis direction) of wafer table WTB, based on the measurement values of the measurement axes corresponding to measurement beams B5$_1$ and B5$_2$. Further, main controller 20 computes a displacement (yawing amount) Δθz$^{(X)}$ in the θz direction of wafer table WTB from the difference between the measurement values of the measurement axes corresponding to measurement beams B5$_1$ and B5$_2$. Incidentally, Δθz$^{(X)}$ obtained from X interferometer 126 and θz$^{(Y)}$ obtained from Y interferometer 16 are equal to each other, and they represent a displacement (yawing) Δθz in the θz direction of wafer table WTB.

Further, as is indicated by a dotted line in FIG. 2, a measurement beam B7 is emitted from X interferometer 128 along the measurement axis parallel to the X-axis. In actual, X interferometer 128 projects measurement beam B7 to reflection surface 17b of wafer table WTB located in the vicinity of an unloading position UP and a loading position LP (to be described later, refer to FIG. 3), along the measurement axis parallel to the X-axis that connects unloading position UP and loading position LP. Further, as is shown in FIG. 2, a measurement beam B6 from X interferometer 127 is projected to reflection surface 17b of wafer table WTB. In actual, measurement beam 36 is projected to reflection surface 17b of wafer table WTB, along the measurement axis parallel to the X-axis passing through the detection center of a primary alignment system AL1.

Figure 18:
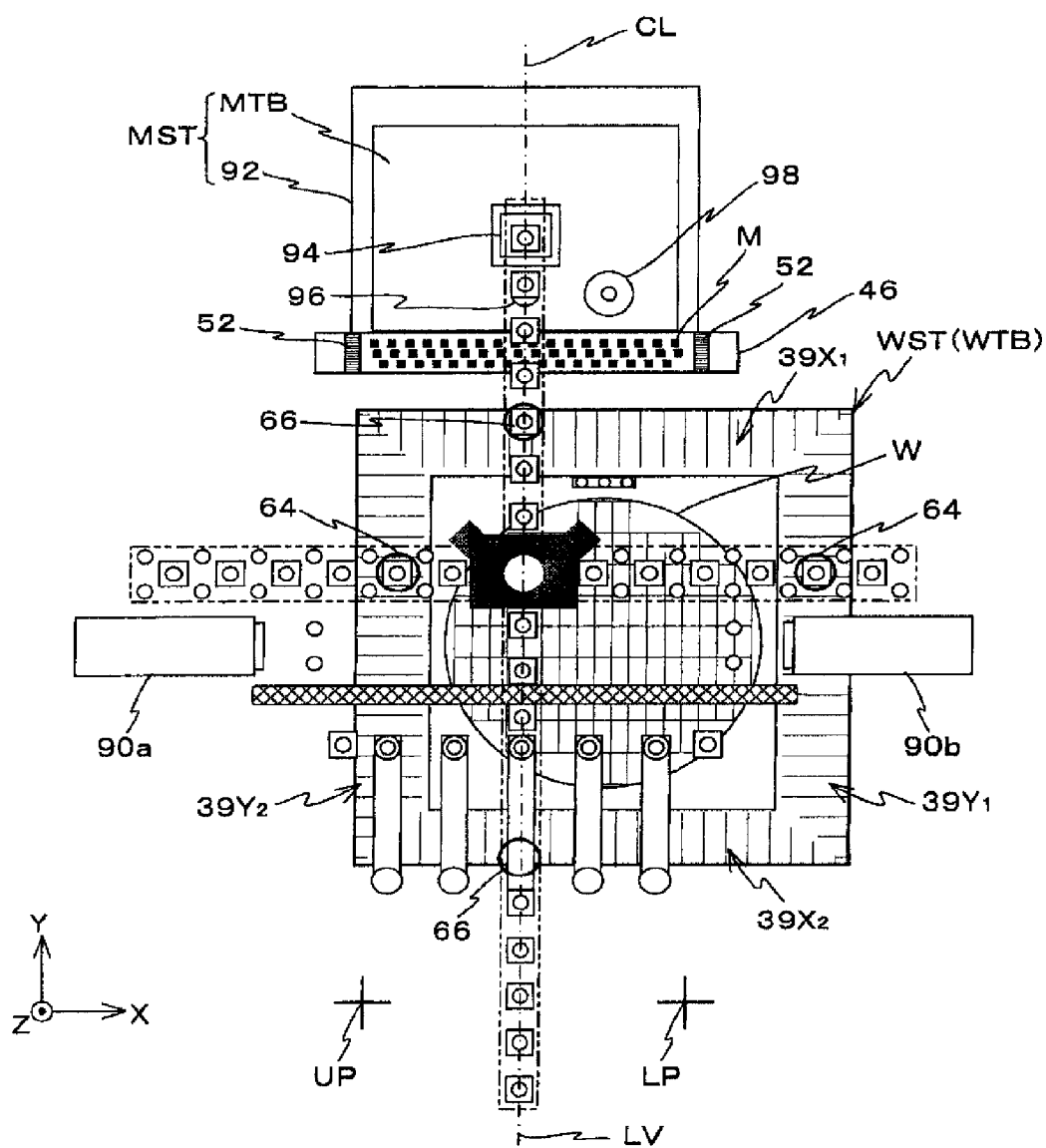
FIG. 18 is a view showing a state of the wafer stage and the measurement stage when exposure by a step-and-scan method is being performed to a wafer on the wafer stage.
Figure 21:
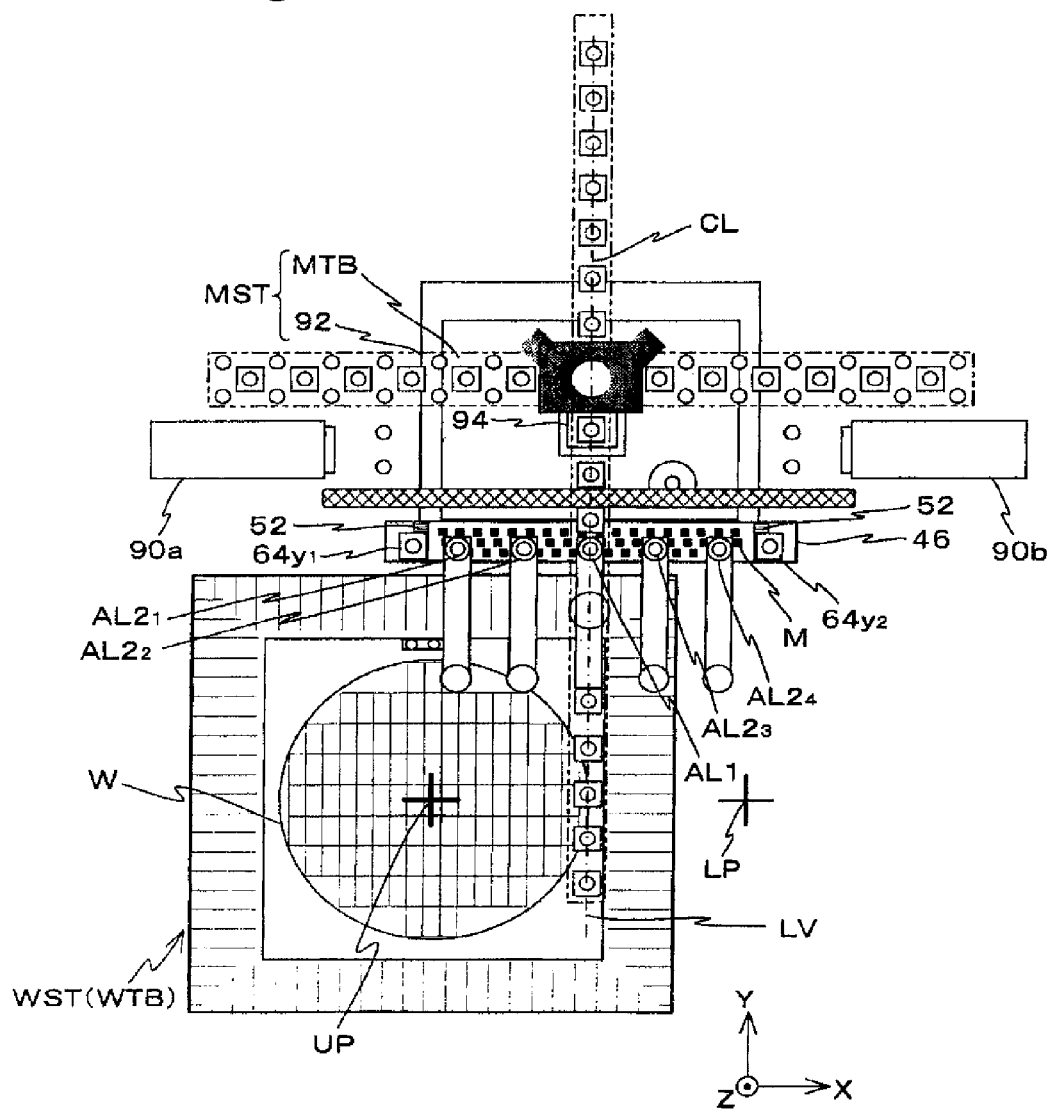
FIG. 21 is a view showing a state of the wafer stage and the measurement stage when the measurement stage has reached a position where a Sec-BCHK (interval) is performed.
Figure 22:
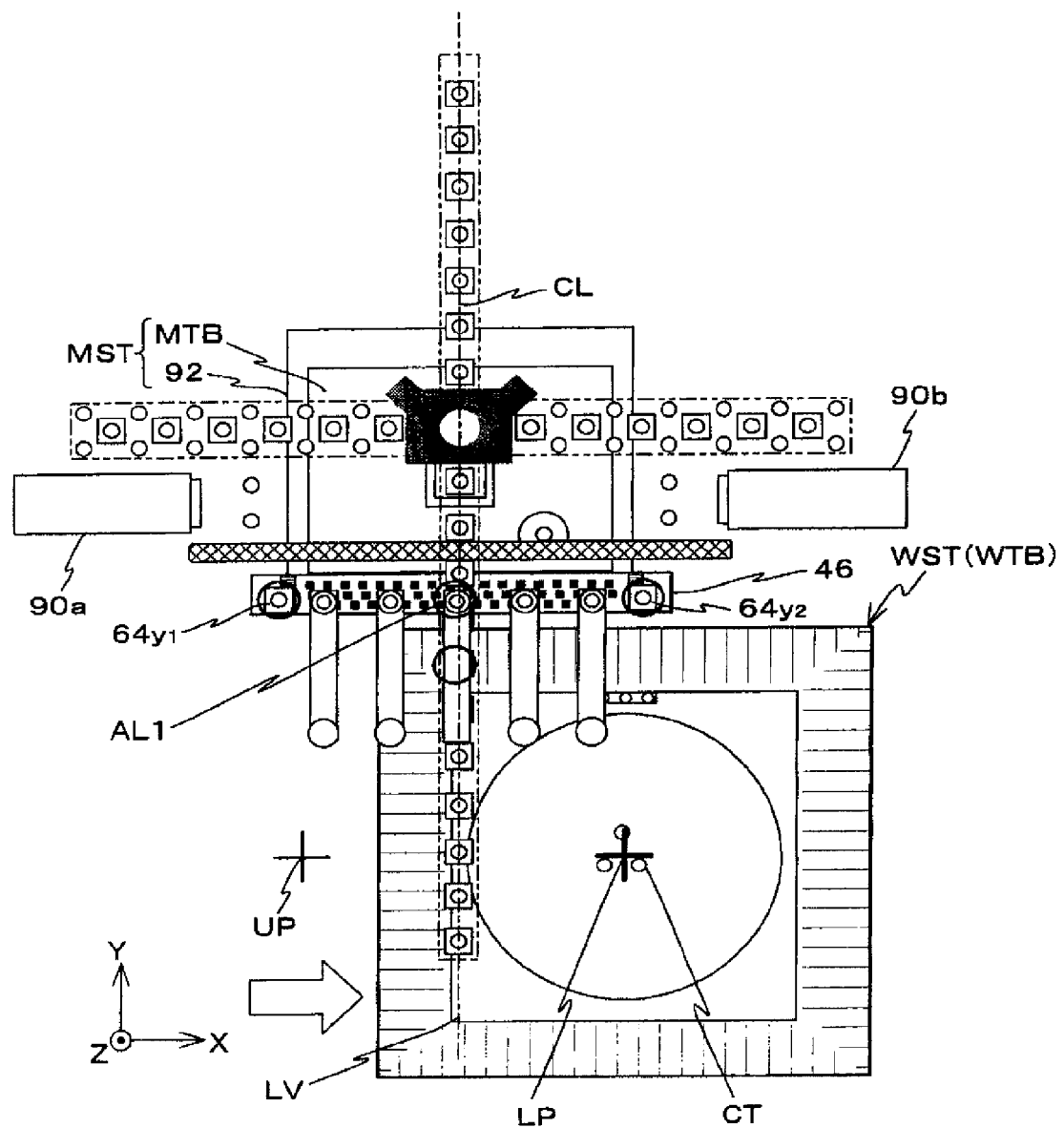
FIG. 22 is a view showing a state of the wafer stage and the measurement stage when the wafer stage has moved from the unloading position to a loading position in parallel with the Sec-BCHK (interval) being performed.
Figure 23:
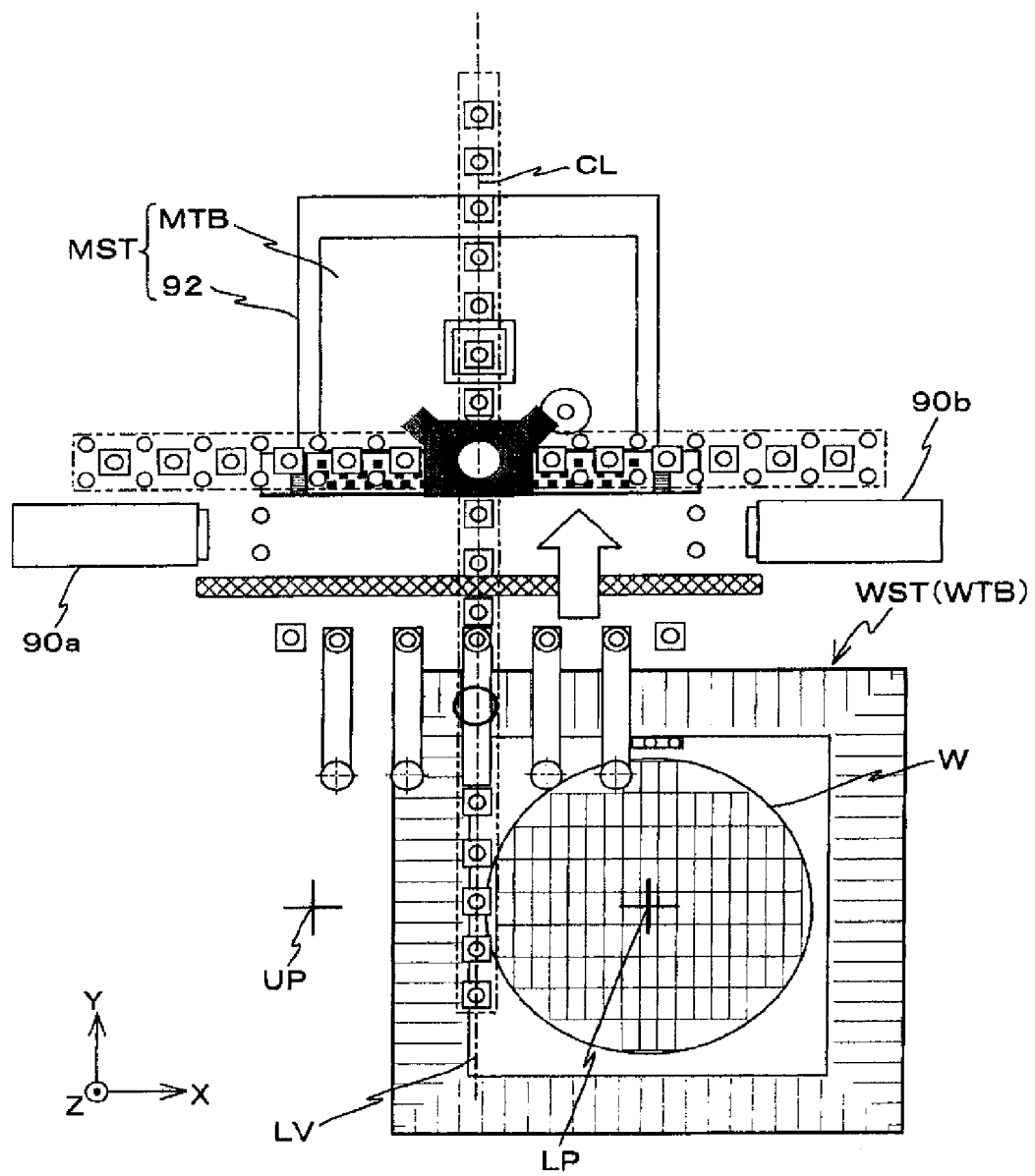
FIG. 23 is a view showing a state of the wafer stage and the measurement stage when the measurement stage has moved to an optimal scrum waiting position and a wafer has been loaded on the wafer table.

Main controller 20 can obtain the displacement ΔX in the X-axis direction of wafer table WTB also from the measurement value of measurement beam B6 of X interferometer 127 and from the measurement value of measurement beam 137 of X interferometer 128. However, the placements of three X interferometers 126, 127 and 128 are different in the Y-axis direction, and therefore, X interferometer 126 is used when exposure is performed as shown in FIG. 18, X interferometer 127 is used when wafer alignment is performed as shown in the drawings such as FIG. 25, and X interferometer 128 is used when a wafer is loaded as shown in FIGS. 22 and 23 and when a wafer is unloaded as shown in FIG. 21.

Measurement beams B1 and B2 along the Y-axis are projected from each of Z interferometers 43A and 43B toward movable mirror 41. Measurement beams B1 and B2 are incident on reflection surfaces 41b and 41c of movable mirror 41 at a predetermined incident angle (to be θ/2), respectively. Then, measurement beams B1 and B2 are reflected off reflection surfaces 41b and 41c respectively, and are vertically incident on the reflection surfaces of fixed mirrors 47A and 47B. Then, measurement beams 31 and B2 reflected off the reflections surfaces of fixed mirrors 47A and 47B are again reflected off reflection surfaces 41b and 41c respectively (i.e. return in the optical paths, through which the incident beams passed through, in the reversed directions), and are received by Z interferometers 43A and 43B.

Herein, when a displacement in the Y-axis direction of wafer stage WST (i.e. movable mirror 41) is assumed to be ΔYo and a displacement in the Z-axis direction is assumed to be ΔZo, an optical path length change ΔL1 of measurement beam B1 and an optical path length change ΔL2 of measurement beam B2 that are received by Z interferometers 43A and 43B are expressed in the following equations (1) and (2), respectively.

$$\Delta L1 = \Delta Yo \times (1 + \cos\theta) - \Delta Zo \times \sin\theta \quad (1)$$

$$\Delta L2 = \Delta Yo \times (1 + \cos\theta) + \Delta Zo \times \sin\theta \quad (2)$$

Accordingly, from the equations (1) and (2), the displacements ΔZo and ΔYo are obtained by the following equations (3) and (4).

$$\Delta Zo = (\Delta L2 - \Delta L1)/2\sin\theta \quad (3)$$

$$\Delta Yo = (\Delta L1 + \Delta L2)/\{2(1+\cos\theta)\} \quad (4)$$

The displacements ΔZo and ΔYo are obtained by each of Z interferometers 43A and 43B. Then, the displacements obtained by Z interferometer 43A are assumed to be ΔZoR and ΔYoR, and the displacements obtained by Z interferometer 43B are assumed to be ΔZoL and ΔYoL. A distance between measurement beams B1 and B2 projected by each of Z interferometers 43A and 43B that are apart from each other in the X-axis direction is assumed to be D (refer to FIG. 2). On such assumption, the displacement (yawing amount) Δθz in the θz direction of movable mirror 41 (i.e. wafer stage WST) and the displacement (rolling amount) Δθy in the θy direction of movable mirror 41 (i.e. wafer stage WST) are obtained by the following equations (5) and (6).

$$\Delta\theta z \approx (\Delta YoR - \Delta YoL)/D \quad (5)$$

$$\Delta\theta y \approx (\Delta ZoL - \Delta ZoR)/D \quad (6)$$

Accordingly, main controller 20 can compute the displacements of four degrees of freedom, i.e. ΔZo, ΔYo, Δθz and Δθy of wafer stage WST based on the measurement results of Z interferometers 43A and 43B, by using the above-described equations (3) to (6).

In this manner, main controller 20 can obtain the displacements of wafer stage WST in directions of six degrees of freedom (Z, X, Y, θz, θx and θy directions) from the measurement results of interferometer system 118. Incidentally, in the embodiment, interferometer system 118 is to be capable of measuring position information of wafer stage WST in the directions of six degrees of freedom. However, the measurement directions are not limited to the directions of six degrees of freedom, but may also be directions of five or less degrees of freedom.

Incidentally, in the embodiment, although the case has been described where wafer stage WST (91, WTB) is a single stage that is movable in directions of six degrees of freedom, the present invention is not limited thereto. Wafer stage WST may also be configured including stage main section 91 that is freely movable within the XY plane, and wafer table WTB that is mounted on stage main section 91 and is finely drivable relatively to stage main section 91 in at least the Z-axis direction, the θx direction and the θy direction. In this case, movable mirror 41 described above is arranged on wafer table WTB. Further, instead of reflection surfaces 17a and 17b, a movable mirror made up of a planar mirror may be arranged at wafer table WTB.

In the embodiment, however, position information of wafer stage WST (wafer table WTB) within the XY plane (position information in directions of three degrees of freedom including rotation information in the θz direction) is mainly measured by an encoder system (to be described later), and the measurement values of interferometers 16, 126, 127 are secondarily used in the cases such as when long-term fluctuation of the measurement values of the encoder system (e.g. due to deformation over time of the scales, or the like) is corrected (calibrated), or when the backup becomes necessary at the time the abnormal output of the encoder system occurs, Incidentally, in the embodiment, out of position information of wafer stage WST in the directions of six degrees of freedom, position information in directions of three degrees of freedom including the X-axis direction, the Y-axis direction and the θz direction is measured by the encoder system (to be described later), and position information in directions of the remaining three degrees of freedom, that is, the Z-axis direction, the θx direction and the Δy direction is measured by a measurement system (to be described later) having a plurality of Z sensors. Herein, the position information in directions of the remaining three degrees of freedom may also be measured by both the measurement system and interferometer system 118. For example, the position information in the Z-axis direction and the θy direction may be measured by the measurement system and the position information in the θx direction may be measured by interferometer system 118.

Incidentally, at least part of interferometer system 118 (such as an optical system) may be arranged at the main frame that holds projection unit PU, or may also be arranged integrally with projection unit PU that is supported in a suspended state as is described above, but, in the embodiment, interferometer system 118 is to be arranged at the measurement frame described above.

Measurement stage MST includes stage main section 92 described above and a measurement table MTB mounted on stage main section 92. Measurement table MTB is mounted on stage main section 92 via a Z-leveling mechanism (not shown). However, the present invention is not limited to this, and, for example, measurement stage MST having a so-called coarse/fine motion structure in which measurement table MTB is configured finely movable with respect to stage main section 92 in the X-axis direction, the Y-axis direction and the θz direction may also be employed, or the configuration may also be employed in which measurement table MTB is fixed on stage main section 92 and the entire measurement stage MST including measurement table MTB and stage main section 92 is drivable in directions of six degrees of freedom.

Figure 5A:
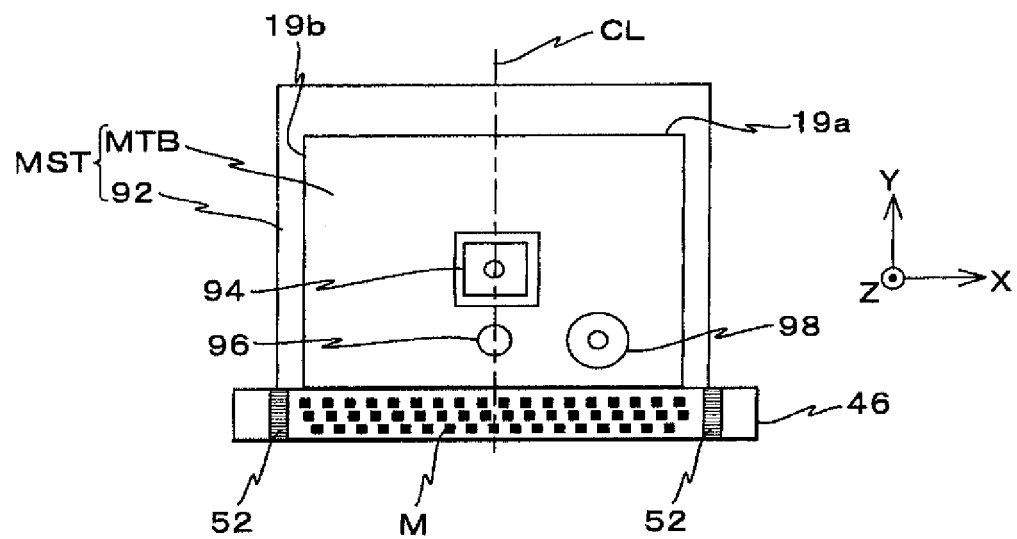
FIG. 5A is a plan view showing a measurement stage.

Various types of measurement members are arranged at measurement table MTB (and stage main section 92). For example, as is shown in FIGS. 2 and 5A, measurement members such as an irregular illuminance sensor 94 that has a pinhole-shaped light-receiving section that receives illumination light IL on an image plane of projection optical system PL, an aerial image measuring instrument 96 that measures an aerial image (projected image) of a pattern that is projected by projection optical system PL, and a wavefront aberration measuring instrument 98 by the Shack-Hartman method that is disclosed in, for example, the pamphlet of International Publication No. WO 03/065428 and the like are employed. As wavefront aberration measuring instrument 98, the one disclosed in, for example, the pamphlet of International Publication No. WO 99/60361 (the corresponding EP Patent Application Publication No. 1 079 223) can also be used.

As irregular illuminance sensor 94, the configuration similar to the one that is disclosed in, for example, Kokai (Japanese Unexamined Patent Application Publication) No. 57-117238 (the corresponding U.S. Pat. No. 4,465,368) and the like can be used. Further, as aerial image measuring instrument 96, the configuration similar to the one that is disclosed in, for example, Kokai (Japanese Unexamined Patent Application Publication) No. 2002-014005 (the corresponding U.S. Patent Application Publication No. 2002/0041377) and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion unit 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as irregular illuminance sensor 94 and aerial image measuring instrument 96 are placed on a centerline CL (Y-axis passing through the center) of measurement stage MST. Therefore, in the embodiment, measurement using theses sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly irregular illuminance sensor 94 (and the illuminance monitor), aerial image measuring instrument 96 and wavefront aberration measuring instrument 98 that are used in measurement using illumination light IL receive illumination light IL via projection optical system PL and water Lq. Further, only part of each sensor such as the optical system may be mounted on measurement table MTB (and stage main section 92), or the entire sensor may be placed on measurement table MTB (and stage main section 92).

Figure 5B:
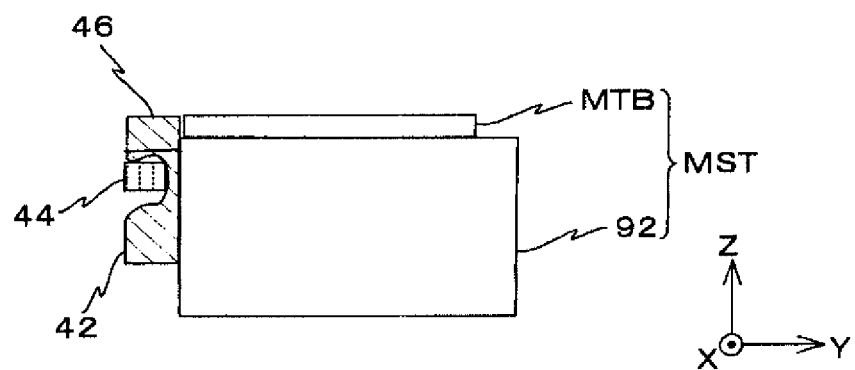
FIG. 5B is a schematic side view showing a partial cross section of the measurement stage.

As is shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light-receiving element such as a photomultiplier tube, and a housing that houses them. As is easily conceivable from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element inside each photodetection system 44. That is, measurement plate 30, light-transmitting systems 36 and photodetection systems 44 constitute an aerial image measuring unit 45 (refer to FIG. 6), which is similar to the one disclosed in Kokai (Japanese Unexamined Patent Application Publication) No. 2002-014005 (the corresponding U.S. Patent Application Publication No. 2002/0041377) referred to previously, and the like.

On attachment member 42, a confidential bar (hereinafter, shortly referred to as a "CD bar") 46 that is made up of a bar-shaped member having a rectangular sectional shape and serves as a reference member is arranged extending in the X-axis direction. CD bar 46 is kinematically supported on measurement stage MST by full-kinematic mount structure.

Since CD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of CD bar 46 is set high to be around the same level as a so-called datum plane plate. Further, as is shown in FIG. 5A, a reference grating (e.g. diffraction grating) 52 whose periodic direction is the Y-axis direction is respectively formed in the vicinity of the end portions on one side and the other side in the longitudinal direction of CD bar 46. The pair of reference gratings 52 are formed apart from each other at a predetermined distance (which is to be "L") in the symmetrical placement with respect to the center in the X-axis direction of CD bar 46, that is, centerline CL described above.

Further, on the upper surface of CD bar 46, a plurality of reference marks M are formed in the placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by the primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark on wafer W. Incidentally, in the embodiment, the surface of CD bar 46 and the surface of measurement table MTB (which may include the measurement members described above) are also covered with a liquid repellent film (water repellent film) severally.

Also on the +Y end surface and the −X end surface of measurement table MTB, reflection surfaces 19a and 19b are formed similar to wafer table WTB as described above (refer to FIGS. 2 and 5A). By projecting an interferometer beam (measurement beam), as is shown in FIG. 2, to reflection surfaces 19a and 19b and receiving a reflected light of each interferometer beam, Y interferometer 18 and an X interferometer 130 (X interferometer 130 is not shown in FIG. 1, refer to FIG. 2) of interferometer system 118 (refer to FIG. 6) measure a displacement of each reflection surface from a datum position, that is, position information of measurement stage MST (e.g. including at least position information in the X-axis and Y-axis directions and rotation information in the $\theta z$ direction), and the measurement values are supplied to main controller 20.

In exposure apparatus 100 of the embodiment, in actual, primary alignment system AL1 is placed on straight line LV passing through the center of projection unit PU (optical axis AX of projection optical system PL, which also coincides with the center of exposure area IA in the embodiment) and being parallel to the Y-axis, and has a detection center at a position that is spaced apart from the optical axis at a predetermined distance on the −Y side as is shown in FIG. 3, although omitted in FIG. 1 from the viewpoint of avoiding intricacy of the drawing. Primary alignment system AL1 is fixed to the lower surface of a main frame (not shown) via a support member 54. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are respectively arranged. That is, five alignment systems AL1 and $AL2_1$ to $AL2_4$ are placed so that their detection centers are placed at different positions in the X-axis direction, that is, placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a partial section of each secondary alignment system $AL2_n$ (e.g. including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems $AL2_1$, $AL2_2$, $AL2_3$ and $AL2_4$ are severally adjusted by turning around rotation center O as the center. In other words, the detection areas (or the detection centers) of secondary alignment systems $AL2_1$, $AL2_2$, $AL2_3$ and $AL2_4$ are independently movable in the X-axis direction. Accordingly, the relative positions of the detection areas of primary alignment system AL1 and secondary alignment systems $AL2_1$, $AL2_2$, $AL2_3$ and $AL2_4$ are adjustable in the X-axis direction. Incidentally, in the embodiment, the X-positions of secondary alignment systems $AL2_1$, $AL2_2$, $AL2_3$ and $AL2_4$ are to be adjusted by the turning of the arms. However, the present invention is not limited to this, and a drive mechanism that drives secondary alignment systems $AL2_1$, $AL2_2$, $AL2_3$ and $AL2_4$ back and forth in the X-axis direction may also be arranged. Further, at least one of secondary alignment systems $AL2_1$, $AL2_2$, $AL2_3$ and $AL2_4$ may be movable not only in the X-axis direction but also in the Y-axis direction. Incidentally, since part of each secondary alignment system $AL2_n$ is moved by arm $56_n$, position information of the part that is fixed to arm $56_n$ is measurable by a sensor (not shown) such as an interferometer, or an encoder. The sensor may only measure position information in the X-axis direction of secondary alignment system $AL2_n$, or may be capable of measuring position information in another direction, for example, the Y-axis direction and/or the rotation direction (including at least one of the $\theta x$ and $\theta y$ directions).

On the upper surface of each arm $56_n$, a vacuum pad $58_n$ (n=1 to 4) that is composed of a differential evacuation type air bearing is arranged. Further, arm $56_n$ can be turned by a rotation drive mechanism $60_n$ (n=1 to 4, not shown in FIG. 3, refer to FIG. 6) that includes, for example, a motor or the like, in response to instructions of main controller 20. Main controller 20 activates each vacuum pad $58_n$ to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems $AL2_1$ to $AL2_4$ is maintained.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems $AL2_1$ to $AL2_4$, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system, not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 6.

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, five alignment systems AL1 and $AL2_1$ to $AL2_4$ are to be arranged in the embodiment. However, the number of alignment systems is not limited to five, but may be the number equal to or more than two and equal to or less than four, or may be the number equal to or more than six, or may be the even number, not the odd number. Moreover, in the embodiment, five alignment systems AL1 and $AL2_1$ to $AL2_4$ are to be fixed to the lower surface of the main frame that holds projection unit PU, via support member 54. However, the present invention is not limited to this, and for example, the five alignment systems may also be arranged on the measurement frame described earlier. Further, alignment systems AL1 and $AL2_1$ to $AL2_4$ are simply called mark detection systems in the embodiment, since alignment systems AL1 and $AL2_1$ to $AL2_4$ detect alignment marks on wafer W and the reference marks on CD bar 46.

In exposure apparatus 100 of the embodiment, as is shown in FIG. 3, four head units 62A to 62D of the encoder system are placed in a state of surrounding nozzle unit 32 on all four sides. In actual, head units 62A to 62D are fixed to the foregoing main frame that holds projection unit PU in a suspended state via a support member, although omitted in FIG. 3 from the viewpoint of avoiding intricacy of the drawing. Incidentally, for example, in the case projection unit PU is supported in a suspended state, head units 62A to 62D may be supported in a suspended state integrally with projection unit PU, or may be arranged at the measurement frame described above.

Head units 62A and 62C are respectively placed on the +X side and −X side of projection unit PU having the longitudinal direction in the X-axis direction, and are also placed apart at the substantially same distance from optical axis AX of projection optical system PL symmetrically with respect to optical axis AX of projection optical system PL. Further, head units 62B and 62D are respectively placed on the +Y side and −Y side of projection unit PU having the longitudinal direction in the Y-axis direction and are also placed apart at the substantially same distance from optical axis AX of projection optical system PL.

As is shown in FIG. 3, head units 62A and 62C are each equipped with a plurality of (six in this case) Y heads 64 that are placed at a predetermined distance on a straight line LH that passes through optical axis AX of projection optical system PL and is parallel to the X-axis, along the X-axis direction. Head unit 62A constitutes a multiple-lens (six-lens, in this case) Y linear encoder (hereinafter, shortly referred to as a "Y encoder" or an "encoder" as needed) 70A (refer to FIG. 6) that measures the position in the Y-axis direction (the Y-position) of wafer stage WST (wafer table WTB) using Y scale $39Y_1$ described above. Similarly, head unit 62C constitutes a multiple-lens (six-lens, in this case) Y linear encoder 70C (refer to FIG. 6) that measures the Y-position of wafer stage WST (wafer table WTB) using Y scale $39Y_2$ described above. In this case, a distance between adjacent Y heads 64 (i.e. measurement beams) equipped in head units 62A and 62C is set shorter than a width in the X-axis direction of Y scales $39Y_1$ and $39Y_2$ (to be more accurate, a length of grating line 38). Further, out of a plurality of Y heads 64 that are equipped in each of head units 62A and 62C, Y head 64 located innermost is fixed to the lower end portion of barrel 40 of projection optical system PL (to be more accurate, to the side of nozzle unit 32 enclosing tip lens 191) so as to be placed as close as possible to the optical axis of projection optical system PL.

As is shown in FIG. 3, head unit 62B is equipped with a plurality of (seven in this case) X heads 66 that are placed on straight line LV at a predetermined distance along the Y-axis direction. Further, head unit 62D is equipped with a plurality of (eleven in this case, out of eleven X heads, however, three X heads that overlap primary alignment system AL1 are not shown in FIG. 3) X heads 66 that are placed on straight line LV at a predetermined distance. Head unit 62B constitutes a multiple-lens (seven-lens, in this case) X linear encoder (hereinafter, shortly referred to as an "X encoder" or an "encoder" as needed) 70B (refer to FIG. 6) that measures the position in the X-axis direction (the X-position) of wafer stage WST (wafer table WTB) using X scale $39X_1$ described above. Further, head unit 62D constitutes a multiple-lens (eleven-lens, in this case) X linear encoder 70D (refer to FIG. 6) that measures the X-position of wafer stage WST (wafer table WTB) using X scale $39X_2$ described above. Further, in the embodiment, for example, when alignment (to be described later) or the like is performed, two X heads 66 out of eleven X heads 66 that are equipped in head unit 62D simultaneously face X scale $39X_1$ and X scale $39X_2$ respectively in some cases. In these cases, X scale $39X_1$ and X head 66 facing X scale $39X_1$ constitute X linear encoder 70B, and X scale $39X_2$ and X head 66 facing X scale $39X_2$ constitute X linear encoder 70D.

Herein, some of eleven X heads 66, in this case, three X heads are attached on the lower surface side of support member 54 of primary alignment system AL1. Further, a distance between adjacent X heads 66 (i.e. measurement beams) that are equipped in each of head units 62B and 62D is set shorter than a width in the Y-axis direction of X scales $39X_1$ and $39X_2$ (to be more accurate, a length of grating line 37). Further, X head 66 located innermost out of a plurality of X heads 66 that are equipped in each of head units 62B and 62D is fixed to the lower end portion of the barrel of projection optical system PL (to be more accurate, to the side of nozzle unit 32 enclosing tip lens 191) so as to be placed as close as possible to the optical axis of projection optical system PL.

Moreover, on the −X side of secondary alignment system $AL2_1$ and on the +X side of secondary alignment system $AL2_4$, Y heads $64y_1$ and $64y_2$ are respectively arranged, whose detection points are placed on a straight line parallel to the X-axis that passes through the detection center of primary alignment system AL1 and are substantially symmetrically placed with respect to the detection center. The distance between Y heads $64y_1$ and $64y_2$ is set substantially equal to distance L described previously. Y heads $64y_1$ and $64y_2$ face Y scales $39Y_2$ and $39Y_1$ respectively in a state shown in FIG. 3 where the center of wafer W on wafer stage WST is on straight line LV. On an alignment operation (to be described later) or the like, Y scales $39Y_2$ and $39Y_1$ are placed facing Y heads $64y_1$ and $64y_2$ respectively, and the Y-position (and the θz rotation) of wafer stage WST is measured by Y heads $64y_1$ and $64y_2$ (i.e. Y encoders 70C and 70A composed of Y heads $64y_1$ and $64y_2$).

Further, in the embodiment, when baseline measurement of the secondary alignment systems (to be described later) or the like is performed, a pair of reference gratings 52 of CD bar 46 face Y heads $64y_1$ and $64y_2$ respectively, and the Y-position of CD bar 46 is measured at the position of each of reference gratings 52 by Y heads $64y_1$ and $64y_2$ and facing reference gratings 52. In the following description, encoders that are composed of Y heads $64y_1$ and $64y_2$ facing reference gratings 52 respectively are referred to as Y-axis linear encoders 70E and 70F (refer to FIG. 6).

Six linear encoders 70A to 70F measure position information of wafer stage WST in the respective measurement directions at a resolution of, for example, around 0.1 nm, and their measurement values (measurement information) are supplied to main controller 20. Main controller 20 controls the position within the XY plane of wafer table WTB based on the measurement values of linear encoders 70A to 70D, and also controls the rotation in the θz direction of CD bar 46 based on the measurement values of linear encoders 70E and 70F. Incidentally, the configuration of the linear encoders and the like will be further described later.

In exposure apparatus 100 of the embodiment, a position measurement unit that measures position information of wafer W in the Z-axis direction is arranged. In the embodiment, as the position measurement unit, as is shown in FIG. 3, a multipoint focal position detection system (hereinafter, shortly referred to as a "multipoint AF system") by an oblique incident method is arranged, which is composed of an irradiation system 90a and a photodetection system 90b, and has the configuration similar to the one disclosed in, for example, Kokai (Japanese Unexamined Patent Application Publication) No. 06-283403 (the corresponding U.S. Pat. No. 5,448, 332) and the like. In the embodiment, as an example, irradiation system 90a is placed on the −Y side of the −X end portion of head unit 62C and photodetection system 90b is placed on the −Y side of the +X end portion of head unit 62A in a state of opposing irradiation system 90a.

A plurality of detection points of the multipoint AF system (90a, 90b) are placed at a predetermined distance along the X-axis direction on the surface to be detected, though omitted in the drawing. In the embodiment, the plurality of detection points are placed, for example, in the matrix arrangement having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90a and photodetection system 90b. Since the length of detection area AF in the X-axis direction is set to around the same as the diameter of wafer W, position information (surface position information) in the Z-axis direction across the entire surface of wafer W can be measured by only scanning wafer W in the Y-axis direction once. Further, since detection area AF is placed between liquid immersion area 14 (exposure area IA) and the detection areas of the alignment systems (AL1, $AL2_1$, $AL2_2$, $AL2_3$ and $AL2_4$) in the Y-axis direction, the detection operations of the multipoint AF system and the alignment systems can be performed in parallel. The multipoint AF system may also be arranged on the main frame that holds projection unit PU or the like, but is to be arranged on the measurement frame described earlier in the embodiment.

Incidentally, the plurality of detection points are to be placed in one row and M columns, or two rows and N columns, but the number(s) of rows and/or columns is/are not limited to these numbers. However, in the case the number of rows is two or more, the positions in the X-axis direction of detection points are preferably made to be different even between the different rows. Moreover, the plurality of detection points are to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the embodiment, in the vicinity of detection points located at both ends out of a plurality of detection points of the multipoint AF system, that is, in the vicinity of both end portions of beam area AF, one each pair of surface position sensors for Z position measurement (hereinafter, shortly referred to as "Z sensors"), that is, a pair of Z sensors 72a and 72b and a pair of Z sensors 72c and 72d are arranged in the symmetrical placement with respect to straight line LV. Z sensors 72a to 72d are fixed to the lower surface of a main frame (not shown). As Z sensors 72a to 72d, a sensor that irradiates a light to wafer table WTB from above, receives the reflected light and measures position information of the wafer table WTB surface in the Z-axis direction orthogonal to the XY plane at an irradiation point of the light, as an example, an optical displacement sensor (sensor by an optical pickup method), which has the configuration like an optical pickup used in a CD drive unit, is used. Incidentally, Z sensors 72a to 72d may also be arranged on the measurement frame described above or the like.

Moreover, head unit 62C is equipped with a plurality of (six each, twelve in total, in this case) Z sensors $74_{ij}$ (i=1, 2, j=1, 2, . . . , 6) that are placed at a predetermined distance so as to correspond to each other, along each of two straight lines that are located on one side and the other side having straight line LH in between in the X-axis direction that connects a plurality of Y heads 64 and are parallel to straight line LH. In this case, Z sensors $74_{1j}$ and $74_{2j}$ making a pair are placed symmetrically with respect to straight line LH. Furthermore, plural pairs (six pairs in this case) of Z sensors $74_{1j}$ and $74_{2j}$ and a plurality of Y heads 64 are placed alternately in the X-axis direction. As each Z sensor $74_1$, for example, a sensor by an optical pickup method similar to Z sensors 72a to 72d is used.

Herein, a distance between Z sensors $74_{1j}$ and $74_{2j}$ in each pair that are located symmetrically with respect to straight line LH is set to be the same distance as a distance between Z sensors 72a and 72b. Further, a pair of Z sensors $74_{1,4}$ and $74_{2,4}$ are located on the same straight line in the Y-axis direction as Z sensors 72a and 72b.

Further, head unit 62A is equipped with a plurality of (twelve in this case) Z sensors $76_{pq}$ (p=1, 2 and q=1, 2, . . . 6) that are placed symmetrically to a plurality of Z sensors $74_{ij}$ with respect to straight line LV. As each Z sensor $76_{pq}$, a sensor by an optical pickup method similar to Z sensors 72a to 72d is used. Further, a pair of Z sensors $76_{1,3}$ and $76_{2,3}$ are located on the same straight line in the Y-axis direction as Z sensors 72c and 72d. Incidentally, Z sensors $74_{ij}$ and $76_{pq}$ are arranged at, for example, the main frame or the measurement frame described above. Further, in the embodiment, the measurement system having Z sensors 72a to 72d, $74_{ij}$ and $76_{pq}$ measures position information in the Z-axis direction of wafer stage WST using one or a plurality of Z sensor (s) that face (s) the scale (s) described above. Therefore, in the exposure operation, Z sensors $74_{ij}$ and $76_{pq}$ to be used for position measurement are switched according to movement of wafer stage WST. Further, in the exposure operation, Y scale $39Y_1$ and at least one Z sensor $76_{pq}$ face each other, and Y scale $39Y_2$ and at least one Z sensor $74_{ij}$ face each other. Accordingly, the measurement system can measure not only position information in the Z-axis direction of wafer stage WST but also position information (rolling) in the θy direction of wafer stage WST. Further, in the embodiment, each Z sensor of the measurement system is to detect a grating surface (a formation surface of diffraction gratings), but each Z sensor may also detect a surface different from the grating surface, for example, a surface of a cover glass that covers the grating surface.

Incidentally, in FIG. 3, measurement stage MST is omitted and a liquid immersion area that is formed by water Lq held in the space between measurement stage MST and tip lens 191 is denoted by a reference code 14. Further, in FIG. 3, a reference code 78 denotes a local air-conditioning system that blows dry air whose temperature is adjusted to a predetermined temperature to the vicinity of a beam path of the multipoint AF system (90a, 90b) by, for example, downflow as is indicated by outline arrows in FIG. 3. Further, a reference code UP denotes an unloading position where a wafer on wafer table WTB is unloaded, and a reference code LP denotes a loading position where a wafer is loaded on wafer table WTB. In the embodiment, unloading position UP and loading position LP are set symmetrically with respect to straight line LV. Incidentally, unloading position UP and loading position LP may be the same position.

FIG. 6 shows the main configuration of the control system of exposure apparatus 100. The control system is mainly configured of main controller 20 composed of a microcomputer (or workstation) that performs overall control of the entire apparatus. Correction information (to be described later) is stored in a memory 34 that is an external storage unit connected to main controller 20. Incidentally, in FIG. 6, various sensors such as irregular illuminance sensor 94, aerial image measuring instrument 96 and wavefront aberration measuring instrument 98 that are arranged at measurement stage MST are collectively shown as a sensor group 99.

Figure 7A:
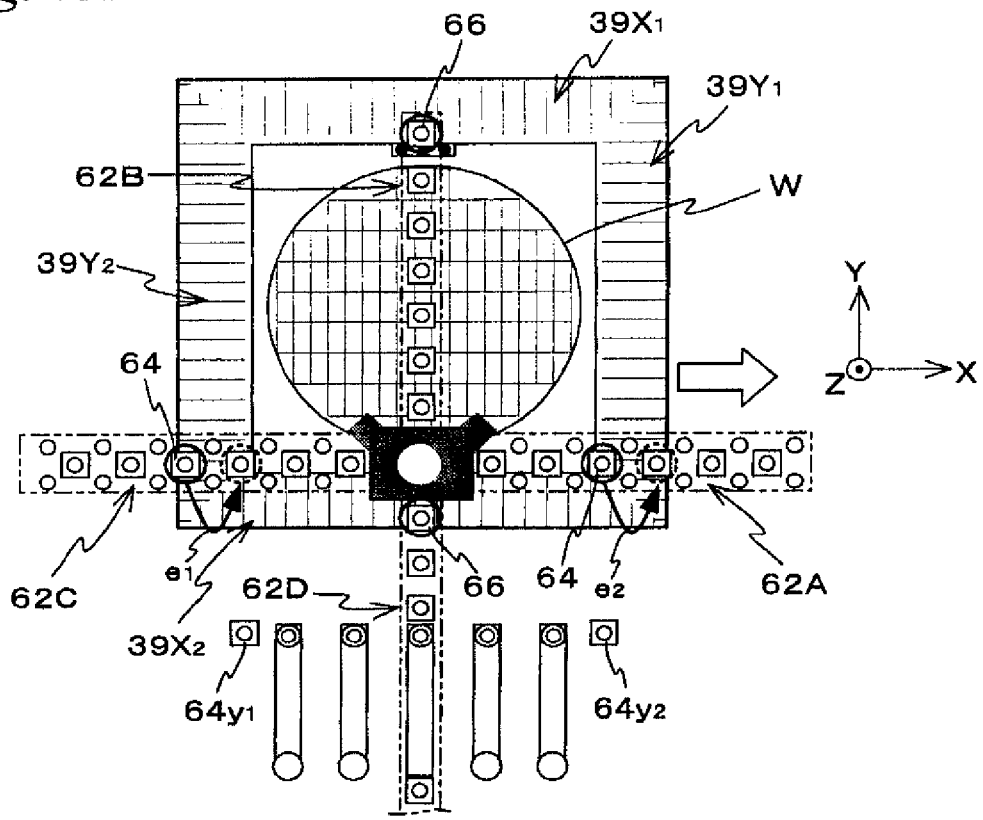
FIGS. 7A and 7B are views used to explain position measurement within an XY plane of a wafer table by a plurality of encoders each including a plurality of heads placed in the array arrangement, and the transfer of measurement values between the heads.
Figure 7B:
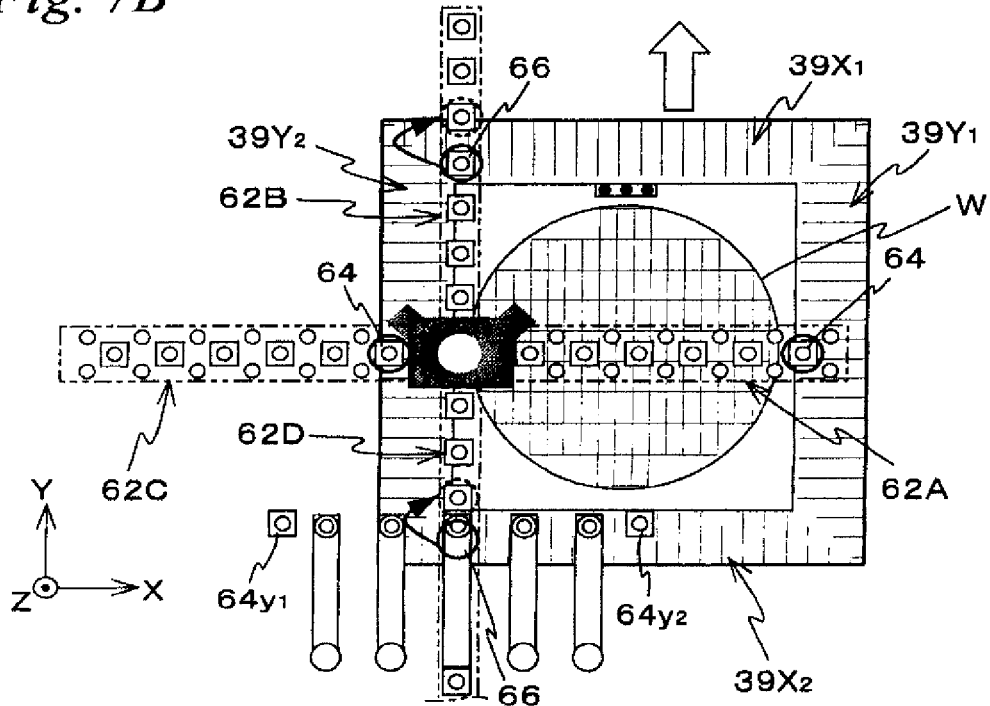

In exposure apparatus 100 of the embodiment having the configuration described above, since the placement of X scales and Y scales on wafer table WTB as described above and the placement of X heads and Y heads as described above are employed, at least one X head 66 out of a total of 18 X heads that belong to head units 62B and 62D faces at least either one of X scale $39X_1$ or $39X_2$, and at least one each of Y head 64 that respectively belongs to head units 62A and 62C or Y heads $64y_1$ and $64y_2$ face Y scales $39Y_1$ and $39Y_2$ respectively without fail in an effective stroke range of wafer stage WST (i.e. a range in which wafer stage WST moves for the alignment and the exposure operation, in the embodiment), as is exemplified in the drawings such as FIGS. 7A and 7B. That is, at least one each of corresponding heads faces at least three of the four scales.

Incidentally, in FIGS. 7A and 7B, the heads that face the corresponding X scales or Y scales are indicated by being circled.

Therefore, in the effective stroke range of wafer stage WST described above, main controller 20 can control position information (including rotation information in the θz direction) of wafer stage WST within the XY plane with high precision by controlling each motor constituting stage drive system 124, based on measurement values of at least three encoders in total, which are encoders 70A and 70C, and at least either one of encoder 70B or 70D. Since the influence of air fluctuations that the measurement values of encoders 70A to 70D receive is small enough to be ignored when comparing with the interferometer, the short-term stability of the measurement values that is affected by air fluctuations is remarkably better than that of the interferometer.

Further, when wafer stage WST is driven in the X-axis direction as indicated by an outline arrow in FIG. 7A, Y head 64 that measures the position in the Y-axis direction of wafer stage WST is sequentially switched to adjacent Y head 64 as indicated by arrows $e_1$ and $e_2$ in the drawing. For example, Y head 64 circled by a solid line is switched to Y head 64 circled by a dotted line. Therefore, a linkage process of the measurement values is performed before and after the switching. In other words, in the embodiment, in order to perform the switching of Y heads 64 and the linkage process of the measurement values smoothly, a distance between adjacent Y heads 64 that are equipped in head units 62A and 62C is set shorter than a width of Y scales $39Y_1$ and $39Y_2$ in the X-axis direction, as is described previously.

Further, in the embodiment, since a distance between adjacent X heads 66 that are equipped in head units 62B and 62D is set shorter than a width of X scales $39X_1$ and $39X_2$ in the Y-axis direction as is described previously, when wafer stage WST is driven in the Y-axis direction as indicated by an outline arrow in FIG. 7B, X head 66 that measures the position in the X-axis direction of wafer stage WST is sequentially switched to adjacent X head 66 (e.g. X head 66 circled by a solid line is switched to X head 66 circled by a dotted line), and the linkage process of the measurement values is performed before and after the switching.

Figure 8A:
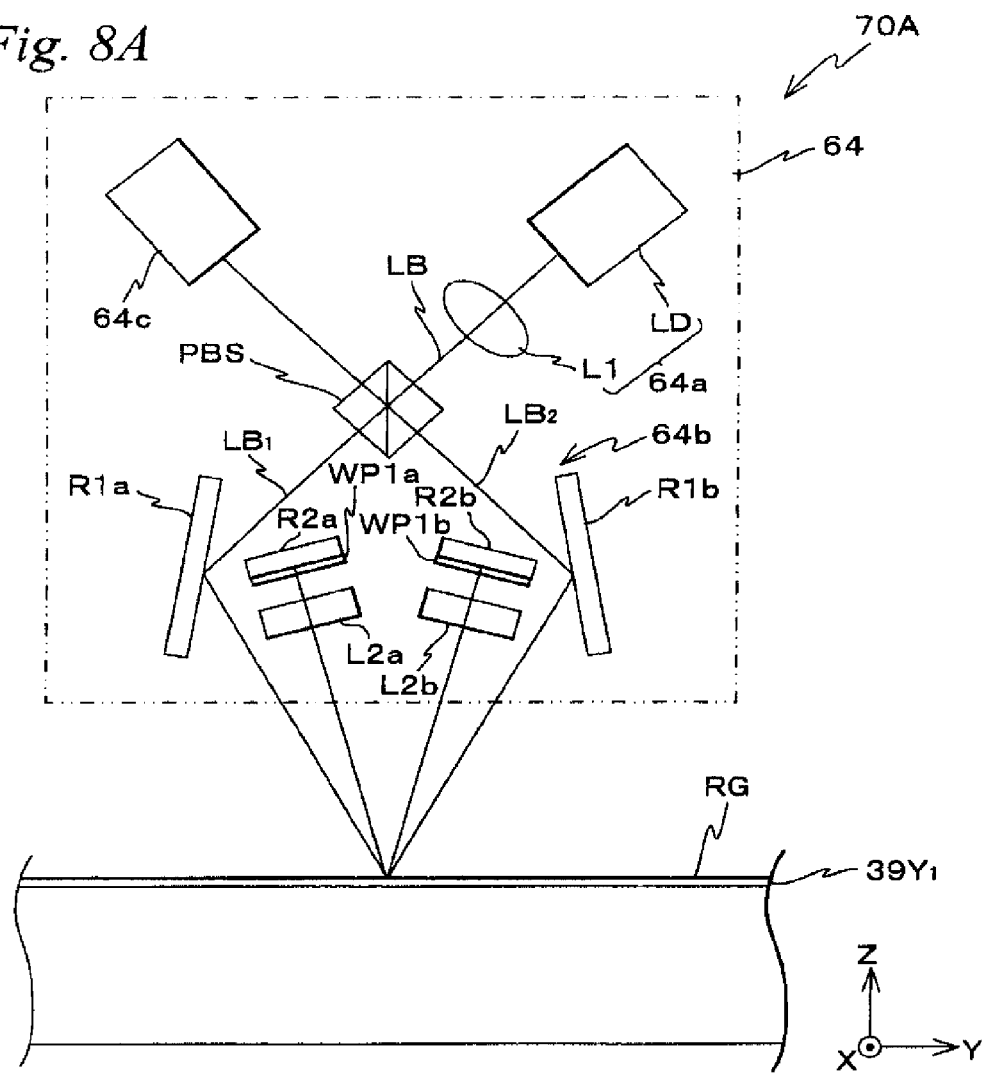
FIG. 8A is a view showing an example of the configuration of the encoder.

Next, the configuration of encoders 70A to 70F, and the like will be described, focusing on Y encoder 70A that is enlargedly shown in FIG. 8A, as a representative. FIG. 8A shows one Y head 64 of head unit 62A that irradiates a detection light (measurement beam) to Y scale $39Y_1$.

Y head 64 is mainly composed of three sections, which are an irradiation system 64a, an optical system 64b and a photodetection system 64c.

Irradiation system 64a includes a light source that emits a laser beam LB in a direction inclined at an angle of 45 degrees with respect to the Y-axis and Z-axis, for example, a semiconductor laser LD, and a converging lens L1 that is placed on the optical path of laser beam LB emitted from semiconductor laser LD.

Optical system 64b is equipped with a polarization beam splitter PBS whose separation plane is parallel to an XZ plane, a pair of reflection mirrors R1a and R1b, lenses L2a and L2b, quarter wavelength plates (hereinafter, referred to as λ/4 plates) WP1a and WP1b, reflection mirrors R2a and R2b, and the like.

Photodetection system 64c includes a polarizer (analyzer), a photodetector, and the like.

In Y encoder 70A, laser beam LB emitted from semiconductor laser LD is incident on polarization beam splitter PBS via lens L1, and is split by polarization into two beams $LB_1$ and $LB_2$. Beam $LB_1$, having been transmitted through polarization beam splitter PBS reaches reflective diffraction grating RG that is formed on Y scale $39Y_1$, via reflection mirror R1a, and beam $LB_2$ reflected off polarization beam splitter PBS reaches reflective diffraction grating RG via reflection mirror R1b. Incidentally, "split by polarization" in this case means the splitting of an incident beam into a P-polarization component and an S-polarization component.

Predetermined-order diffracted beams that are generated from diffraction grating RG due to irradiation of beams $LB_1$ and $LB_2$, for example, the first-order diffracted beams are severally converted into a circular polarized light by λ/4 plates WP1b and WP1a via lenses L2b and L2a, and reflected by reflection mirrors R2b and R2a and then the beams pass through λ/4 plates WP1b and WP1a again and reach polarization beam splitter PBS by tracing the same optical path in the reversed direction.

Each of the polarization directions of the two beams that have reached polarization beam splitter PBS is rotated at an angle of 90 degrees with respect to the original direction. Therefore, the first-order diffracted beam of beam $LB_1$ that was previously transmitted through polarization beam splitter PBS is reflected off polarization beam splitter PBS and is incident on photodetection system 64c, and also the first-order diffracted beam of beam $LB_2$ that was previously reflected off polarization beam splitter PBS is transmitted through polarization beam splitter PBS and is synthesized concentrically with the first-order diffracted beam of beam $LB_1$ and is incident on photodetection system 64c.

Then, the polarization directions of the two first-order diffracted beams described above are uniformly arranged by the analyzer inside photodetection system 64c and the beams interfere with each other to be an interference light, and the interference light is detected by the photodetector and is converted into an electric signal in accordance with the intensity of the interference light.

As is obvious from the above description, in Y encoder 70A, since the optical path lengths of two beams to be interfered are extremely short and also are almost equal to each other, the influence by air fluctuations can mostly be ignored. Then, when Y scale $39Y_1$ (i.e. wafer stage WST) moves in the measurement direction (the Y-axis direction, in this case), the phase of each of the two beams changes and thus the intensity of the interference light changes. This change in the intensity of the interference light is detected by photodetection system 64c, and position information in accordance with the intensity change is output as the measurement value of Y encoder 70A. Other encoders 70B, 70C, 70D and the like are also configured similar to encoder 70A.

Meanwhile, when wafer stage WST moves in a direction different from the Y-axis direction and a relative motion in a direction other than the direction to be measured (relative motion in a non-measurement direction) is generated between head 64 and Y scale $39Y_1$, a measurement error occurs in Y encoder 70A due to the relative motion in most cases. A mechanism of this measurement error occurrence will be described below.

First of all, a relation between the intensity of an interference light that is synthesized from two returning beams $LB_1$ and $LB_2$ and a displacement (a relative displacement with Y head 64) of Y scales $39Y_2$ (reflective diffraction grating RG) is derived.

Figure 8B:
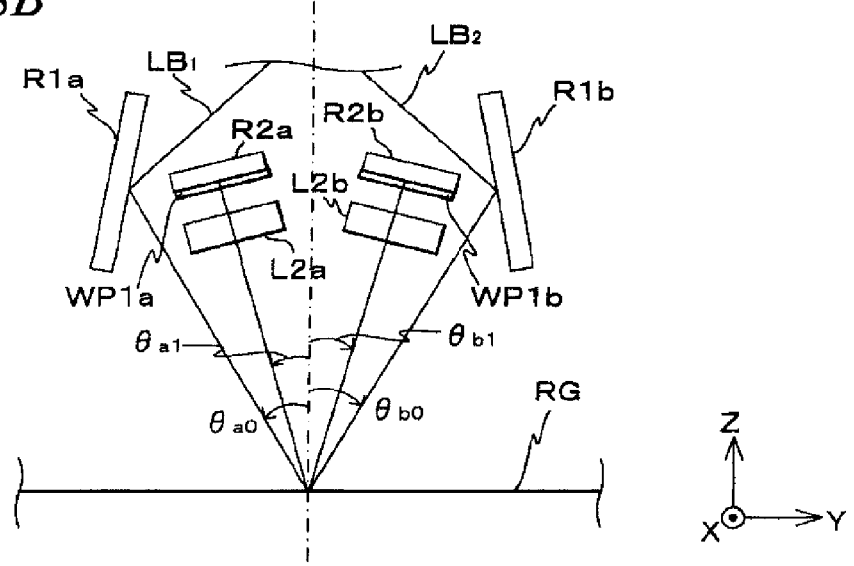
FIG. 8B is a view used to explain the mechanism in which measurement errors occur and to explain a relation between an incident light and a diffracted light of a beam with respect to a reflective diffraction grating within an encoder head.

In FIG. 8B, beam $LB_1$ reflected off reflection mirror R1a is incident on reflective diffraction grating RG at an angle of $\theta_{a0}$, and the $n_a^{th}$-order diffracted light is assumed to be generated at an angle of $\theta_{a1}$. Then, a returning beam that is reflected off reflection mirror R2a and traces the back route is incident on reflective diffraction grating RG at an angle of $\theta_{a1}$. Then, a diffracted light is generated again. Herein, the diffracted light that is generated at an angle of $\theta_{a0}$ and proceeds to reflection mirror R1a by tracing the original optical path is the $n_a^{th}$-order diffracted light that is the same order as the diffracted light generated in the approach route.

On the other hand, beam $LB_2$ reflected off reflection mirror $R1_b$ is incident on reflective diffraction grating RG at an angle of $\theta_{b0}$, and the $n_b^{th}$-order diffracted light is generated at an angle of $\theta_{b1}$. This diffracted light is assumed to be reflected off reflection mirror R2b and trace the same optical path to return to reflection mirror R1b.

In this case, the intensity "I" of an interference light that is synthesized from two returning beams $LB_1$ and $LB_2$ depends on a difference in phase (phase difference) φ between two returning beams $LB_1$ and $LB_2$ at a photodetection position of the photodetector, that is, $I \propto 1+\cos\phi$. In this case, the intensities of two returning beams $LB_1$ and $LB_2$ are assume to be equal to each other.

Phase difference φ can theoretically be calculated in the following equation (7), though the way to derive phase difference φ in detail is omitted herein.

$$\phi = K\Delta L + 4\pi(n_b - n_a)\Delta Y/p + 2K\Delta Z(\cos\theta_{b1} + \cos\theta_{b0} - \cos\theta_{a1} - \cos\theta_{a0}) \quad (7)$$

In this case, KΔL denotes a phase difference caused by an optical path difference ΔL between two returning beams $LB_1$ and $LB_2$, ΔY denotes a displacement of reflective diffraction grating RG in the +Y direction, ΔZ denotes a displacement of reflective diffraction grating RG in the +Z direction, p denotes a pitch of a diffraction grating, and $n_b$ or $n_a$ denotes the diffraction order of each diffracted light described above.

Herein, the encoder is assumed to be configured so as to satisfy the optical path difference ΔL=0 and the symmetric property shown by the following equation (8).

$$\theta_{a0} = \theta_{b0}, \theta_{a1} = \theta_{b1} \quad (8)$$

In such a case, a result in the parenthesis in the third term on the right-hand side of the equation (7) becomes zero, and at the same time $N_b = -n_a(=n)$ is satisfied, and accordingly, the following equation (9) can be obtained.

$$\phi_{sym}(\Delta Y) = 2\pi\Delta Y/(p/4n) \quad (9)$$

From the above equation (9), phase difference $\phi_{sym}$ does not depend on the wavelength of light.

Figure 9A:
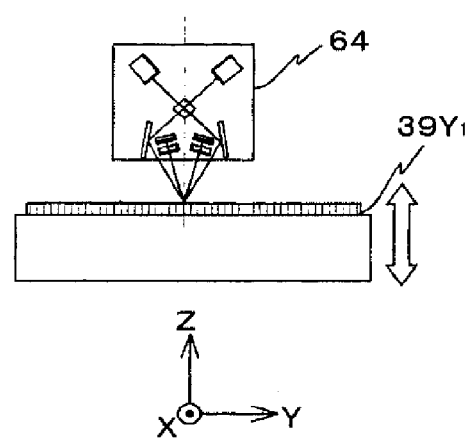
FIG. 9A is a view showing the case where a count value does not change even when the relative motion in a non-measurement direction occurs between the head and the scale of the encoder.
Figure 9B:
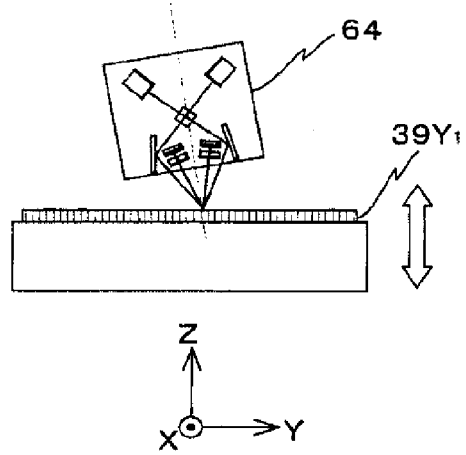
FIG. 9B is a view showing an example of the case where a count value changes when the relative motion in a non-measurement direction occurs between the head and the scale of the encoder.

Herein, two cases shown in FIGS. 9A and 9B will be considered, as simple examples. First, in the case of FIG. 9A, an optical path of head 64 coincides with the Z-axis direction (head 64 does not incline). Herein, wafer stage WST is assumed to be displaced in the Z-axis direction (ΔZ≠0, ΔY=0). In this case, since optical path difference ΔL does not change, the first term on the right-hand side of the equation (7) does not change. The second term becomes zero because of the assumption: ΔY=0. Then, the third term becomes zero, because the symmetric property in the equation (8) is satisfied. Accordingly, phase difference φ does not change, and also the intensity of the interference light does not change. As a consequence, the measurement value (count value) of the encoder does not change.

On the other hand, in the case of FIG. 9B, the optical path of head 64 inclines with respect to the Z-axis (head 64 inclines). Wafer stage WST is assumed to be displaced in the Z-axis direction from this state (ΔZ≠0, ΔY=0). Also in this case, since optical path difference ΔL does not change, the first term on the right-hand side of the equation (7) does not change. The second term becomes zero because of the assumption: ΔY=0. However, the third term does not become zero, because the symmetric property in the equation (8) is not kept due to the gradient of the head, and the third term changes in proportion to a Z displacement ΔZ. Accordingly, phase difference φ changes, and as a consequence, the measurement value changes. Incidentally, even when head 64 does not incline, the symmetric property in the equation (8) is not kept due to, for example, the optical characteristics of the head (such as telecentricity), and the measurement value changes similarly. That is, characteristic information of the head units that is a factor causing measurement errors of the encoder system includes not only the gradient of the heads but also the optical characteristics of the heads and the like.

Further, although omitted in the drawing, in the case wafer stage WST is displaced in a direction perpendicular to the measurement direction (Y-axis direction) and to the optical axis direction (Z-axis direction) (ΔX=0, ΔY=0, ΔZ=0), the measurement value does not change as far as a direction in which grating lines of diffraction grating RG face (a longitudinal direction) is orthogonal to the measurement direction. In the case the longitudinal direction is not orthogonal to the measurement direction, however, the sensitivity is generated at the gain that is proportionate to the angle.

Next, for example, the four cases shown in FIGS. 10A to 10D will be considered. First, in the case of FIG. 10A, the optical path of head 64 coincides with the Z-axis direction (head 64 does not incline). Even when wafer stage WST moves in the +Z direction from this state to go into a state in FIG. 10B, the measurement value of the encoder does not change because this is the same as the case of FIG. 9A described above.

Figure 10A:
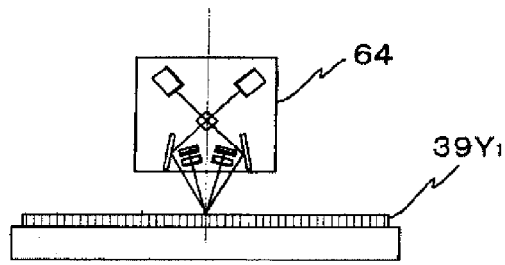
FIGS. 10A to 10D are views used to explain the case where a count value of the encoder changes and the case where the count value does not change, when the relative motion in a non-measurement direction occurs between the head and the scale.
Figure 10B:
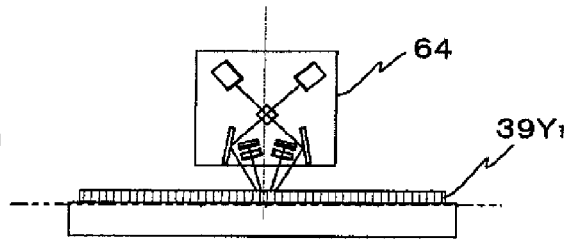
Figure 10C:
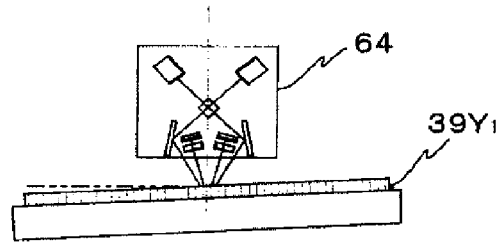

Next, wafer stage WST is assumed to rotate around the X-axis from the state in FIG. 10B to go into a state shown in FIG. 10C. In this case, although the relative motion between the head and the scale does not occur, that is, regardless of ΔY=ΔZ=0, the measurement value of the encoder changes, since optical path difference ΔL changes due to the rotation of wafer stage WST. That is, the measurement error occurs in the encoder system due to the inclination (tilt) of wafer stage WST.

Figure 10D:
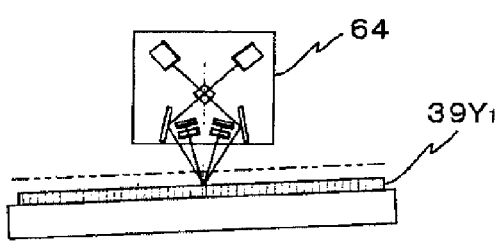

Next, wafer stage WST is assumed to move downward from the state in FIG. 10C to go into a state as shown in FIG. 10D. In this case, optical path difference ΔL does not change since wafer stage WST does not rotate. However, because the symmetric property in the equation (8) is not kept, phase difference φ changes due to the Z displacement ΔZ by the third term on the right-hand side of the equation (7). Accordingly, the measurement value of the encoder changes. Incidentally, the measurement value of the encoder in the case of FIG. 10D becomes the same value in the case of FIG. 10A.

As a result of the simulation implemented by the inventor and the like, it was found that the measurement values of the encoder have the sensitivity with respect to not only the positional change of the scale in the Y-axis direction, which is the measurement direction, but also the attitude change in the θx direction (pitching direction) and the θz direction (yawing direction), and besides, in the cases such as when the symmetric property described above is broken, the measurement values depend also on the positional change in the Z-axis direction. That is, the theoretical explanation described above and the result of the simulation agree.

Figure 11A:
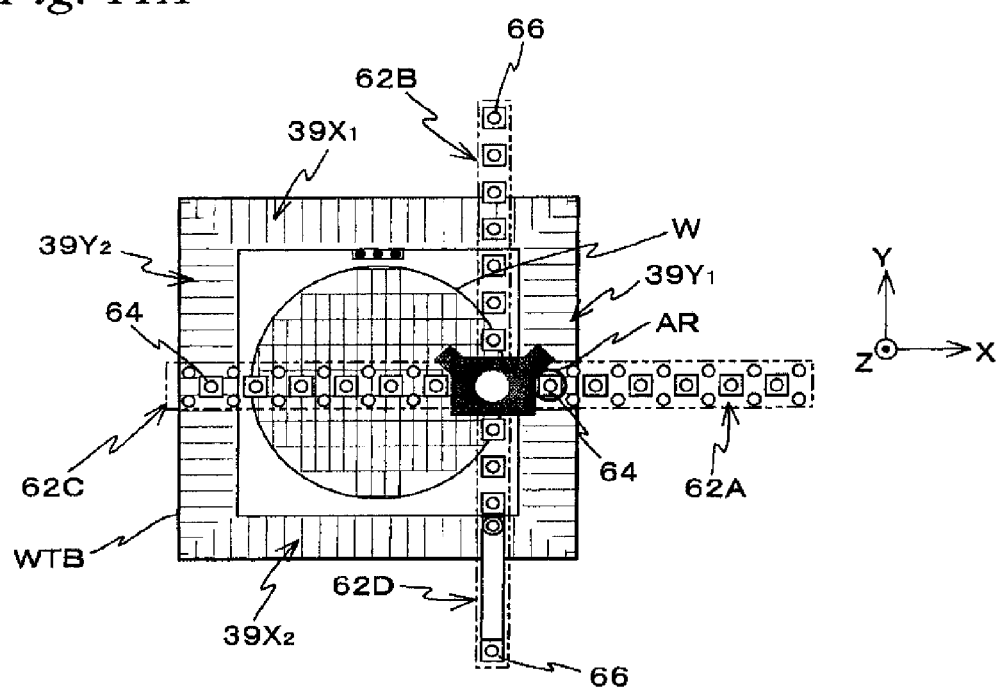
FIGS. 11A and 11B are views used to explain an operation for acquiring correction information used to correct a measurement error of an encoder (a first encoder) caused by the relative motion of the head and the scale in a non-measurement direction.
Figure 11B:
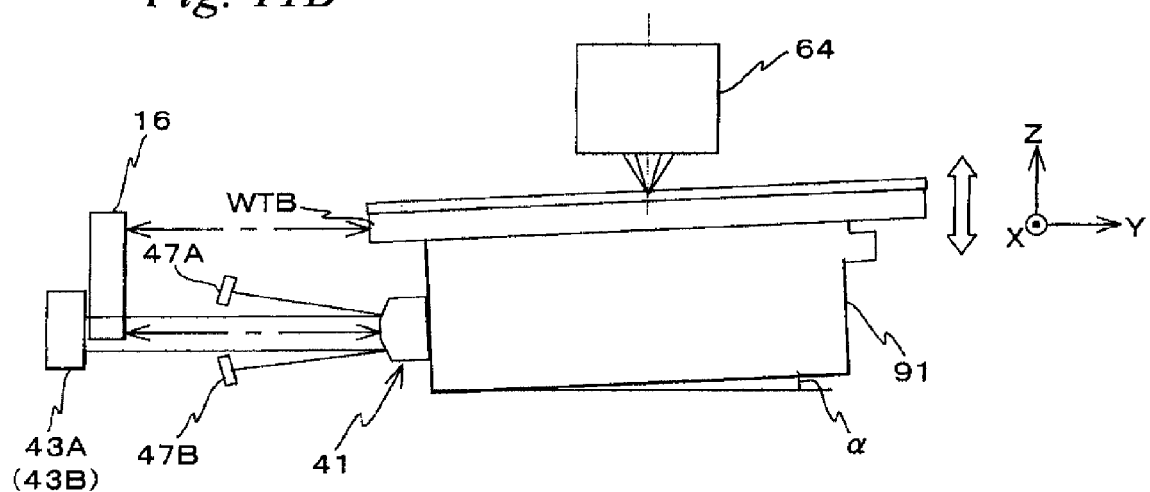

Thus, in the embodiment, correction information for correcting the measurement error of each encoder caused by the relative motion of the head and the scale in the non-measurement direction described above is acquired in the manner described below.

a. First of all, main controller 20 drives wafer stage WST via stage drive system 124 while monitoring the measurement values of Y interferometer 16, X interferometer 126 and Z interferometers 43A and 43B of interferometer system 118, and makes Y head 64 located on the most −X side of head unit 62A face an arbitrary area (an area indicated by being circled in FIG. 11A) AR of Y scale $39Y_1$ on the upper surface of wafer table WTB, as is shown in FIGS. 11A and 11B.

b. Then, based on the measurement values of Y interferometer 16 and Z interferometers 43A and 43B, main controller 20 drives wafer table WTB (wafer stage WST) so that both the rolling amount θy and the yawing amount θz of wafer table WTB (wafer stage WST) become zero and also the pitching amount θx becomes a desired value $α_0$ (in this case, $α_0$ is assumed to be equal to 200 μrad). After the driving of wafer table WTB (wafer stage WST), main controller 20 irradiates a detection light from the head 64 described above to area AR of Y scale $39Y_1$, and stores the measurement value, which corresponds to a photoelectric conversion signal from the head 64 that has received the reflected light, in an internal memory.

c. Next, based on the measurement values of Y interferometer 16 and Z interferometers 43A and 43B, main controller 20 drives wafer table WTB (wafer stage WST) in the Z-axis direction in a predetermined range, for example, a range of −100 μm to +100 μm as is indicated by an arrow in FIG. 11B while maintaining an attitude of wafer table WTB (wafer stage WST) (the pitching amount θx=$α_0$, the yawing amount θz=0, the rolling amount θy=0) of wafer table WTB (wafer stage WST), and during the driving, while irradiating a detection light from the Y head 64 described above to area AR of Y scale $39Y_1$, main controller 20 sequentially loads the measurement value corresponding to a photoelectric conversion signal from the head 64 that has received the reflected light at predetermined sampling intervals, and stores them in an internal memory.

d. Next, main controller 20 changes the pitching amount of wafer table WTB (wafer stage WST) to (θx=$α_0$−Δα) based on the measurement value of Y interferometer 16.

e. Subsequently, the similar operation to the operation in the above c. is repeated with the changed attitude.

f. After that, main controller 20 repeats the operations in the above d. and e. alternately, and loads the measurement value of head 64 in a range of the above-described Z-driving range at Δα (rad) intervals, for example, 40 μrad intervals, with respect to the range in which the pitching amount θx is −200 μrad<θx<+200 μrad.

g. Next, by plotting the respective data within the internal memory that have been obtained by the processes of the above b. to e. on a two-dimensional coordinate system that has a horizontal axis showing Z positions and a vertical axis showing encoder measurement values, and sequentially connecting plot points at which the pitching amount is the same, and then shifting the horizontal axis in the vertical axis direction so that a line (a horizontal line in the center) that connects the plot points at which the pitching amount is zero passes through the origin, a graph as shown in FIG. 12 (a graph that shows variation characteristics of measurement values of the encoder (head) in accordance with the Z-leveling of the wafer stage) is obtained.

Figure 12:
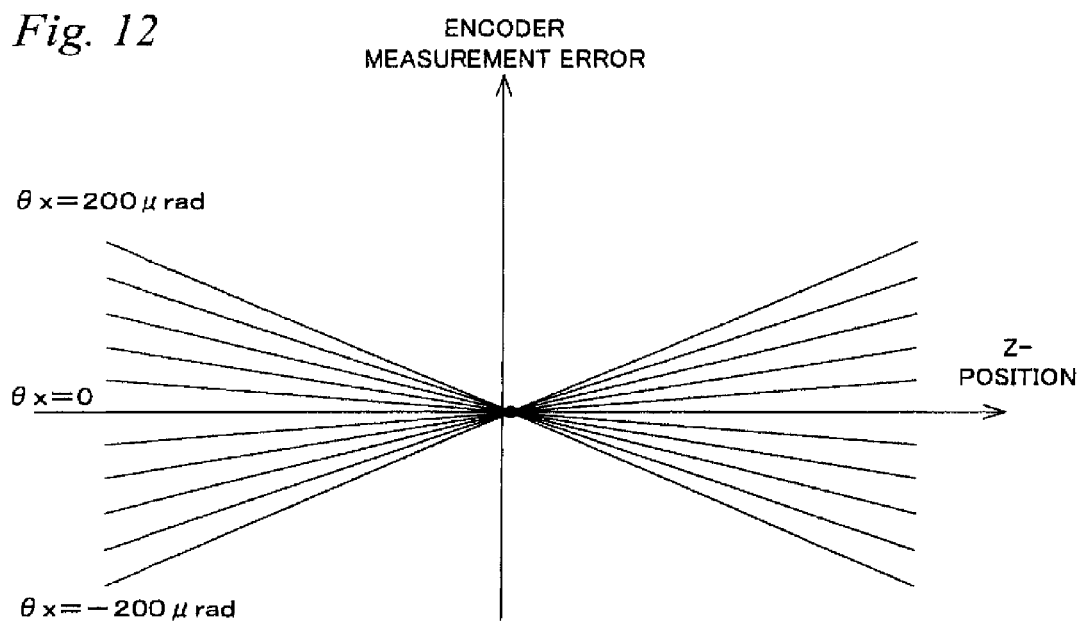
FIG. 12 is a graph showing measurement errors of the encoder with respect to the change in the Z-position when a pitching amount θx equals to α (θx=α)
Figure 13:
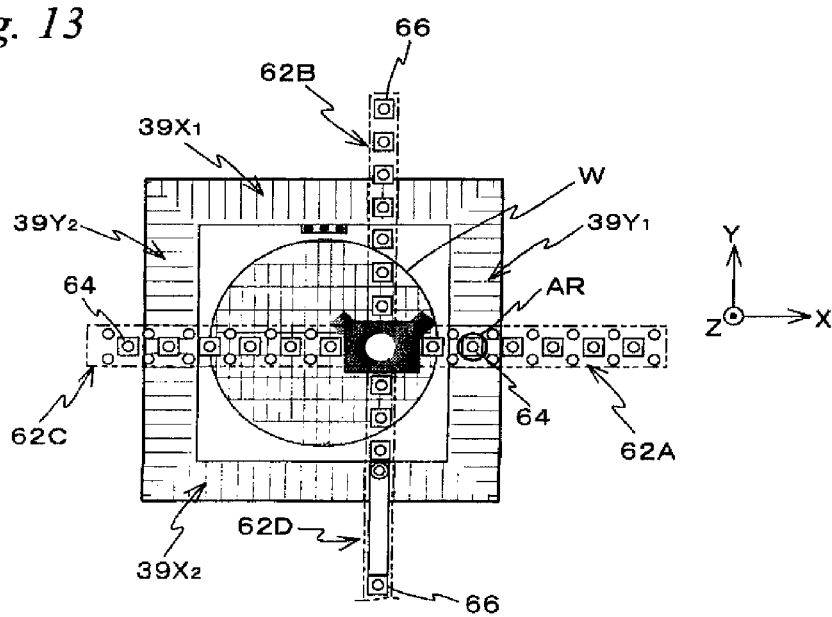
FIG. 13 is a view used to explain an operation for acquiring correction information used to correct a measurement error of another encoder (a second encoder) caused by the relative motion of the head and the scale in a non-measurement direction.

The value of each point in the vertical axis in the graph in FIG. 12 is a measurement error of the encoder at each Z position in the case where the pitching amount θx equals α (θx=α). Then, main controller 20 assumes the pitching amount θx, the Z-position, the encoder measurement error at each point in the graph of FIG. 12 as table data, and stores the table data in a memory 34 (refer to FIG. 6) as a stage-position-attributable-error correction information. Or, main controller 20 assumes the measurement error as the mathematical function of a Z-position z and the pitching amount ex, obtains the mathematical function by computing undetermined coefficients using, for example, the least-squares method, and stores the mathematical function as stage-position-attributable-error correction information in memory 34.

h. Next, main controller 20 drives wafer stage WST via stage drive system 124 in the −X direction a predetermined distance while monitoring the measurement values of X interferometer 126 of interferometer system 118, and as is shown in FIG. 13, makes Y head 64 that is located in the second position from the −X side end of head unit 62A (Y head next to the Y head 64 of which data acquisition has been completed as described above) face area AR (area indicated by being circled in FIG. 13) of Y scale 39Y$_1$ on the upper surface of wafer table WTB.

i. Then, main controller 20 performs the processes similar to the above to the Y head 64, and stores correction information of Y encoder 70A that is constituted by the Y head 64 and Y scale 39Y$_1$ within memory 34.

j. Afterward, in the similar manner, correction information of Y encoder 70A that is constituted by each of remaining Y heads 64 of head unit 62A and Y scale 39Y$_1$, correction information of X encoder 70B that is constituted by each of X heads 66 of head unit 62B and X scale 39X$_1$, correction information of Y encoder 70C that is constituted by each of Y heads 64 of head unit 62C and Y scale 39Y$_2$, and correction information of X encoder 70D that is constituted by each of X heads 66 of head unit 62D and X scale 39X$_2$ are respectively obtained and stored in memory 34.

Herein, it is important that similarly to the above-described case, when performing the above-described measurement using each X head 66 of head unit 62B, the same area on X scale 39X$_1$ is used; when performing the above-described measurement using each Y head 64 of head unit 62C, the same area on Y scale 39Y$_2$ is used; and when performing the above-described measurement using each X head 66 of head unit 62D, the same area on X scale 39X$_2$ is used. This is because if correction of each interferometer of interferometer system 118 (including correction of bending of reflection surfaces 17a and 17b and reflection surfaces 41a, 41b and 41c) has been completed, the attitude of wafer stage WST can be set to a desired attitude at any time based on the measurement values of those interferometers, and even if the scale surface is inclined, measurement errors do not occur among the heads due to the inclination of the scale surfaces, by using the same portion of each scale.

Further, regarding Y heads 64y$_1$ and 64y$_2$, main controller 20 performs the above-described measurement using the same area on Y scales 39Y$_2$ and 39Y$_1$ as the area that is used for each Y head 64 of head units 62C and 62A respectively, and obtains correction information of Y head 64y$_1$ facing Y scale 39Y$_2$ (encoder 70C) and correction information of Y head 64y$_2$ facing Y scale 39Y$_1$ (encoder 70A), and then stores them in memory 34.

Next, in the similar procedures to the above-described case when the pitching amount is changed, main controller 20 sequentially changes the yawing amount θz of wafer stage WST in the range of −200 μrad<θz<+200 μrad while maintaining both the pitching amount and the rolling amount of wafer stage WST to zero, and drives wafer table WTB (wafer stage WST) in the Z-axis direction in a predetermined range, for example, in a range of −100 μm to +100 μm at each position, and during the driving, sequentially loads the measurement values of the heads at predetermined sampling intervals and stores them in the internal memory. Such measurement is performed to all heads 64 or heads 66, and each data within the internal memory is plotted on a two-dimensional coordinate system having the horizontal axis indicating Z-positions and the vertical axis indicating encoder measurement values in the similar procedures to those described above, plot points at which the yawing amount is the same are sequentially connected, and the horizontal axis is shifted so that a line (a horizontal line in the center) at which the yawing amount is zero passes through the origin, and thereby a graph similar to the graph in FIG. 12 is obtained. Then, main controller 20 assumes the yawing mount θz, the Z-position, the measurement error at each point in the obtained graph as table data and stores the table data as correction information in memory 34. Or, main controller 20 assumes the measurement error as the mathematical function of a Z-position z and the yawing amount θz, obtains the mathematical function by computing undetermined coefficients using, for example, the least-squares method, and stores the mathematical function as correction information in memory 34.

Herein, in the case the pitching amount of wafer stage is not zero and also the yawing mount is not zero, it can be considered that the measurement error of each encoder when wafer stage WST is located at Z position z is the simple sum (linear sum) of the measurement error in accordance with the pitching amount described above and the measurement error in accordance with the yawing amount. This is because it has been confirmed as a result of the simulation that the measurement error (a count value (measurement value)) linearly changes in accordance with the change in the Z-position also in the case where the yawing is changed.

In the following description, for the sake of simplification of the explanation, it is assumed that regarding the Y heads of each Y encoder, a mathematical function with the pitching amount θx, the yawing amount θz, and the Z-position z of wafer stage WST that shows a measurement error Δy, as is expressed in the following equation (10), is computed and stored in memory 34. Further, it is assumed that regarding the X heads of each X encoder, a mathematical function with the rolling amount θy, the yawing amount θz, and the Z-position z of wafer stage WST that shows a measurement error Δx, as is expressed in the following equation (11), is computed and stored in memory 34.

$$\Delta y = f(z, \theta x, \theta z) = \theta x(z-a) + \theta z(z-b) \tag{10}$$

$$\Delta x = g(z, \theta y, \theta z) = \theta y(z-c) + \theta z(z-d) \tag{11}$$

In the above equation (10), "a" denotes a Z-coordinate of a point where the straight lines intersect in the graph in FIG. 12, and "b" denotes a Z-coordinate of a point where the straight lines intersect in the graph similar to the one in FIG. 12 that is obtained in the case the yawing amount is changed in order to acquire correction information of the Y encoders. Further, in the above equation (11), "c" denotes a Z-coordinate of a point where the straight lines intersect in the graph similar to the one in FIG. 12 that is obtained in the case the rolling amount is changed in order to acquire correction information of the X encoders, and "d" denotes a Z-coordinate of a point where the straight lines intersect in the graph similar to the one in FIG. 12 that is obtained in the case the yawing amount is changed in order to acquire correction information of the X encoders.

Incidentally, the measurement error Δy or Δx shows the degree in which the position of wafer stage WST in a non-measurement direction (e.g. the θx direction, or the θy direction, the θz direction and the Z-axis direction) of the Y encoder or the X-encoder affects the measurement value of the Y encoder or the X-encoder, and accordingly, in the following description, the measurement error Δy or Δx is referred to as a stage-position-attributable error, and since the stage-position-attributable error can be used without change as correction information, the correction information is referred to as stage-position-attributable-error correction information.

Meanwhile, in the case the optical axis of the head of the encoder substantially coincides with the Z-axis and all of the pitching amount, the rolling amount and the yawing amount of wafer stage WST are zero, as is obvious from the equations (10) and (11) described above, the measurement error of the encoder described above that is caused by the attitude of wafer table WTB is not supposed to occur, but in actual, the measurement error of the encoder is not zero even in such a case. This is because the surfaces of Y scales $39Y_1$ and $39Y_2$ and X scales $39X_1$ and $39X_2$ (the surface of second water repellent plate $28b$) are not ideal planes and have some unevenness. When there is unevenness on the surfaces of the scales (to be more accurate, the diffraction grating surface, and in the case the diffraction grating is covered with a cover glass, the surface of the cover glass is included), even in the case wafer stage WST moves along a plane parallel to the XY plane, the scale surface is displaced in the Z-axis direction (i.e. moves vertically) or inclines with respect to the head of the encoder. This exactly results in occurrence of the relative motion between the head and scale, and such relative motion becomes a factor of measurement error as is described earlier.

Figure 14:
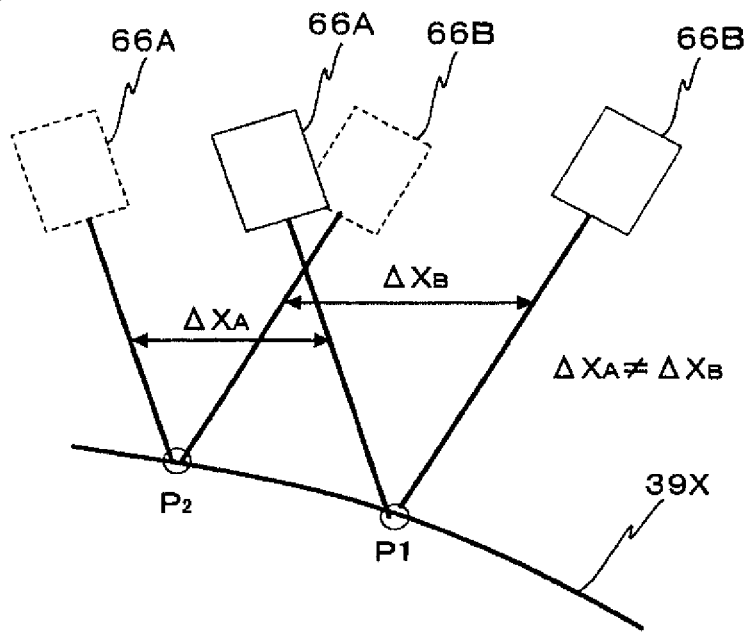
FIG. 14 is a view used to explain the inconvenience that occurs in the case a plurality of heads measure a plurality of measurement points on the same scale.

Further, as is shown in FIG. 14, for example, in the case a plurality of heads 66A and 66B measure a plurality of measurement points $P_1$ and $P_2$ on the same scale 39X, if the inclinations of the optical axes of the plurality of heads 66A and 66B are different from each other and the surface of scale 39X has unevenness (including inclination), the influence of unevenness on the measurement values is different by each head due to the difference in the inclinations, as is obvious from the fact that $\Delta X_A$ is not equal to $\Delta X_B$ ($\Delta X_A \neq \Delta X_B$) in FIG. 14. Accordingly, in order to eliminate the difference in the influence, the unevenness of the surface of scale 39X needs to be obtained beforehand. The unevenness of the surface of scale 39X may be measured using a measurement unit other than the encoder such as the Z sensor described above, but the measurement accuracy of the unevenness is defined by the measurement resolution of the measurement unit in such a case. Therefore, in order to measure the unevenness with high accuracy, there is a possibility that a higher-precision and more costly sensor than a sensor that is required for the original purpose should be used as the Z sensor.

Thus, in the embodiment, the method in which unevenness of the surfaces of the scales is measured using the encoder system itself is employed. Hereinafter, the method will be described.

As is shown in the graph (error characteristic curve) in FIG. 12 that shows variation characteristics of the measurement values of the encoder (head) in accordance with the Z-leveling of wafer stage WST described above, with respect to each encoder head, there exists only one point in the Z-axis direction, which is not sensitive to a tilt operation of wafer stage WST, that is, a peculiar point at which the measurement error of the encoder is zero regardless of the inclination angle of wafer stage WST with respect to the XY plane. When this point can be found by moving wafer stage WST similarly to the case of acquiring the stage-position-attributable-error correction information described above, the point (Z-position) can be assumed to be a peculiar point of the encoder head. When the operation of finding the peculiar point is performed for a plurality of measurement points on the scale, the shape (unevenness) of the surface of the scale can be obtained.

Figure 15:
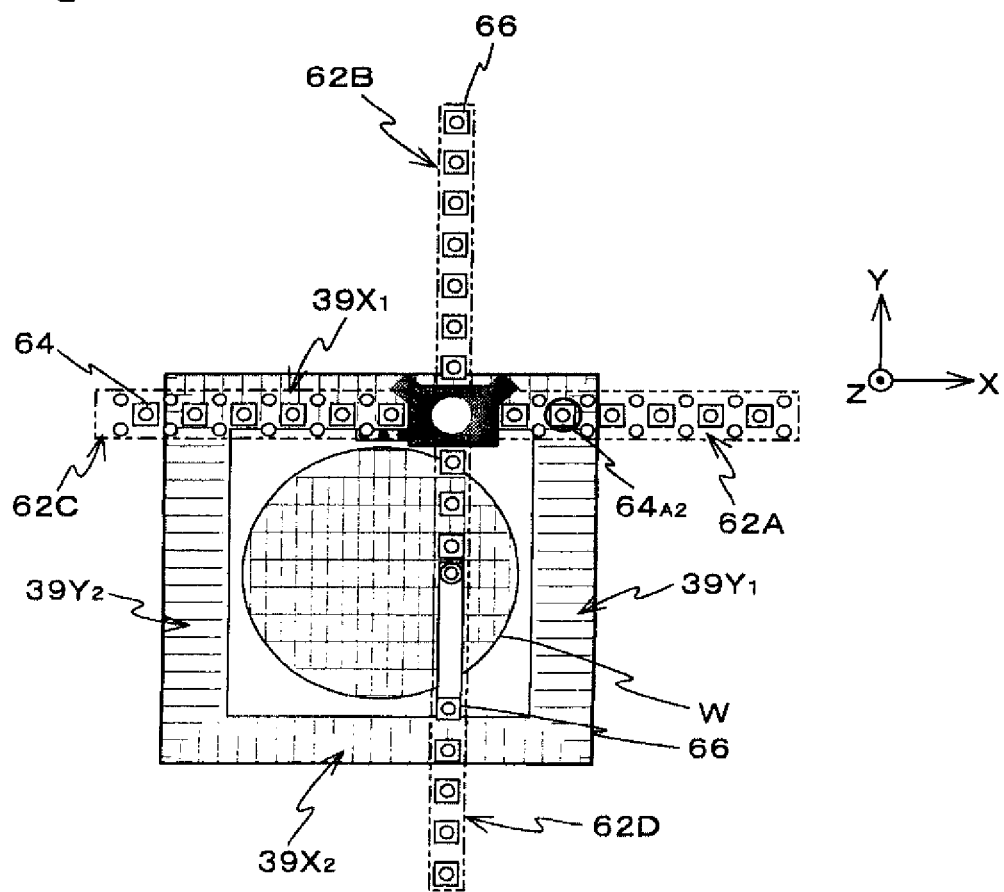
FIG. 15 is a view (No. 1) used to explain a method of measuring unevenness of the scale.

(a) Accordingly, first of all, main controller 20 drives wafer stage WST via stage drive system 124 while monitoring the measurement values of Y interferometer 16, X interferometer 126 and Z interferometers 43A and 43B of interferometer system 118, and, as is shown in FIG. 15, makes an arbitrary Y head of head unit 62A, for example, Y head $64_{A2}$ in FIG. 15 face the vicinity of the end portion of Y scale $39Y_1$ on the +Y side. Then, main controller 20 changes the pitching amount ($\theta x$ rotation amount) of wafer stage WST in at least two steps at that position in the similar manner to the above-described manner, and every time when the pitching amount is changed, main controller 20 scans (moves) wafer stage WST in a predetermined stroke range in the Z-axis direction while irradiating a detection light from Y head $64_{A2}$ to a subject measurement point of Y scale $39Y_1$ in a state where the attitude of wafer stage WST at that point in time is maintained, and performs sampling of measurement values of Y head $64_{A2}$ (encoder 70A) that faces Y scale $39Y_1$ during the scanning (movement). Incidentally, the above-described sampling is performed while the yawing amount (and the rolling amount) of wafer stage WST is maintained at zero.

Then, main controller 20 obtains the error characteristic curve (refer to FIG. 12) at the subject measurement point of encoder 70A in accordance with the Z-position of wafer stage WST with respect to each of a plurality of attitudes, by performing a predetermined computation based on results of the sampling, and assumes an intersecting point at which a plurality of the error characteristic curves intersect, that is, the point at which measurement error of encoder 70A is zero regardless of the inclination angle of wafer stage WST with respect to the XY plane as a peculiar point at the subject measurement point, and then obtains Z-position information $z_1$ (refer to FIG. 16A) of the peculiar point.

(b) Next, main controller 20 performs step movement of wafer stage WST by a predetermined distance in the +Y direction via stage drive system 124 with the pitching amount and the rolling amount of wafer stage WST maintained at zero while monitoring the measurement values of Y interferometer 16, X interferometer 126 and Z interferometers 43A and 43B of interferometer system 118. This step movement is performed at a low speed at a level in which the measurement error of the interferometers due to air fluctuations can be ignored.

(c) Then, at the position after the step movement, Z-position information $z_p$ (in this case, p=2) of a peculiar point of encoder 70A at the position is obtained, similarly to the above-described (a).

After that, main controller 20 obtains Z-position information $z_p$ (p=2, 3, . . . , i, . . . k, . . . n) at a plurality (e.g. (n−1) number) of measurement points that are set at a predetermined distance in the Y-axis direction on Y scale $39Y_1$ by repeatedly performing operations similar to the above (b) and (c).

Figure 16A:
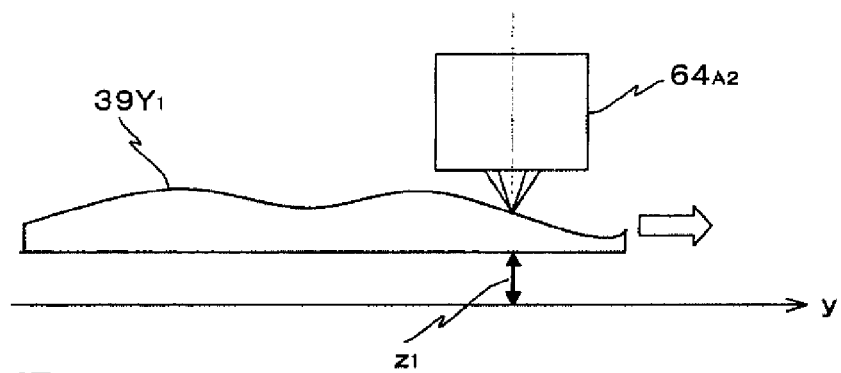
FIGS. 16A to 16D are views (No. 2) used to explain a method of measuring unevenness of the scale.
Figure 16B:
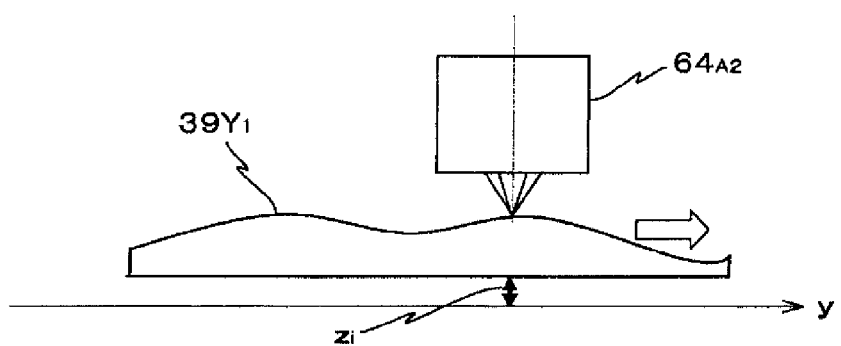
Figure 16C:
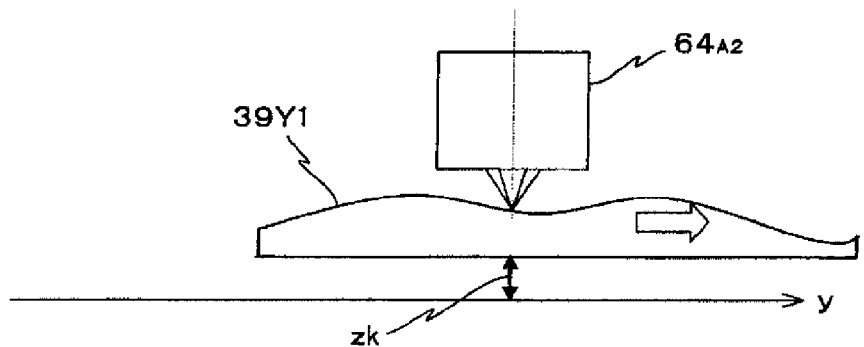

FIG. 16B shows z-position information $z_i$ of a peculiar point at the $i^{th}$ measurement point obtained in the manner described above, and FIG. 16C shows z-position information $z_k$ of a peculiar point at the $k^{th}$ measurement point obtained in the manner described above.

Figure 16D:
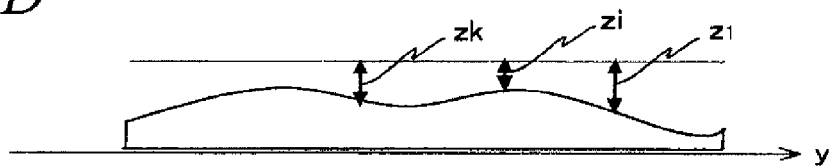

(d) Then, main controller 20 obtains unevenness of the surface of Y scale $39Y_1$ based on Z position information $z_2, \ldots z_n$ of the peculiar point obtained for each of the plurality of measurement points. As is shown in FIG. 16D, one end of each two-headed arrow that indicates Z-position $Z_p$ of the peculiar point at each of the measurement points on Y scale $39Y_1$ is made to coincide with a predetermined datum line, so that a curved line that connects the other end of each two-headed arrow indicates the surface shape (unevenness) of Y scale $39Y_1$. Accordingly, main controller 20 obtains a mathematical function $z=f_1(y)$ that denotes the unevenness, by performing curve-fitting (the least squares approximation) of the point of the other end of each two-headed arrow, and stores it in memory 34. Incidentally, "y" denotes a Y-coordinate of wafer stage WST measured by Y interferometer 16.

(e) Main controller 20 severally obtains a mathematical function $z=f_2(y)$ that denotes the unevenness of Y scale $39Y_2$, a mathematical function $z=g_1(x)$ that denotes the unevenness of X scale $39X_1$, and a mathematical function $z=g_2(x)$ that denotes the unevenness of X scale $39X_2$, and stores them in memory 34. Incidentally, "x" denotes an X-coordinate of wafer stage WST measured by X interferometer 126.

Herein, when obtaining the error characteristic curve (refer to FIG. 12) described above at each measurement point on each scale, in the case the error characteristic curve in which a measurement error is constantly zero regardless of the change in Z-position is obtained, the pitching mount of wafer stage WST when obtaining this error characteristic curve corresponds to an inclination amount of the scale surface at the measurement point. Accordingly, in the method above, information on inclination at each measurement point may also be obtained in addition to information on height of the scale surface. By doing so, the fitting with higher accuracy can be performed on the curve-fitting described above.

In the meantime, the scale of the encoder lacks mechanical long-term stability for the reasons such as deformation of a diffraction grating due to thermal expansion and the like with lapse of the operating time, or partial or entire change in the pitch of a diffraction grating. Therefore, since the error included in the measurement value of the encoder becomes larger with lapse of the operating time, the error needs to be corrected. In the following description, an acquisition operation of acquiring correction information of grating pitch and correction information of grating deformation of a scale performed in exposure apparatus 100 in the embodiment will be explained based on FIG. 17.

Figure 17:
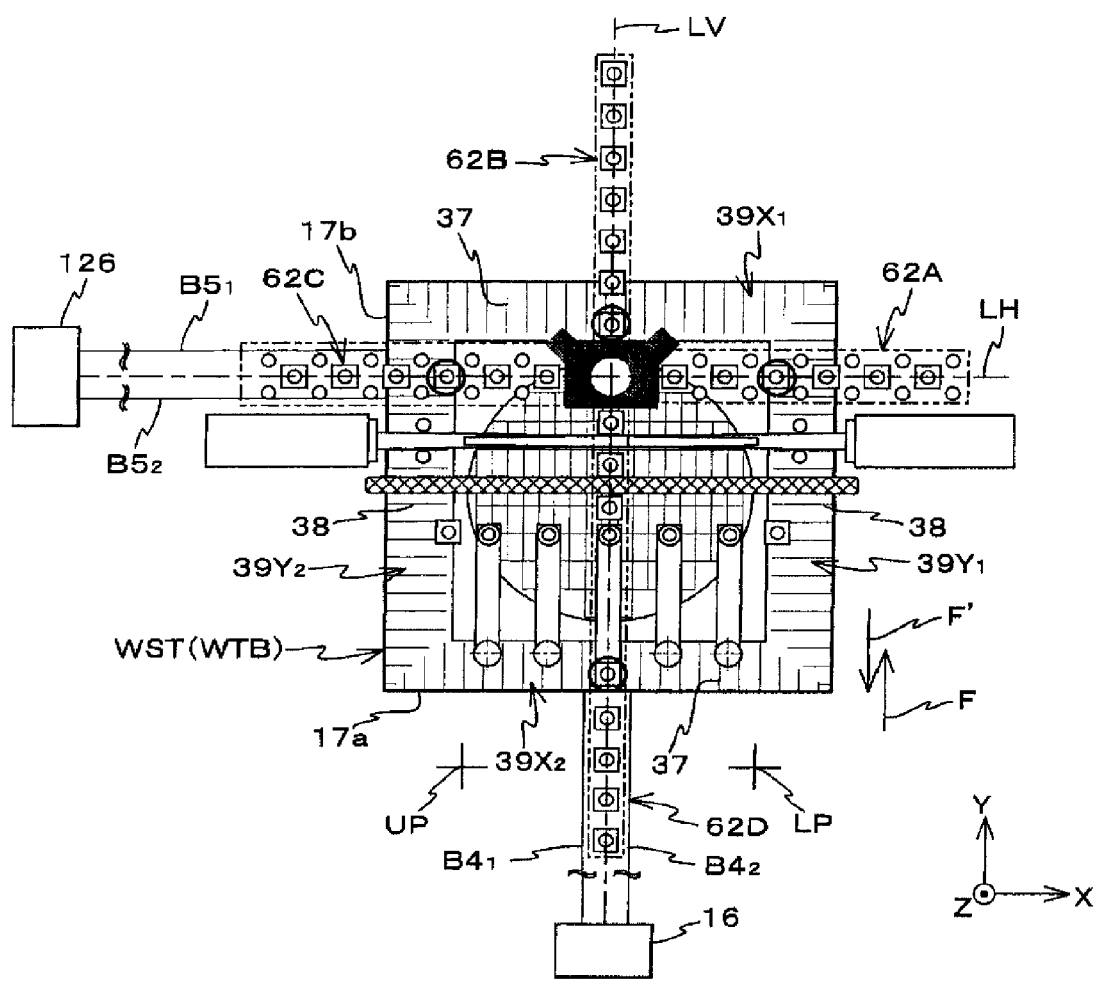
FIG. 17 is a view used to explain an acquisition operation of acquiring correction information of grating pitch and correction information of grating deformation of the scale.

In FIG. 17, measurement beams $B4_1$ and $B4_2$ are symmetrically placed with respect to straight line LV described above, and actual measurement axes of Y interferometer 16 coincide with straight line LV parallel to the Y-axis direction that passes through the optical axis of projection optical system PL. Therefore, Y interferometer 16 can measure the Y-position of wafer table WTB without Abbe errors. Similarly, measurement beams $B5_1$ and $B5_2$ are symmetrically placed with respect to straight line LH described above, and actual measurement axes of X interferometer 126 coincide with straight line LH parallel to the X-axis direction that passes through the optical axis of projection optical system PL. Therefore, X interferometer 126 can measure the X-position of wafer table WTB without Abbe errors.

First, an acquisition operation of acquiring correction information of deformation of grating lines (warp of grating lines) of the X scale and correction information of grating pitch of the Y scale will be explained. Herein, reflection surface 17b is assumed to be an ideal plane, for the sake of simplification of the description. Further, it is assumed that prior to the acquisition operation, the above-described measurement of unevenness information of the surface of each scale has been performed, and the mathematical function $z=f_1(y)$ that denotes the unevenness of Y scale $39Y_1$, the mathematical function $z=f_2(y)$ that denotes the unevenness of Y scale $39Y_2$, the mathematical function $z=g_1(x)$ that denotes the unevenness of X scale $39X_1$, and the mathematical function $z=g_2(x)$ that denotes the unevenness of X scale $39X_2$ have been stored in memory 34.

First of all, main controller 20 reads the mathematical function $z=f_1(y)$, the mathematical function $z=f_2(y)$, the mathematical function $z=g_1(x)$ and the mathematical function $z=g_2(x)$ stored in memory 34 into the internal memory.

Next, main controller 20 moves wafer stage WST, for example, in at least one direction of the +Y direction and –Y direction, as is indicated by arrows F and F' in FIG. 17, within the effective stroke range, at a low speed at a level in which short-term fluctuation of the measurement value of Y interferometer 16 can be ignored and with the measurement value of X interferometer 126 being fixed to a predetermined value, in a state where all the pitching mount, the rolling amount and the yawing amount are maintained at zero based on the measurement values of Y interferometer 16 and Z interferometers 43A and 43B. During the movement, while correcting the measurement values (outputs) of Y linear encoders 70A and 70C using the mathematical functions $z=f_1(y)$ and $z=f_2(y)$ respectively, main controller 20 loads the measurement values after the correction and the measurement values of Y interferometer 16 (to be more accurate, the measurement values of measurement beams $B4_1$ and $B4_2$) at predetermined sampling intervals, and obtains a relation between the measurement values of Y linear encoders 70A and 70C (the measurement value corresponding to a value obtained by assigning the output of encoder 70A to the mathematical function $f_1(y)$, and the measurement value corresponding to a value obtained by assigning the output of encoder 70C to the mathematical function $f_2(y)$) and the measurement values of Y interferometer 16. That is, in this manner, main controller 20 obtains the grating pitch (a distance between adjacent grating lines) of Y scales $39Y_1$ and $39Y_2$ that are sequentially placed facing head units 62A and 62C according to the movement of wafer stage WST, and correction information of the grating pitch. As the correction information of the grating pitch, for example, a correction map that shows a relation between both the measurement values in a curved line in the case a horizontal axis indicates the measurement value of the interferometer and a vertical axis indicates the measurement values of the encoders (the measurement values in which the error caused by the unevenness of the scale has been corrected), or the like can be obtained. The measurement values of Y interferometer 16 in this case are obtained when scanning wafer stage WST at the extremely low speed described above, and therefore, it can be thought that the measurement values are accurate values in which error can be ignored, because not only a long-term fluctuation error but also a short-term fluctuation error caused by air fluctuations or the like are hardly included in the measurement values.

Further, during the above-described movement of wafer stage WST, main controller 20 performs a statistical processing, for example, averaging (or performing weighted averaging of) the measurement values obtained from a plurality of X heads 66 of head units 62B and 62D that are sequentially placed facing X scales $39X_1$ and $39X_2$ (the measurement values of X linear encoders 70B and 70D) according to the movement, thereby also obtaining correction information of deformation (warp) of grating lines 37 that have sequentially faced the plurality of X heads 66. This is because the same blurring pattern should repeatedly appear in the process where wafer stage WST is moved in the +Y direction or the –Y direction in the case reflection surface 17b is an ideal plane, and therefore, correction information of deformation (warp) of grating lines 37 that have sequentially faced the plurality of X heads 66 can be accurately obtained by averaging the measurement data acquired by the plurality of X heads 66, or the like.

Incidentally, in the usual case reflection surface 17b is not an ideal plane, the unevenness (bending) of the reflection surface is measured and correction data of the bending is obtained in advance. Then, on movement of wafer stage WST in the +Y direction or the −Y direction, wafer stage WST may accurately be moved in the Y-axis direction by moving wafer stage WST in the +Y direction or the −Y direction while controlling the X-position of wafer stage WST based on the correction data instead of fixing the measurement value of X interferometer 126 to a predetermined value. Thus, correction information of grating pitch of the Y-scales and correction information of deformation (warp) of grating lines 37 can be obtained in the same manner as described above. Incidentally, measurement data acquired by a plurality of X heads 66 is plural data on the basis of different areas on reflection surface 17*b*, and each of the X heads 66 measures deformation (warp) of the same grating line, and therefore, there is also an incidental effect that the residual error after warp correction of the reflection surface is averaged to be approximate to the true value by the averaging described above and the like (in other words, the influence of the warp residual error can be reduced by averaging the measurement data (warp information of grating lines 37) acquired by the plurality of X heads 66).

Next, an acquisition operation of acquiring correction information of deformation of grating lines (warp of grating lines) of the Y scale and correction information of grating pitch of the X scale will be described. Herein, reflection surface 17*a* is assumed to be an ideal plane, for the sake of simplification of the description. In this case, the process that needs to be performed is the correction described above with the X-axis direction and Y-axis direction interchanged.

That is, main controller 20 moves wafer stage WST, for example, in at least one direction of the +X direction and −X direction within the effective stroke range described above, at a low speed at a level in which short-term fluctuation of the measurement value of X interferometer 126 can be ignored and with the measurement value of Y interferometer 16 being fixed to a predetermined value, in a state where all the pitching mount, the rolling amount and the yawing amount are maintained at zero based on the measurement values of X interferometer 126, Y interferometer 16 and Z interferometers 43A and 43B. During the movement, while correcting the measurement values of X linear encoders 70B and 70D using the mathematical functions $z=g_1(x)$ and $z=g_2(x)$ respectively, main controller 20 loads the measurement values after the correction and the measurement values of X interferometer 126 at predetermined sampling intervals, and obtains a relation between the measurement values of X linear encoders 70B and 70D (the measurement value corresponding to a value obtained by assigning the output of encoder 70B to the mathematical function $g_1(x)$, and the measurement value corresponding to a value obtained by assigning the output of encoder 70D to the mathematical function $g_2(x)$) and the measurement values of X interferometer 126. That is, in this manner, main controller 20 obtains the grating pitch (a distance between adjacent grating lines) of X scales $39X_1$ and $39X_2$ that are sequentially placed facing head units 62B and 62D according to the movement of wafer stage WST, and correction information of the grating pitch. As the correction information of the grating pitch, for example, a correction map that shows a relation between both the measurement values in a curved line in the case a horizontal axis indicates the measurement value of the interferometer and a vertical axis indicates the measurement values of the encoders, or the like can be obtained. The measurement values of X interferometer 126 in this case are obtained when scanning wafer stage WST at the extremely low speed described above, and therefore, it can be thought that the measurement values are accurate values in which error can be ignored, because not only a long-term fluctuation error but also a short-term fluctuation error caused by air fluctuations or the like are hardly included in the measurement values.

Further, during the above-described movement of wafer stage WST, main controller 20 performs a statistical processing, for example, averaging (or performing weighted averaging of) the measurement values obtained from a plurality of Y heads 64 of head units 62A and 62C that are sequentially placed facing Y scales $39Y_1$ and $39Y_2$ (the measurement values of Y linear encoders 70A and 70C) according to the movement, thereby also obtaining correction information of deformation (warp) of grating lines 38 that have sequentially faced the plurality of Y heads 64. This is because the same blurring pattern should repeatedly appear in the process where wafer stage WST is moved in the +X direction or the −X direction in the case reflection surface 17*a* is an ideal plane, and therefore, correction information of deformation (warp) of grating lines 38 that have sequentially faced the plurality of Y heads 64 can be accurately obtained by averaging the measurement data acquired by the plurality of Y heads 64, or the like.

Incidentally, in the usual case reflection surface 17*a* is not an ideal plane, the unevenness (bending) of the reflection surface is measured and correction data of the bending is obtained in advance. Then, on movement of wafer stage WST in the +X direction or the −X direction, wafer stage WST may accurately be moved in the X-axis direction by moving wafer stage WST in the +X direction or the −X direction while controlling the Y-position of wafer stage WST based on the correction data instead of fixing the measurement value of Y interferometer 16 to a predetermined value. Thus, correction information of grating pitch of the X-scales and correction information of deformation (warp) of grating lines 38, which are the same as those described above, can be obtained.

As is described above, main controller 20 obtains correction information of grating pitch of the Y scales and correction information of deformation (warp) of grating lines 37, and correction information of grating pitch of the X scales and correction information of deformation (warp) of grating lines 38 at each predetermined timing, for example, with respect to the head wafer of each lot, or the like.

Then, during the process of a lot or the like, while correcting the measurement values obtained from head units 62A and 62C (i.e. the measurement values of encoders 70A and 70C) based on the correction information of grating pitch and the correction information of deformation (warp) of grating lines 38 and based on stage-position-attributable-error correction information in accordance with the Z position z, the pitching amount θx and the yawing amount θz of wafer stage WST that are measured by interferometer system 118, main controller 20 performs movement control of wafer stage WST in the Y-axis direction using Y scales $39Y_1$ and $39Y_2$ and head units 62A and 62C, that is, Y linear encoders 70A and 70C. With this operation, it becomes possible to perform movement control of wafer stage WST in the Y-axis direction with high accuracy using Y linear encoders 70A and 70C without being affected by change over time in grating pitch of the Y scales and warp of each grating (line) constituting the Y scales, and without being affected by the change in the position of wafer stage WST in non-measurement directions (the relative motion between the head and the scale in the non-measurement directions).

Further, during the process of a lot or the like, while correcting the measurement values obtained from head units 62B and 62D (i.e. the measurement values of encoders 70B and 70D) based on the correction information of grating pitch and the correction information of deformation (warp) of grating lines 37 and based on stage-position-attributable-error correction information in accordance with the Z position z, the rolling amount θy and the yawing amount θz of wafer stage WST that are measured by interferometer system 118, main controller 20 performs movement control of wafer stage WST in the X-axis direction using X scales 39X$_1$ and 39X$_2$ and head units 62B and 62D, that is, X linear encoders 70B and 70D. With this operation, it becomes possible to perform movement control of wafer stage WST in the X-axis direction with high accuracy using X linear encoders 70B and 70D without being affected by change over time in grating pitch of the X scales and warp of each grating (line) constituting the X scales, and without being affected by the change in the position of wafer stage WST in non-measurement directions (the relative motion between the head and the scale in the non-measurement directions).

Incidentally, in the description above, correction information of grating pitch and grating line warp is to be acquired for both of the Y scales and the X scales. However, the present invention is not limited to this, and correction information of grating pitch and grating line warp may be acquired for either one of the Y scales or the X scales, or the correction information of either one of grating pitch or grating line warp may be acquired for both the Y scales and the X scales. For example, in the case only correction information of warp of grating lines 37 of the X scales is acquired, wafer stage WST may be moved in the Y-axis direction based on the measurement values of Y linear encoders 70A and 70C without necessarily using Y interferometer 16. Similarly, for example, in the case only correction information of warp of grating lines 38 of the Y scales is acquired, wafer stage WST may be moved in the X-axis direction based on the measurement values of X linear encoders 70B and 70D without necessarily using X interferometer 126. Further, only either one of the stage-position-attributable error described above and a measurement error of the encoder that occurs due to the scales (such as the flatness of the grating surface and/or a formation error of the grating (including pitch error, grating line warp and the like)) (hereinafter, also referred to as a scale-attributable error) may be compensated.

Next, a parallel processing operation using wafer stage WST and measurement stage MST in exposure apparatus 100 of the embodiment will be described based on FIGS. 18 to 31. Incidentally, during the operation described below, main controller 20 performs opening/closing control of each valve of liquid supply unit 5 and liquid recovery unit 6 of local liquid immersion unit 8 as is described earlier, and the space directly below tip lens 191 of projection optical system PL is constantly filled with water. However, description regarding control of liquid supply unit 5 and liquid recovery unit 6 will be omitted in the following description, in order to make the description easily understandable. Further, the following description regarding the operation will be made using many drawings, but the reference codes of the same members are shown in some drawings and not shown in the other drawings. That is, the reference codes shown are different in each of the drawings, but these drawings show the same configuration regardless of existence or non-existence of the reference codes. The same is true also in each of the drawings used in the description above.

FIG. 18 shows a state where exposure by a step-and-scan method is being performed to wafer W (in this case, to be a mid wafer of a certain lot (one lot containing 25 or 50 wafers), as an example) on wafer stage WST. At this point in time, measurement stage MST may wait at a withdrawal position where collision with wafer stage WST is avoided, but in the embodiment, measurement stage MST is moving following wafer stage WST while keeping a predetermined distance between them. Therefore, the same distance as the predetermined distance is sufficient as a moving distance of measurement stage MST that is needed when going into the contact state (or proximity state) with wafer stage WST described above after the exposure ends.

During the exposure, main controller 20 controls the position (including the θz rotation) within the XY plane of wafer table WTB (wafer stage WST), based on the measurement values of at least three encoders out of two X heads 66 indicated by being circled in FIG. 18 that face X scales 39X$_1$ and 39X$_2$ respectively (X encoders 70B and 70D) and two Y heads 64 indicated by being circled in FIG. 18 that face Y scales 39Y$_1$ and 39Y$_2$ respectively (Y encoders 70A and 70C), and based on stage-position-attributable-error correction information of each encoder (correction information computed in the equation (10) or (11)) in accordance with the pitching amount, the rolling amount, the yawing amount and the Z-position of wafer stage WST that are measured by interferometer system 118, and based on correction information of grating pitch and correction information of warp of grating lines of each scale. Further, main controller 20 controls the position in the Z-axis direction, and the θy rotation (rolling) and the θx rotation (pitching) of wafer table WTB, based on the measurement values of a pair of Z sensors 74$_{1j}$ and 74$_{2j}$, and a pair of Z sensors 76$_{1q}$ and 76$_{2q}$ that respectively face the end portions on one side and the other side in the X-axis direction of the wafer table WTB surface (Y scales 39Y$_1$ and 39Y$_2$ in the embodiment). Incidentally, the position in the Z-axis direction and the θy rotation (rolling) of wafer table WTB may be controlled based on the measurement values of Z sensors 74$_{1j}$ and 74$_{2j}$, and 76$_{1q}$ and 76$_{2q}$ and the θx rotation (pitching) may be controlled based on the measurement values of Y interferometer 16. In either case, the control of the position in the Z-axis direction, the θy rotation and θx rotation of wafer table WTB (focus leveling control of wafer W) during the exposure is performed based on the results of the focus mapping that was performed beforehand by the multipoint AF system described earlier.

The foregoing exposure operation is performed by main controller 20 repeating a moving operation between shots in which wafer stage WST is moved to a scanning starting position (accelerating starting position) for exposure of each shot area on wafer W based on the result of wafer alignment (e.g. Enhanced Global Alignment (EGA)) performed beforehand, the latest baselines of alignment systems AL1 and AL2$_1$ to AL2$_4$ and the like, and a scanning exposure operation in which a pattern formed on reticle R is transferred to each shot area by a scanning exposure method. Incidentally, the exposure operation described above is performed in a state where water is held in the space between tip lens 191 and wafer W. Further, the exposure operation is performed in the order from the shot area located on the −Y side to the shot area located on the +Y side in FIG. 18. Incidentally, the EGA method is disclosed in, for example, the U.S. Pat. No. 4,780,617 and the like.

Figure 19:
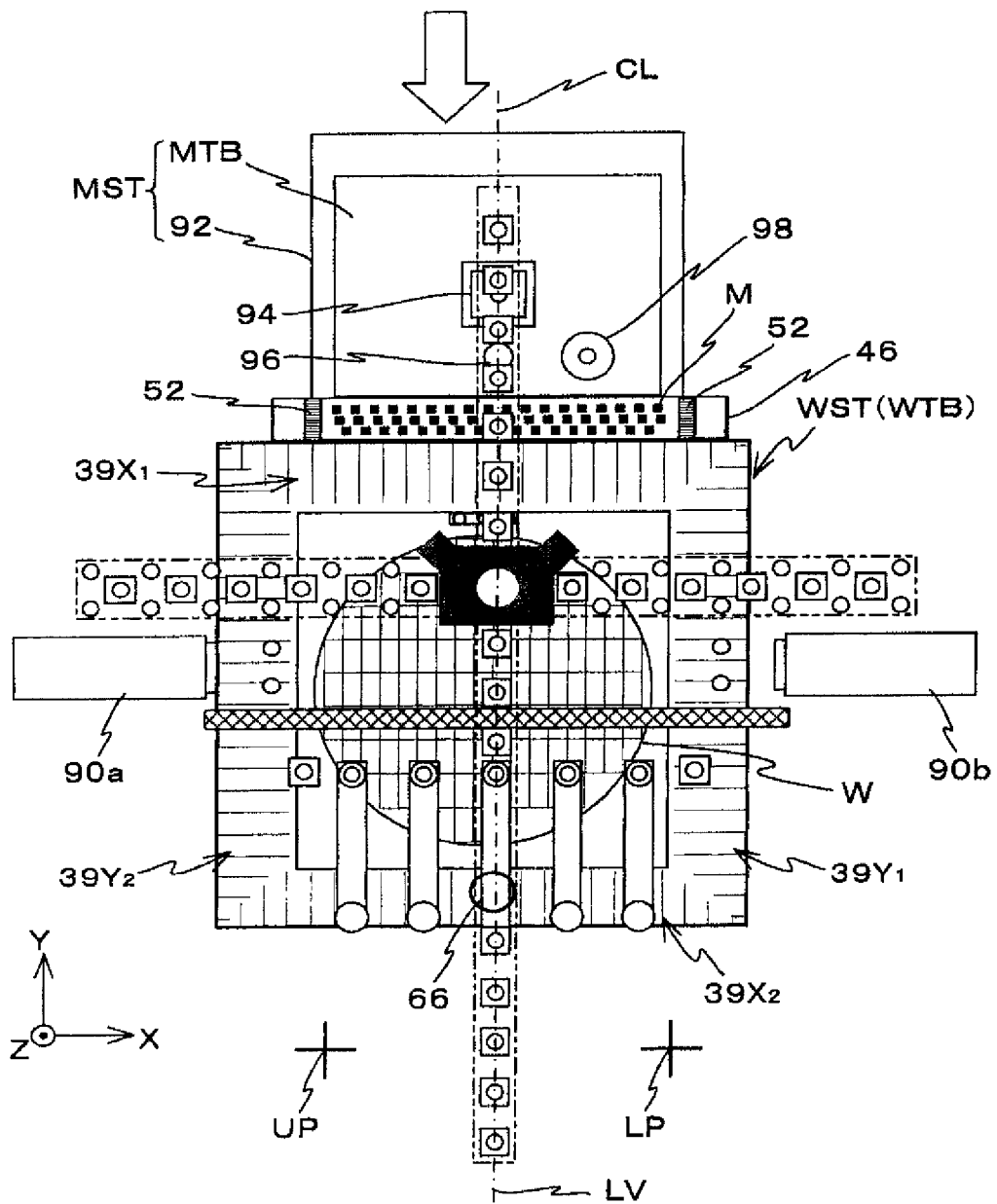
FIG. 19 is a view showing a state of the wafer stage and the measurement stage immediately after a state of both stages shifts from the state in which both stages are separate from each other to a state in which both stages come into contact with each other, after exposure is finished.

Then, before the last shot area on wafer W is exposed, main controller 20 moves measurement stage MST (measurement table MTB) to the position shown in FIG. 19 by controlling stage drive system 124 based on the measurement value of Y interferometer 18 while maintaining the measurement value of X interferometer 130 to a constant value. At this point in time, the end surface on the −Y side of CD bar 46 (measurement table MTB) and the end surface on the +Y side of wafer table WTB are in contact with each other. Incidentally, the noncontact state (proximity state) may also be kept by, for example, monitoring the measurement values of the interferometer or the encoder that measures the Y-axis direction position of each table and separating measurement table MTB and wafer table WTB in the Y-axis direction at a distance of around 300 μm. Wafer stage WST and measurement stage MST are set in the positional relation shown in FIG. 19 during exposure of wafer W, and after that, both the stages are moved so as to keep the positional relation.

Figure 20:
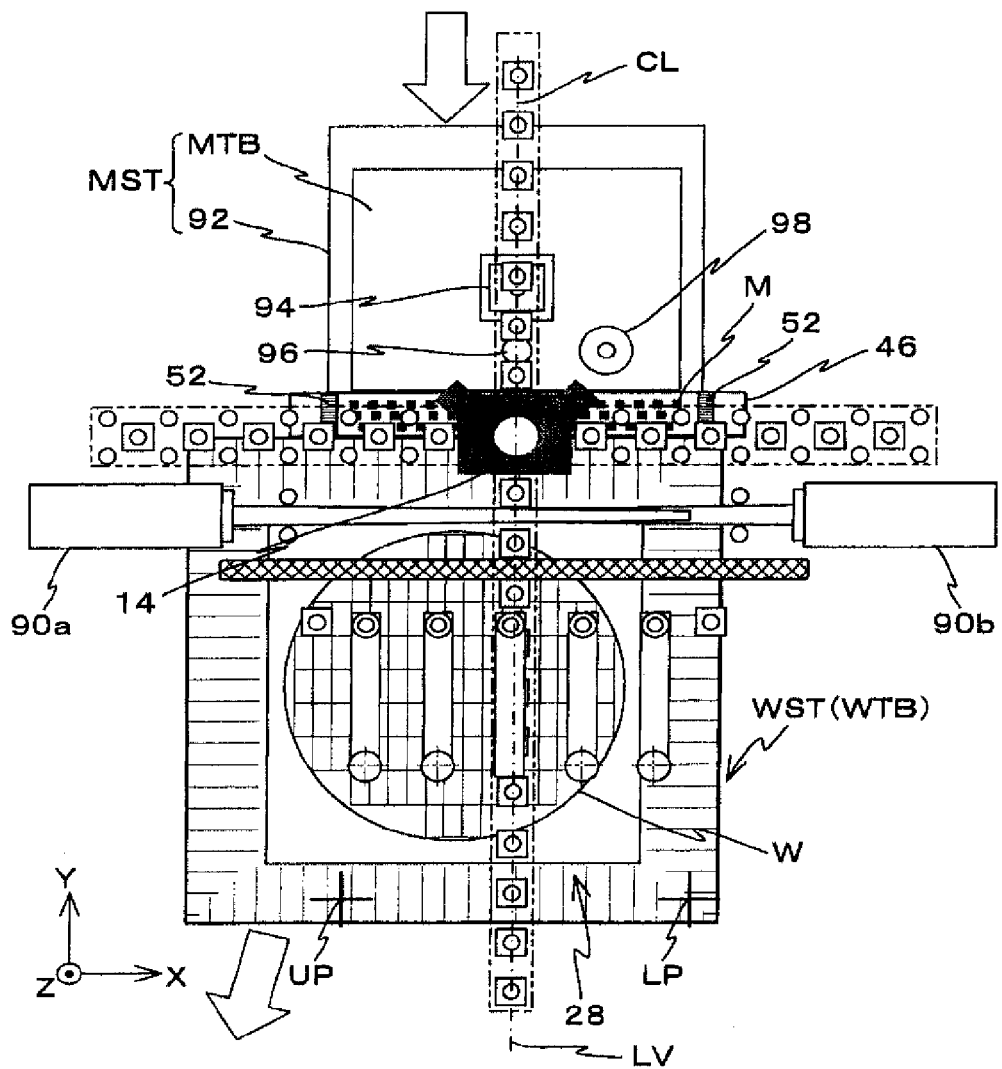
FIG. 20 is a view showing a state of the wafer stage and the measurement stage when the measurement stage is moving in the −Y direction and the wafer stage is moving toward an unloading position while keeping the positional relation between both stages in the Y-axis direction.

Subsequently, as is shown in FIG. 20, while keeping the positional relation in the Y-axis direction between wafer table WTB and measurement table MTB, main controller 20 starts an operation of driving measurement stage MST in the −Y direction and also starts an operation of driving wafer stage WST toward unloading position UP. When these operations are started, in the embodiment, measurement stage MST is moved only in the −Y direction, and wafer stage WST is moved in the −Y direction and −X direction.

When main controller 20 drives wafer stage WST and measurement stage MST simultaneously as is described above, water that is held in the space between tip lens 191 of projection unit PU and wafer W (water in liquid immersion area 14 shown in FIG. 20) sequentially moves from wafer W to plate 28, CD bar 46, and measurement table MTB, according to movement of wafer stage WST and measurement stage MST to the −Y side. Incidentally, during the foregoing movement, the contact state (or proximity state) of wafer table WTB and measurement table MTB is maintained. Incidentally, FIG. 20 shows a state right before water in liquid immersion area 14 is delivered from plate 28 to CD bar 46. Further, in the state shown in FIG. 20, main controller 20 controls the position within the XY plane (including the θz rotation) of wafer table WTB (wafer stage WST), based on the measurement values of three encoders 70A, 70B and 70D (and stage-position-attributable-error correction information of encoders 70A, 70B or 70D stored in memory 34 in accordance with the pitching amount, the rolling amount and the yawing amount, and the Z-position of wafer stage WST that are measured by interferometer system 118, and correction information of grating pitch and correction information of grating lines of the scales).

When wafer stage WST and measurement stage MST are simultaneously and slightly driven further in the above-described directions respectively from the state of FIG. 20, position measurement of wafer stage WST (wafer table WTB) by Y encoders 70A (and 70C) cannot be performed. Therefore, right before that, main controller 20 switches the control of the Y-position and the θz rotation of wafer stage WST (wafer table WTB) from the control based on the measurement values of Y encoders 70A and 70C to the control based on the measurement values of Y interferometer 16 and Z interferometers 43A and 43B. Then, after a predetermined period of time, as is shown in FIG. 21, measurement stage MST reaches a position where baseline measurement of the secondary alignment systems (hereinafter, also referred to as the Sec-BCHK (interval) as needed) that is performed at predetermined intervals (in this case, with respect to each wafer replacement) is performed. Then, main controller 20 stops measurement stage MST at the position, and also drives further wafer stage WST toward unloading position UP while measuring the X-position of wafer stage WST by X head 66 indicated by being circled in FIG. 21 that faces X scale 39X₁ (X-linear encoder 70B) and measuring the Y-position, the θz rotation and the like by Y interferometer 16 and Z interferometers 43A and 43B, and stops wafer stage WST at unloading position UP. Incidentally, in the state of FIG. 21, water is held in the space between measurement table MTB and tip lens 191.

Subsequently, as is shown in FIGS. 21 and 22, main controller 20 adjusts the θz rotation of CD bar 46 based on the measurement values of Y-axis linear encoders 70E and 70F described above that are constituted by Y heads $64y_1$ and $64y_2$ indicated by being circled in FIG. 22 that respectively face a pair of reference gratings 52 on CD bar 46 supported by measurement stage MST, and also adjusts the XY-position of CD bar 46 based on the measurement value of primary alignment system AL1 indicated by being circled in FIG. 22 that detects reference mark M that is located on centerline CL of measurement table MTB or in the vicinity thereof. Then, in this state, main controller 20 performs the Sec-BCHK (interval), in which baselines of four secondary alignment systems $AL2_1$ to $AL2_4$ (the relative positions of the four secondary alignment systems with respect to primary alignment system AL1) are severally obtained, by simultaneously measuring reference marks M on CD bar 46 that are located in the field of each secondary alignment system using four secondary alignment systems $AL2_1$ to $AL2_4$. In parallel with the Sec-BCHK (interval), main controller 20 gives the command and makes a drive system of an unload arm (not shown) unload wafer W on wafer stage WST that stops at unloading position UP, and also drives wafer stage WST in the +X direction to move it to loading position LP with a vertical movement pin CT (not shown in FIG. 21, refer to FIG. 22), which has been driven upward when performing the unloading, kept upward a predetermined amount.

Next, as is shown in FIG. 23, main controller 20 moves measurement stage MST to an optimal waiting position (hereinafter, referred to as an "optimal scrum waiting position") used to shift a state of measurement stage MST from a state of being away from wafer stage WST to the contact state (or proximity state) with wafer stage WST described previously. In parallel with this operation, main controller 20 gives the command and makes a drive system of a load arm (not shown) load new wafer W onto wafer table WTB. In this case, since the state where vertical movement pin CT is raised upward a predetermined amount is maintained, the wafer loading can be performed in a shorter period of time, compared with the case where vertical movement pin CT is driven downward to be housed inside the wafer holder. Incidentally, FIG. 23 shows the state where wafer W is loaded on wafer table WTB.

In the embodiment, the foregoing optimal scrum waiting position of measurement stage MST is appropriately set in accordance with the Y-coordinates of the alignment marks arranged in the alignment shot areas on the wafer. Further, in the embodiment, the optimal scrum waiting position is set so that the shift to the contact state (or proximity state) described above can be performed at a position where wafer stage WST stops for the wafer alignment.

Figure 24:
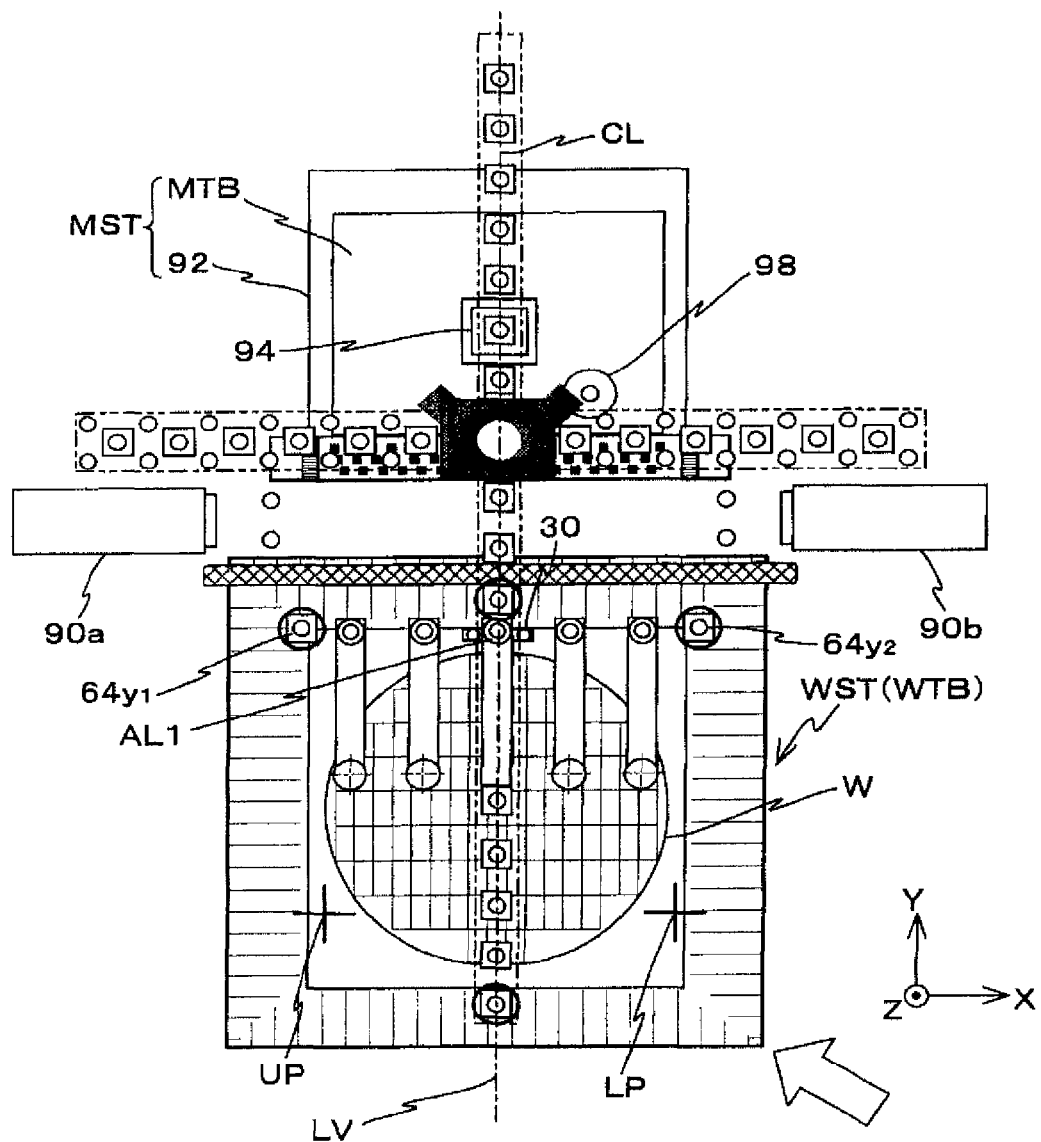
FIG. 24 is a view showing a state of both stages when the wafer stage has moved to a position where the Pri-BCHK former process is performed while the measurement stage is waiting at the optimal scrum waiting position.

Next, as is shown in FIG. 24, main controller 20 moves wafer stage WST from loading position LP to a position with which the position of fiducial mark FM on measurement plate 30 is set within the field (detection area) of primary alignment system AL1 (i.e. the position where the former process of baseline measurement of the primary alignment system (Pri-BCHK) is performed). In the middle of the movement, main controller 20 switches control of the position within the XY plane of wafer table WTB from the control based on the measurement value of encoder 70B regarding the X-axis direction described above and the measurement values of Y interferometer 16 and Z interferometers 43A and 43B regarding the Y-axis direction and the θz rotation, to the control of the position within the XY plane based on the measurement values of at least three encoders, which are at least one of two X heads 66 indicated by being circled in FIG. 24 that face X scales 39X₁ and 39X₂ (encoders 70B and 70D) and two Y heads $64y_2$ and $64y_1$ indicated by being circled in FIG. 24 that face Y scales $39Y_1$ and $39Y_2$ (encoders 70A and 70C), and based on stage-position-attributable-error correction information of each encoder (correction information computed in the above-described equations (10) and (11)) in accordance with the pitching amount or the rolling amount, the yawing amount, and the Z-position of wafer stage WST that are measured by interferometer system 118, and based on correction information of grating pitch and correction information of grating lines of each scale.

Then, main controller 20 performs the Pri-BCHK former process in which fiducial mark FM is detected using primary alignment system AL1. At this point in time, measurement stage MST is waiting at the optimal scrum waiting position described above.

Next, main controller 20 starts movement of wafer stage WST in the +Y direction toward a position where the alignment marks arranged in the three first alignment shot areas are detected, while controlling the position of wafer stage WST based on the measurement values of at least three encoders and each of the correction information described above.

Figure 25:
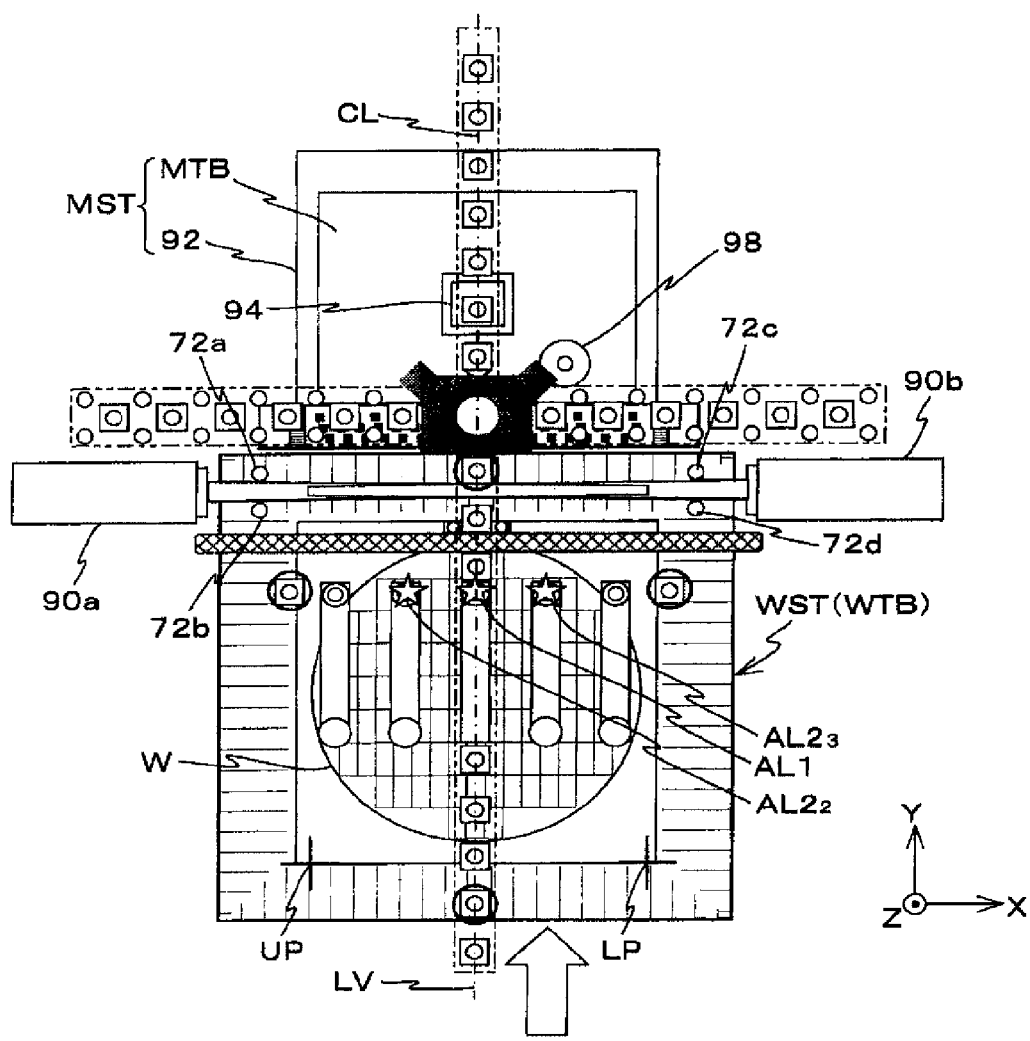
FIG. 25 is a view showing a state of the wafer stage and the measurement stage when alignment marks arranged in three first alignment shot areas are being simultaneously detected using alignment systems AL1, $AL2_2$ and $AL2_3$.

Then, when wafer stage WST reaches the position shown in FIG. 25, main controller 20 stops wafer stage WST. Prior to this operation, main controller 20 activates (turns ON) Z sensors 72a to 72d and measures the Z-position and the inclination (the θy rotation and the θx rotation) of wafer table WTB at the point in time when Z sensors 72a to 72d face wafer table WTB, or before that point in time.

After the stop of wafer stage WST described above, main controller 20 almost simultaneously and individually detects the alignment marks arranged in the three first alignment shot areas (refer to star-shaped marks in FIG. 25) using primary alignment system AL1 and secondary alignment systems $AL2_2$ and $AL2_3$, and links the detection results of three alignment systems AL1, $AL2_2$ and $AL2_3$ and the measurement values of at least three encoders described above at the time of the detection (the measurement values after correction by each of the correction information), and stores them in an internal memory.

As is described above, in the embodiment, the shift to the contact state (or proximity state) of measurement stage MST and wafer stage WST is completed at the position where detection of the alignment marks in the first alignment shot areas is performed, and from the position, the movement in the +Y direction (step movement toward a position where the alignment marks arranged in the five second alignment shot areas are detected) of both stages WST and MST in the contact state (or proximity state) is started by main controller 20. Prior to the start of movement in the +Y direction of both stages WST and MST, as is shown in FIG. 25, main controller 20 starts irradiation of detection beams from irradiation system 90a of the multipoint AF system (90a, 90b) toward wafer table WTB. With this operation, the detection area of the multipoint AF system is formed on wafer table WTB.

Figure 26:
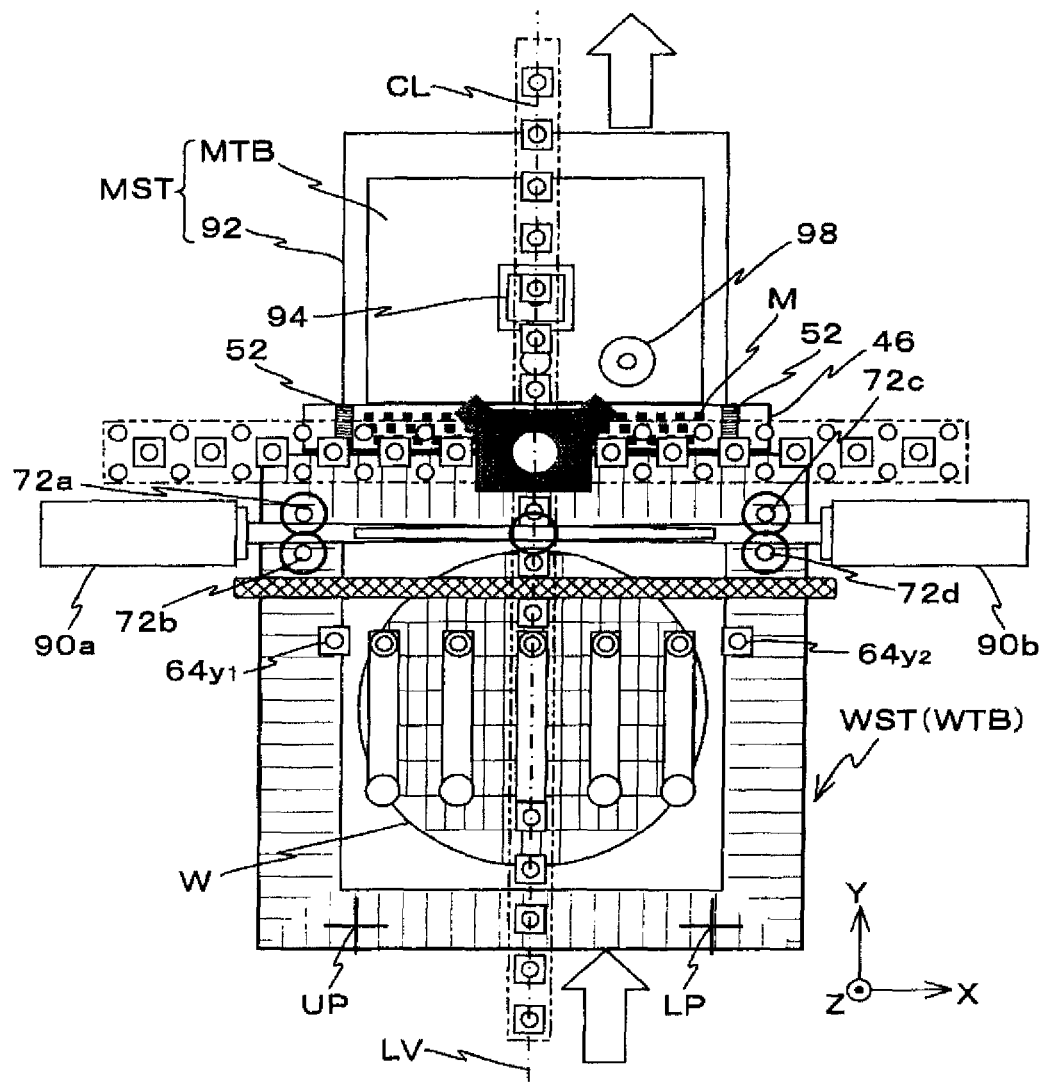
FIG. 26 is a view showing a state of the wafer stage and the measurement stage when the focus calibration former process is being performed.

Then, during the movement of both stages WST and MST in the +Y direction, when both stages WST and MST reach the position shown in FIG. 26, main controller 20 performs the focus calibration former process, and obtains a relation between the measurement values of Z sensors 72a, 72b, 72c and 72d (surface position information at the end portions on one side and the other side in the X-axis direction of wafer table WTB) and the detection result (surface position information) at the detection point (the detection point located in the center or in the vicinity thereof, out of a plurality of detection points) on the measurement plate 30 surface by the multipoint AF system (90a, 90b) in a state where a straight line (centerline) in the Y-axis direction passing through the center of wafer table WTB (which substantially coincides with the center of wafer W) coincides with straight line LV. At this point in time, liquid immersion area 14 is located near the boundary between CD bar 46 and wafer table WTB. That is, liquid immersion area 14 is about to be delivered from CD bar 46 to wafer table WTB.

Figure 27:
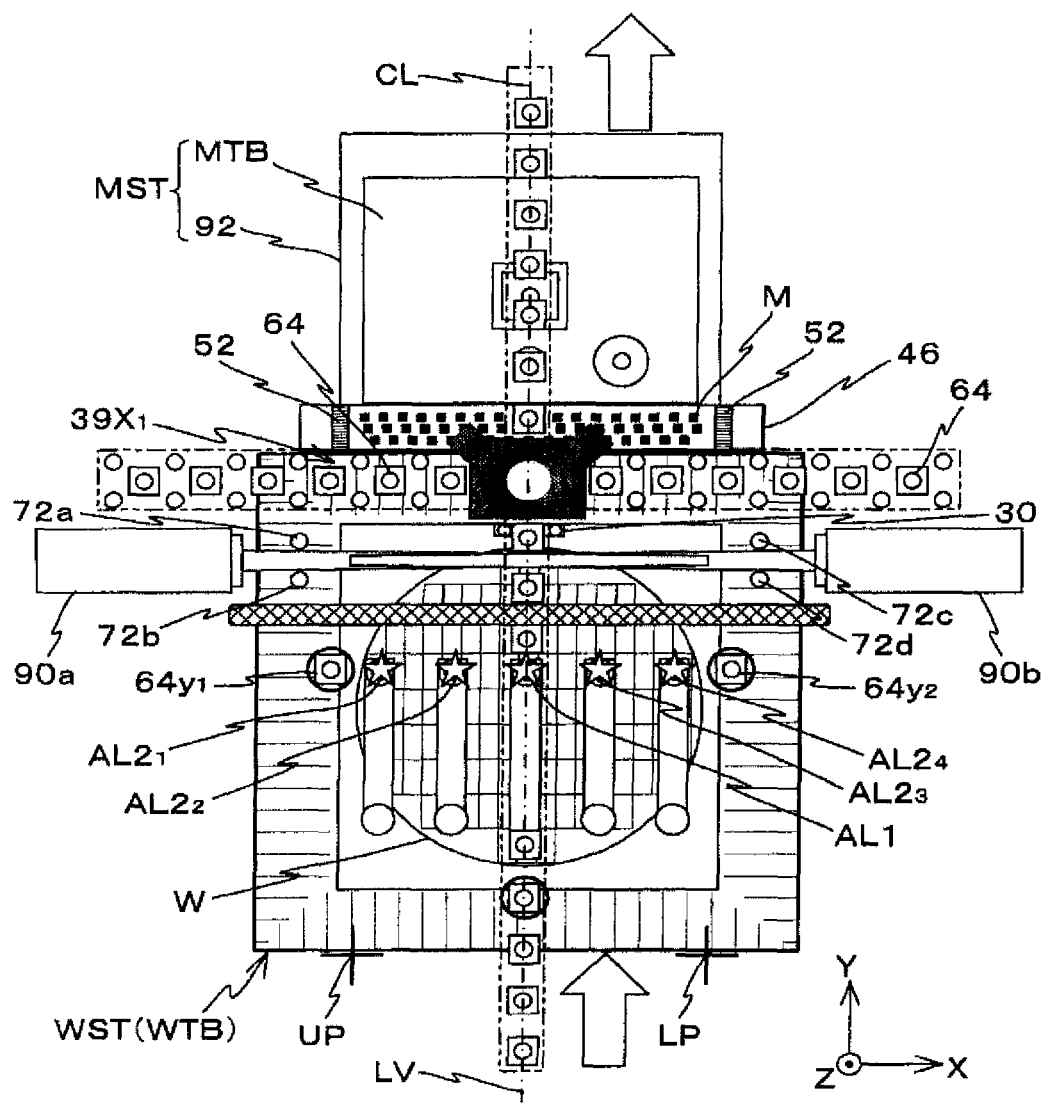
FIG. 27 is a view showing a state of the wafer stage and the measurement stage when alignment marks arranged in five second alignment shot areas are being simultaneously detected using alignment systems AL1 and $AL2_1$ to $AL2_4$.

Then, when both stages WST and MST further move in the +Y direction while keeping their contact state (or proximity state) and reach the position shown in FIG. 27, main controller 20 almost simultaneously and individually detects the alignment marks arranged in the five second alignment shot areas (refer to star-shaped marks in FIG. 27) using five alignment systems $AL_1$ and $AL2_1$ to $AL2_4$, links the detection results of five alignment systems $AL_1$ and $AL2_1$ to $AL2_4$ and the measurement values of three encoders 70A, 70C and 70D at the time of the detection (the measurement values after correction by each of the correction information), and stores them in the internal memory. At this point in time, since there is no X head that faces X scale $39X_1$ and is located on straight line LV in the Y-axis direction that passes through the optical axis of projection optical system PL, main controller 20 controls the position within the XY plane of wafer table WTB based on the measurement values of X head 66 facing X scale $39X_2$ (X linear encoder 70D) and Y linear encoders 70A and 70C.

As is described above, in the embodiment, eight pieces in total of position information (two-dimensional position information) of alignment marks can be detected at the point in time when detection of the alignment marks in the second alignment shot areas ends. Then, at this stage, main controller 20 obtains the scaling (shot magnification) of wafer W by, for example, performing a statistical computation, which is disclosed in, for example, Kokai (Japanese Unexamined Patent Application Publication) No. 61-044429 (the corresponding U.S. Pat. No. 4,780,617) and the like, using the position information, and based on the computed shot magnification, main controller 20 may also adjust optical characteristics of projection optical system PL, for example, the projection magnification by controlling an adjustment unit 68 (refer to FIG. 6). Adjustment unit 68 adjusts optical characteristics of projection optical system PL by, for example, driving a specific movable lens constituting projection optical system PL or changing the pressure of gas inside the airtight room that is formed between specific lenses constituting projection optical system PL, or the like.

Further, after the simultaneous detection of the alignment marks arranged in the five second alignment shot areas ends, main controller 20 starts again movement in the +Y direction of both stages WST and MST in the contact state (or proximity state), and at the same time, starts the focus mapping in which Z sensors 72a to 72d and the multipoint AF system (90a, 90b) are simultaneously used, as is shown in FIG. 27.

Figure 28:
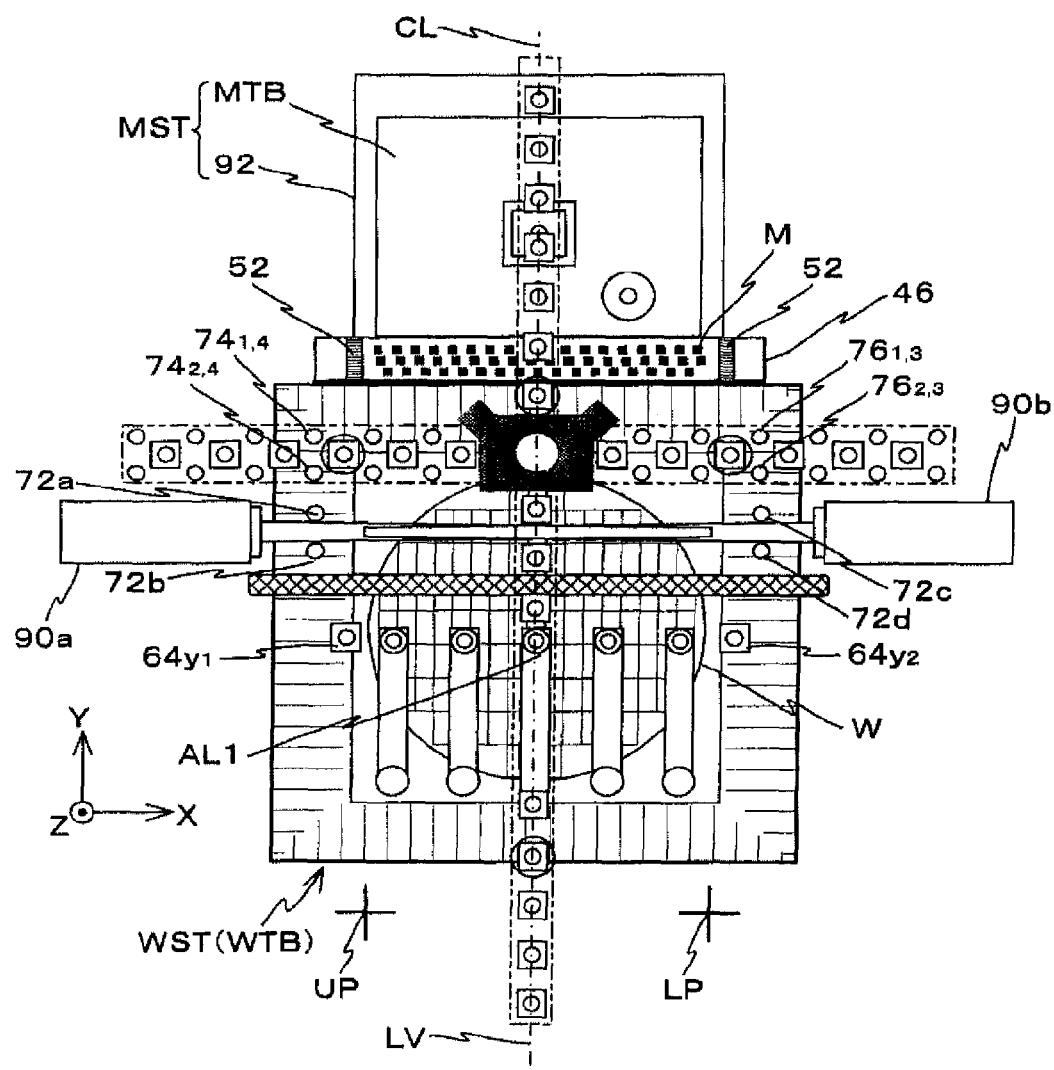
FIG. 28 is a view showing a state of the wafer stage and the measurement stage when at least one of the Pri-BCHK latter process and the focus calibration latter process is being performed.

Then, when both stages WST and MST reach the position with which measurement plate 30 is located directly below projection optical system PL shown in FIG. 28, main controller 20 performs the Pri-BCHK latter process and the focus calibration latter process. Herein, the Pri-BCHK latter process means the process in which projected images (aerial images) of a pair of measurement marks on reticle R that are projected by projection optical system PL are measured using aerial image measuring unit 45 described above that has aerial image measurement slit patterns SL formed at measurement plate 30, and the measurement results (aerial image intensity in accordance with the XY-position of wafer table WTB) are stored in the internal memory. In this process, similarly to the method disclosed in the U.S. Patent Application Publication No. 2002/0041377 described earlier and the like, the projected images of a pair of measurement marks are measured in the aerial image measurement operation by a slit-scan method using aerial image measurement slit patterns SL in pairs. Further, the focus calibration latter process means the process in which, as is shown in FIG. 28, while controlling the position in the optical axis direction of projection optical system PL (Z-position) of measurement plate 30 (wafer table WTB) based on surface position information of wafer table WTB measured by Z sensors 72a, 72b, 72c and 72d, main controller 20 measures the aerial images of the measurement marks formed on the mark plate (not shown) on reticle R or reticle stage RST, and based on the measurement results, measures the best focus position of projection optical system PL. The measurement operation of projected images of the measurement marks is disclosed in, for example, the pamphlet of International Publication No. WO 05/124834 and the like. Main controller 20 loads the measurement values of Z sensors $74_{1,4}$, $74_{2,4}$, $76_{1,3}$ and $76_{2,3}$, synchronously with the loading of the output signal from aerial image measuring unit 45, while moving measurement plate 30 in the Z-axis direction. Then, main controller 20 stores the values of Z sensors $74_{1,4}$, $74_{2,4}$, $76_{1,3}$ and $76_{2,3}$ that correspond to the best focus position of projection optical system PL in a memory (not shown). Incidentally, the reason why the position in the optical axis direction of projection optical system PL (Z-position) of measurement plate 30 (wafer table WTB) is controlled using the surface position information measured by Z sensors 72a, 72b, 72c and 72d in the focus calibration latter process is that the focus calibration latter process is performed in the middle of the focus mapping described previously.

In this case, since liquid immersion area 14 is formed between projection optical system PL and measurement plate 30 (wafer table WTB), the above-described aerial image measurement is performed via projection optical system PL and water Lq. Further, because measurement plate 30 and the like are mounted at wafer stage WST (wafer table WTB) and the photodetection element and the like are mounted at measurement stage MST, the above-described aerial image measurement is performed while keeping the contact state (or proximity state) of wafer stage WST and measurement stage MST, as is shown in FIG. 28. With the measurement described above, the measurement values of Z sensors $74_{1,4}$, $74_{2,4}$, $76_{1,3}$ and $76_{2,3}$ (i.e. surface position information of wafer table WTB) in the state where a straight line (centerline) in the Y-axis direction passing through the center of wafer table WTB coincides with straight line LV, which corresponds to the best focus position of projection optical system PL, are obtained.

Then, main controller 20 computes the baseline of primary alignment system AL1 based on the result of the Pri-BCHK former process described earlier and the result of the Pri-BCHK latter process described earlier. Along with this operation, based on a relation between the measurement values of Z sensors 72a, 72b, 72c and 72d (surface position information of wafer table WTB) and the detection result (surface position information) at the detection points on the measurement plate 30 surface of the multipoint AF system (90a, 90b) that has been obtained in the focus calibration former process, and based on the measurement values of Z sensors $74_{1,4}$, $74_{2,4}$, $76_{1,3}$ and $76_{2,3}$ (i.e. surface position information of wafer table WTB) corresponding to the best focus position of projection optical system PL that have been obtained in the focus calibration latter process, main controller 20 obtains the offset at a representative detection point (in this case, a detection point located in the center or in the vicinity thereof, out of a plurality of detection points), of the multipoint AF system (90a, 90b) with respect to the best focus position of projection optical system PL, and adjusts the detection origin of the multipoint AF system, for example, in the optical method so that the offset becomes zero.

In this case, from the viewpoint of improving throughput, only one of the Pri-BCHK latter process and the focus calibration latter process may be performed, or the procedure may shift to the next process without performing both processes. As a matter of course, in the case the Pri-BCHK latter process is not performed, the Pri-BCHK former process does not need to be performed either. And, in this case, main controller 20 only has to move wafer stage WST from loading position LP to a position at which the alignment marks arranged in the first alignment shot areas AS are detected. Incidentally, in the case the Pri-BCHK process is not performed, the baseline, which was measured in the similar operation just before exposure of a wafer that is previous to wafer W subject to exposure, is used. Further, in the case the focus calibration latter process is not performed, the best focus position of projection optical system PL that was measured just before exposure of a previous wafer, similar to the case of the baseline.

Incidentally, in the state of FIG. 28, the focus mapping described above is being continued.

Figure 29:
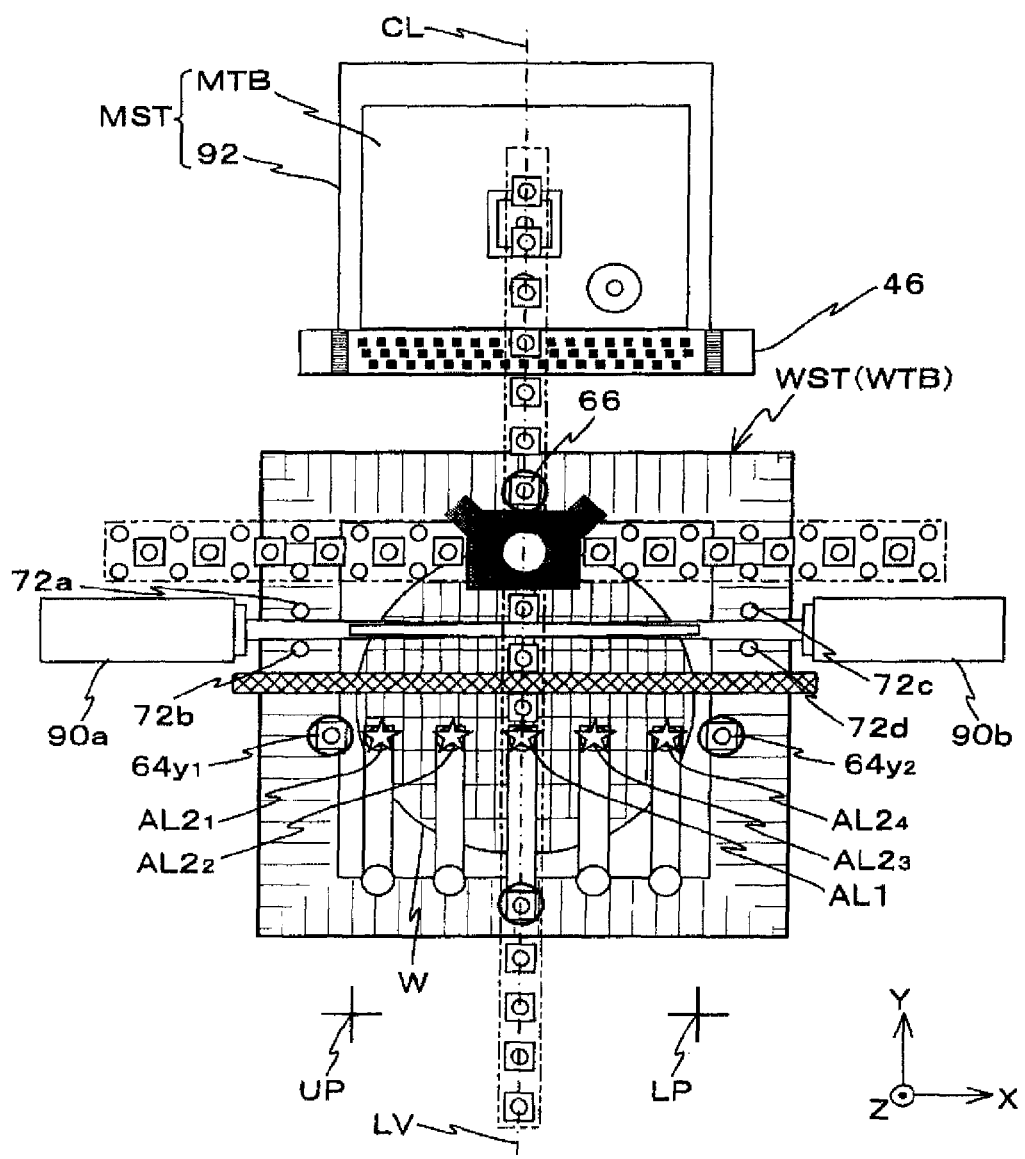
FIG. 29 is a view showing a state of the wafer stage and the measurement stage when alignment marks arranged in five third alignment shot areas are being simultaneously detected using alignment systems AL1 and $AL2_1$ to $AL2_4$.

When wafer stage WST reaches the position shown in FIG. 29 by movement in the +Y direction of both stages WST and MST in the contact state (or proximity state) described above after a predetermined period of time, main controller 20 stops wafer stage WST at that position, and also continues the movement of measurement stage MST in the +Y direction without stopping it. Then, main controller 20 almost simultaneously and individually detects the alignment marks arranged in the five third alignment shot areas (refer to star-shaped marks in FIG. 29) using five alignment systems AL1 and $AL2_1$ to $AL2_4$, links the detection results of five alignment systems AL1 and $AL2_1$ and $AL2_4$ and the measurement values of at least three encoders out of the four encoders at the time of the detection (the measurement values after correction by each of the correction information) and stores them in the internal memory. At this point in time, the focus mapping is being continued.

On the other hand, after a predetermined period of time from the stop of wafer stage WST described above, the state of measurement stage MST and wafer stage WST shifts from the contact state (or proximity state) to the separation state. After the shift to the separation state, when measurement stage MST reaches an exposure start waiting position where measurement stage MST waits until exposure is started, main controller 20 stops measurement stage MST at the position.

Next, main controller 20 starts movement of wafer stage WST in the +Y direction toward a position at which the alignment marks arranged in three fourth alignment shot areas are detected. At this point in time, the focus mapping is being continued. Meanwhile, measurement stage MST is waiting at the exposure start waiting position described above.

Figure 30:
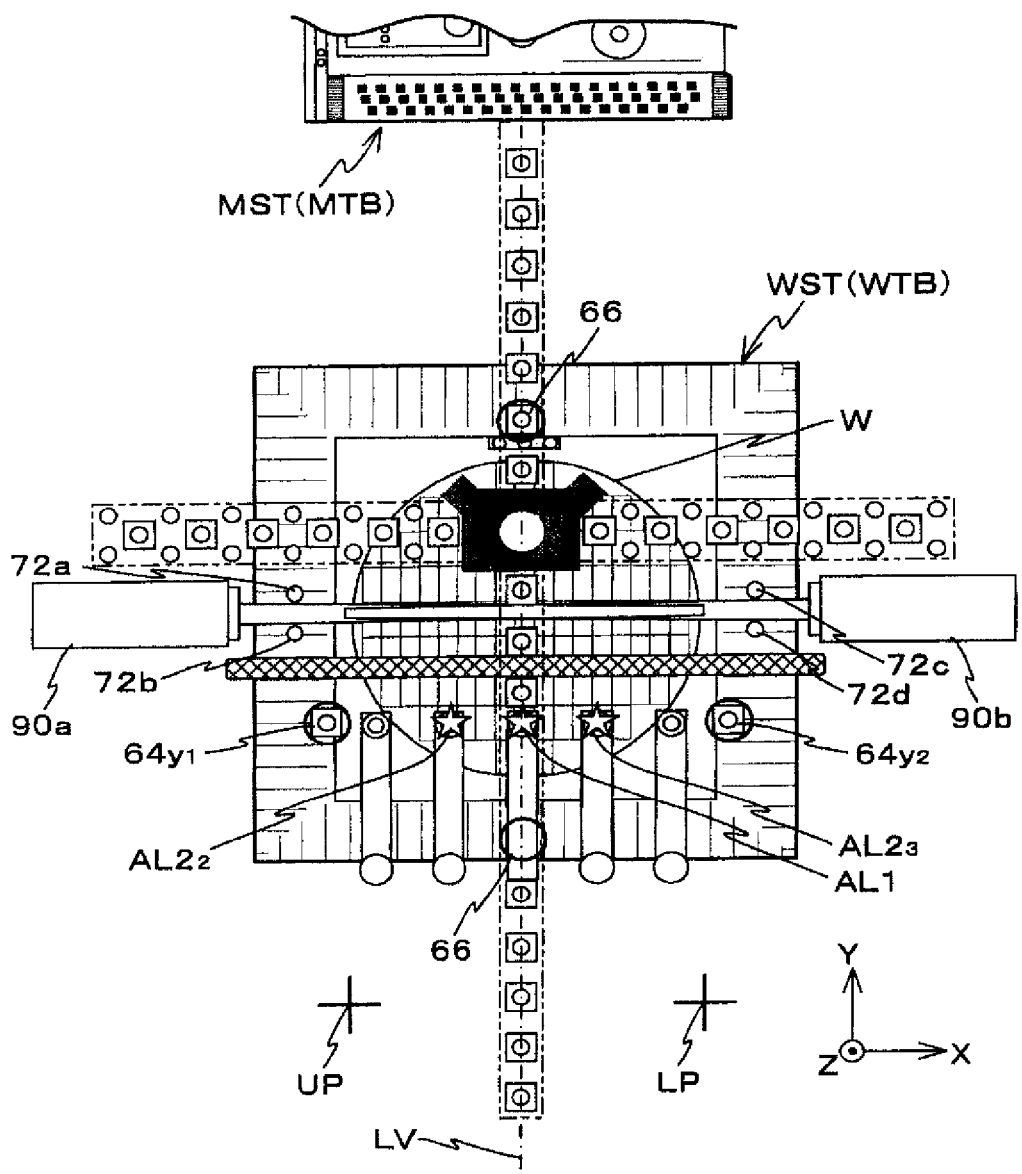
FIG. 30 is a view showing a state of the wafer stage and the measurement stage when alignment marks arranged in three fourth alignment shot areas are being simultaneously detected using alignment systems AL1, AL2$_2$ and AL2$_3$.

Then, when wafer stage WST reaches the position shown in FIG. 30, main controller 20 immediately stops wafer stage WST, and almost simultaneously and individually detects the alignment marks arranged in the three fourth alignment shot areas on wafer W (refer to star-shaped marks in FIG. 30) using primary alignment system AL1 and secondary alignment systems $AL2_2$ and $AL2_3$, links the detection results of three alignment systems AL1, $AL2_2$ and $AL2_3$ and the measurement values of at least three encoders out of the four encoders at the time of the detection (the measurement values after correction by each of the correction information), and stores them in the internal memory. Also at this point in time, the focus mapping is being continued, and measurement stage MST is still waiting at the exposure start waiting position. Then, main controller 20 computes array information (coordinate values) of all the shot areas on wafer W in a coordinate system that is set by the measurement axes of the four encoders (e.g. the XY coordinate system assuming the center of wafer table WTB as its origin), for example, by the EGA method disclosed in, for example, the U.S. Pat. No. 4,780,617 and the like, using the detection results of 16 alignment marks in total obtained as is described above and the corresponding measurement values of the encoders (measurement values after correction by each of the correction information).

Figure 31:
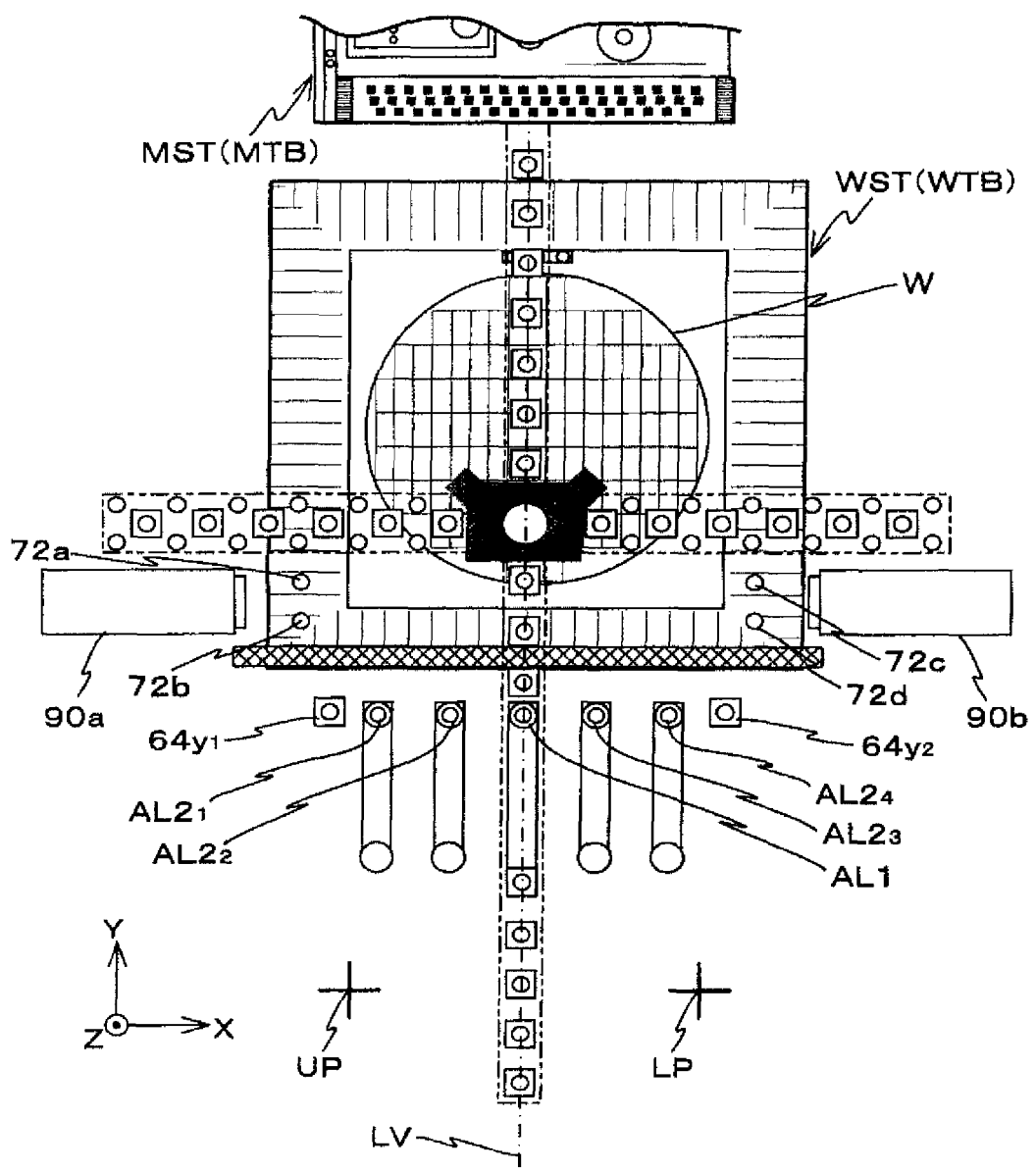
FIG. 31 is a view showing a state of the wafer stage and the measurement stage when the focus mapping has been finished.

Next, main controller 20 continues the focus mapping while moving wafer stage WST in the +Y direction again. Then, when the detection beam from the multipoint AF system (90*a*, 90*b*) begins to miss the wafer W surface, as is shown in FIG. 31, main controller 20 ends the focus mapping. After that, based on the result of the foregoing wafer alignment (EGA) performed beforehand, the latest baselines of five alignment systems AL1 and AL2$_1$ to AL2$_4$, and the like, main controller 20 performs exposure by a step-and-scan method in a liquid immersion exposure method and sequentially transfers a reticle pattern on a plurality of shot areas on wafer W. Afterwards, the similar operations are repeatedly performed in order to expose the remaining wafers within the lot.

As is described above in detail, according to exposure apparatus 100 of the embodiment, in the case wafer stage WST is moved in a predetermined direction, for example, in the Y-axis direction when wafer alignment, exposure or the like is performed, wafer stage WST is driven in the Y-axis direction based on measurement information of the encoder system, position information (including inclination information, such as rotation information in the θx direction) of wafer stage WST in a direction different from the Y-axis direction, and characteristic information of the scales (such as the flatness of the grating surface and/or a grating formation error). That is, wafer stage WST is driven so that measurement errors of the encoder system (encoders 70A and 70C), which occur due to the displacement (including inclination) of wafer stage WST in a different direction from the Y-axis direction and due to the scale, are compensated. In the embodiment, main controller 20 drives wafer stage WST in the Y-axis direction, based on the measurement values of encoders 70A and 70C that measure position information of wafer stage WST in the Y-axis direction, on stage-position-attributable-error correction information (correction information computed in the equation (10) described above) in accordance with position information of wafer stage WST in a direction (non-measurement direction) different from the Y-axis direction at the time of the measurement, for example, in accordance with position information of wafer stage WST in the θx direction, the θz direction and the Z-axis direction that are measured by Y interferometer 16 and Z interferometers 43A and 43B of interferometer system 118, on correction information of grating pitch of the Y scales (which is correction information in which the unevenness (flatness) of the Y scales is taken into consideration), and on correction information of warp of grating lines 38 of the Y scales. In this manner, based on the measurement values of encoders 70A and 70C, whose measurement errors caused by the relative displacement of Y scale 39Y$_1$ or 39Y$_2$ and Y head 64 in the non-measurement direction and caused by grating pitch of Y scale 39Y$_1$ or 39Y$_2$ and warp of grating lines 38 have been corrected by the respective correction information, stage drive system 124 is controlled and wafer stage WST is driven in the Y-axis direction.

In this case, the measurement values (count values) of encoders 70A and 70C are the same as the results obtained when measuring an ideal grating (diffraction grating) by an ideal encoder (head). Herein, the ideal grating (diffraction grating) is the one whose surface is parallel to the moving plane (XY plane) of the stage and also which is a complete plane, and the pitch direction of the grating is parallel to a beam of an interferometer and the distances between grating lines are completely equal to one another. The ideal encoder (head) is the one whose optical axis is perpendicular to the moving plane (XY plane) of the stage and also whose count values do not change due to the Z-displacement, leveling and yawing.

Further, in the case wafer stage WST is moved in the X-axis direction, wafer wage WST is driven in the X-axis direction based on measurement information of the encoder system, position information of wafer stage WST in a different direction from the X-axis direction (including inclination information, and for example, rotation information in the θy direction), and characteristic information of the scales (such as the flatness of the grating surface and/or a grating formation error). That is, wafer stage WST is driven so that measurement errors of the encoder system (encoders 70B and 70D), which occur due to the displacement (including inclination) of wafer stage WST in a different direction from the X-axis direction, are compensated. In the embodiment, main controller 20 drives wafer stage WST in the X-axis direction, based on the measurement values of encoders 70B and 70D that measure position information of wafer stage WST in the X-axis direction, on stage-position-attributable-error correction information (correction information computed in the equation (11) described above) in accordance with position information of wafer stage WST in a direction (non-measurement direction) different from the X-axis direction at the time of the measurement, for example, in accordance with position information of wafer stage WST in the θy direction, the θz direction and the Z-axis direction that are measured by Z interferometers 43A and 43B of interferometer system 118, on correction information of grating pitch of the X scales (which is correction information in which the unevenness (flatness) of the scales is taken into consideration), and on correction information of warp of grating lines 37 of the X scales. In this manner, based on the measurement values of encoders 70B and 70D, whose measurement errors caused by the relative displacement of X scale 39X$_1$ or 39X$_2$ and X head 66 in the non-measurement direction and caused by grating pitch of X scale 39X$_1$ or 39X$_2$ and warp of grating lines 37 have been corrected by the respective correction information, stage drive system 124 is controlled and wafer stage WST is driven in the X-axis direction. In this case, the count values of encoders 70B and 70D are the same as the results obtained when measuring an ideal grating (diffraction grating) by an ideal encoder (head).

Accordingly, wafer stage WST can be driven in a desired direction with high accuracy using the encoders, without being affected by the relative motion between the head and the scale in directions other than a direction to be measured (measurement direction), without being affected by the unevenness of the scale, and without being affected by the grating pitch and grating warp of the scale.

Further, according to exposure apparatus 100 of the embodiment, for the relative movement of wafer W and illumination light IL, which is irradiated from illumination system 10 to wafer W via reticle R, projection optical system PL and water Lq, main controller 20 accurately drives wafer stage WST that mounts wafer W, based on the measurement values of each of the encoders described above, on stageposition-attributable-error correction information of each of the encoders in accordance with position information of the wafer stage in the non-measurement direction at the time of the measurement, and on correction information of grating pitch and correction information of grating lines of each of the scales. Accordingly, a pattern of reticle R can be formed on the wafer with high accuracy by scanning exposure in the liquid immersion exposure method.

Further, according to the embodiment, when acquiring stage-position-attributable-error correction information of the measurement value of the encoder, main controller 20 changes the attitude of wafer stage WST to a plurality of different attitudes, and moves wafer stage WST in the Z-axis direction in a predetermined stroke range while irradiating a detection light from head 64 or 66 of the encoder to a specific area of scale $39Y_1$, $39Y_2$, $39X_1$ or $39X_2$ in a state where the attitude of wafer stage WST is maintained based on the measurement results of interferometer system 118 with respect to each attitude, and performs the sampling of the measurement results of the encoder during the movement. With this operation, with respect to each attitude, variation information of the measurement values of the encoder in accordance with the position in a direction (the Z-axis direction) orthogonal to the moving plane of wafer stage WST (e.g. the error characteristic curve as shown in the graph of FIG. 12) is obtained.

Then, main controller 20 obtains correction information of the measurement value of the encoder in accordance with position information of wafer stage WST in the non-measurement direction, by performing a predetermined computation based on the sampling results, that is, the variation information of the measurement values of the encoder in accordance with the position of wafer stage WST in the Z-axis direction with respect to each attitude. Accordingly, stage-position-attributable-error correction information for correcting the measurement error of the encoder caused by the relative change of the head and the scale in the non-measurement direction can be decided in the simple method.

Further, in the embodiment, in the case the correction information is decided with respect to a plurality of heads that constitute the same head unit, for example, a plurality of Y heads 64 that constitute head unit 62A, a detection light is irradiated from each Y head 64 to the same specific area of corresponding Y scale $39Y_1$ and performs the above-described sampling of measurement results of the encoder, and then based on the sampling results, the stage-position-attributable-error correction information of each encoder that is constituted by each Y head 64 and Y scale $39Y_1$ is decided. Therefore, as a consequence, a geometric error that occurs due to gradient of the head is also corrected. In other words, when obtaining the correction information for a plurality of encoders that correspond to the same scale, main controller 20 obtains correction information of a subject encoder, taking into consideration a geometric error that occurs due to gradient of the head of the subject encoder when wafer stage WST is moved in the Z-axis direction. Accordingly, in the embodiment, a cosine error that is caused by different gradient angles of a plurality of heads does not occur. Further, in the case a measurement error occurs in the encoder due to, for example, optical characteristics of the head (such as telecentricity) even if gradient of Y head 64 does not occur, occurrence of the measurement error, occurrence of the measurement error can be prevented, and therefore reduction in position control accuracy of wafer stage WST can be prevented, by similarly obtaining the correction information. That is, in the embodiment, wafer stage WST is driven so that the measurement error of the encoder system occurring due to the head unit (hereinafter, also referred to as the head-attributable error) is compensated. Incidentally, based on characteristics information of the head unit (e.g. including gradient of the head, and/or optical characteristics), for example, correction information of the measurement values of the encoder system may be computed. Further, in the embodiment, the stage-position-attributable error described previously and the head-attributable error described above may be individually corrected.

Second Embodiment

Next, a second embodiment of the present invention will be described with reference to FIGS. 32 to 34. The second embodiment is different from the first embodiment described above, only in the operation performed when correction information of grating pitch and correction information of warp of grating lines of the scales are acquired, and the configuration of the apparatus and other operations are similar to those of the first embodiment. Accordingly, the different point will be described below.

Herein, an acquisition operation of acquiring correction information of grating pitch of the Y scale and correction information of deformation of grating lines (warp of grating lines) of the X scale will be described. Reflection surface 17b is assumed to be an ideal plane, for the sake of simplification of the description.

First of all, main controller 20 reads the mathematical function $z=f_1(y)$ that denotes the unevenness of Y scale $39Y_1$, the mathematical function $z=f_2(y)$ that denotes the unevenness of Y scale $39Y_2$, the mathematical function $z=g_1(x)$ that denotes the unevenness of X scale $39X_1$, and the mathematical function $z=g_2(x)$ that denotes the unevenness of X scale $39X_2$, which have been acquired in advance and stored in memory 34, into the internal memory.

Figure 32:
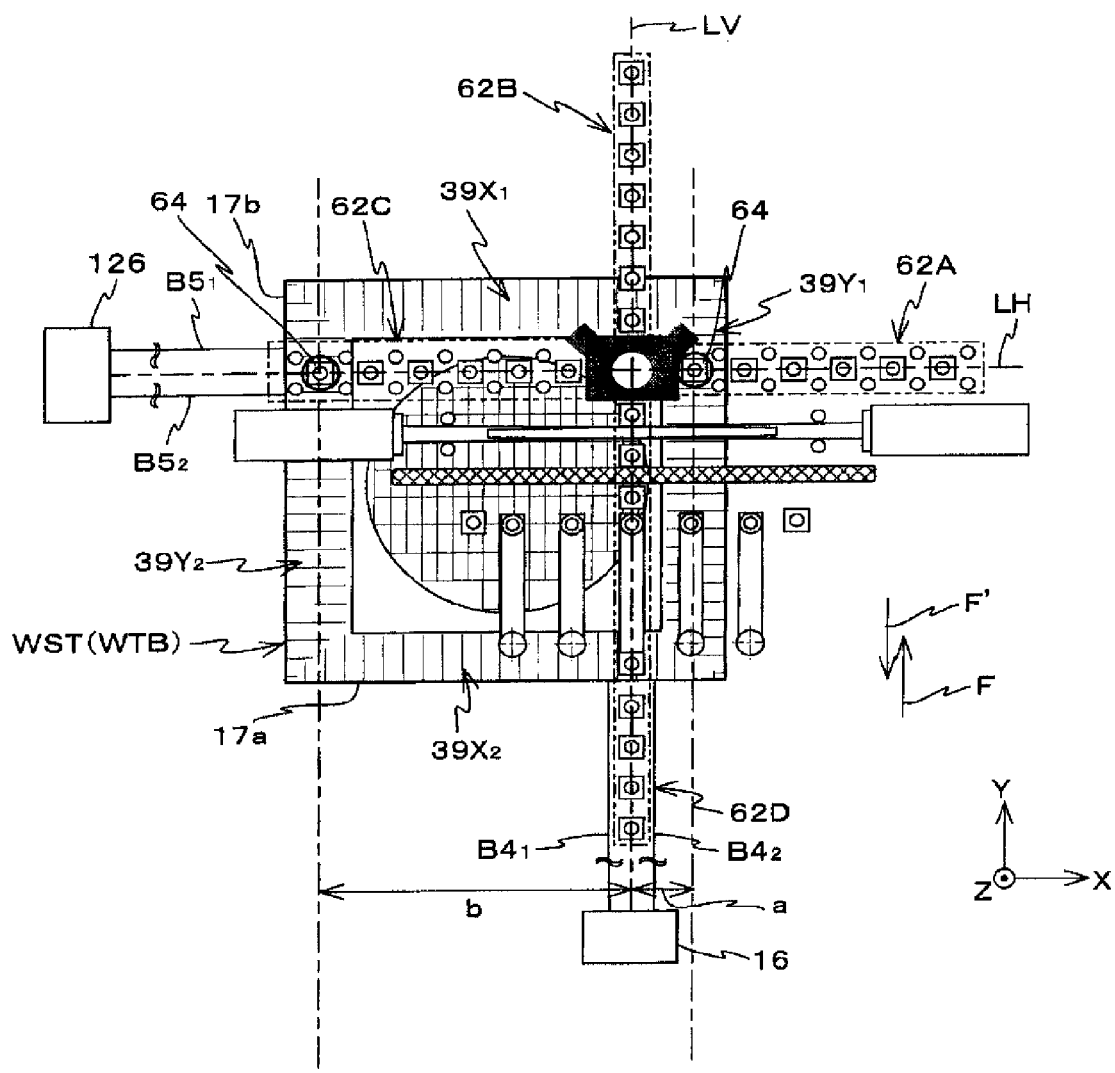
FIG. 32 is a view (No. 1) used to explain an acquisition operation of acquiring correction information of grating pitch of a Y scale in an exposure apparatus of a second embodiment.

Next, main controller 20 moves wafer stage WST, for example, in the +Y direction indicated by an arrow F in FIG. 32, for example, within the effective stroke range, with the measurement value of X interferometer 126 being fixed to a predetermined value, in a state where all the pitching mount, the rolling amount and the yawing amount are maintained at zero based on the measurement values of Y interferometer 16 and Z interferometers 43A and 43B. During the movement, while correcting the measurement value of Y head 64 indicated by being circled in FIG. 32 that faces Y scale $39Y_1$ and is located at a distance "a" in the +X direction from straight line LV (Y linear encoder 70A) and the measurement value of Y head 64 indicated by being circled in FIG. 32 that faces Y scale $39Y_2$ and is located at a distance "b" in the −X direction from straight line LV (Y linear encoder 70C) using the mathematical functions $z=f_1(y)$ and $z=f_2(y)$ respectively, main controller 20 loads the measurement values after the correction and the measurement values of Y interferometer 16 (to be more accurate, the measurement values of measurement beams $B4_1$ and $B4_2$) into the internal memory at predetermined sampling intervals.

Next, after moving wafer stage WST a predetermined distance in the +X direction based on the measurement value of X interferometer 126, main controller 20 stops wafer stage WST at a position (the position shown in FIG. 33) which wafer stage WST reaches after being moved a predetermined distance in the −Y direction indicated by an arrow F' in FIG. 32 based on the measurement value of Y interferometer 16.

Figure 33:
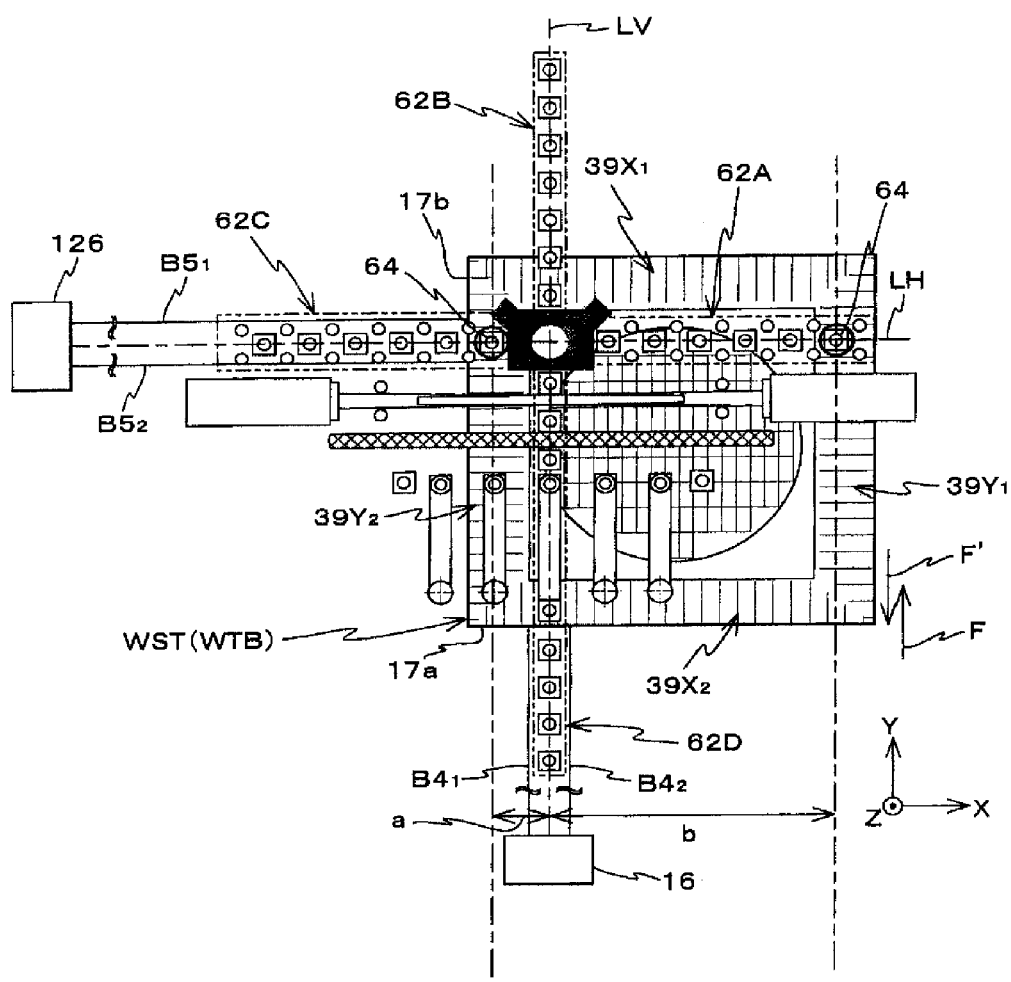
FIG. 33 is a view (No. 2) used to explain an acquisition operation of acquiring correction information of grating pitch of a Y scale in the exposure apparatus of the second embodiment.

Then, main controller 20 moves wafer stage WST, for example, in the +Y direction indicated by an arrow F in FIG. 33, for example, within the effective stroke range, with the measurement value of X interferometer 126 being fixed to a predetermined value, in a state where the pitching mount and the rolling amount are maintained at zero and the yawing amount is maintained at zero as much as possible based on the measurement values of Y interferometer 16 and Z interferometers 43A and 43B. During the movement, while correcting the measurement value of Y head 64 indicated by being circled in FIG. 33 that faces Y scale $39Y_1$ and is located at a distance "b" in the +X direction from straight line LV (Y linear encoder 70A) and the measurement value of Y head 64 indicated by being circled in FIG. 33 that faces Y scale $39Y_2$ and is located at a distance "a" in the −X direction from straight line LV (Y linear encoder 70C) using the mathematical functions $z=f_1(y)$ and $z=f_2(y)$ respectively, main controller 20 loads the measurement values after the correction and the measurement values of Y interferometer 16 (to be more accurate, the measurement values of measurement beams $B4_1$ and $B4_2$) into the internal memory at predetermined sampling intervals.

However, since the positions of Y heads 64 in the XY coordinate system are already known, correction information (e.g. correction map) of grating pitch of Y scales $39Y_1$ and $39Y_2$ can be independently obtained by setting up the simultaneous equation using the sampling values that have been obtained in the above-described two operations and solving the simultaneous equation.

Incidentally, in the usual case where reflection surface 17b is not an ideal plane, the unevenness (bending) of the reflection surface is measured and correction data of the bending is obtained in advance. Then, on the above-described movement of wafer stage WST in the +Y direction shown in FIGS. 32 and 33, wafer stage WST may accurately be moved in the Y-axis direction by moving wafer stage WST in the +Y direction while controlling the X-position of wafer stage WST based on the correction data instead of fixing the measurement value of X interferometer 126 to a predetermined value.

Figure 34:
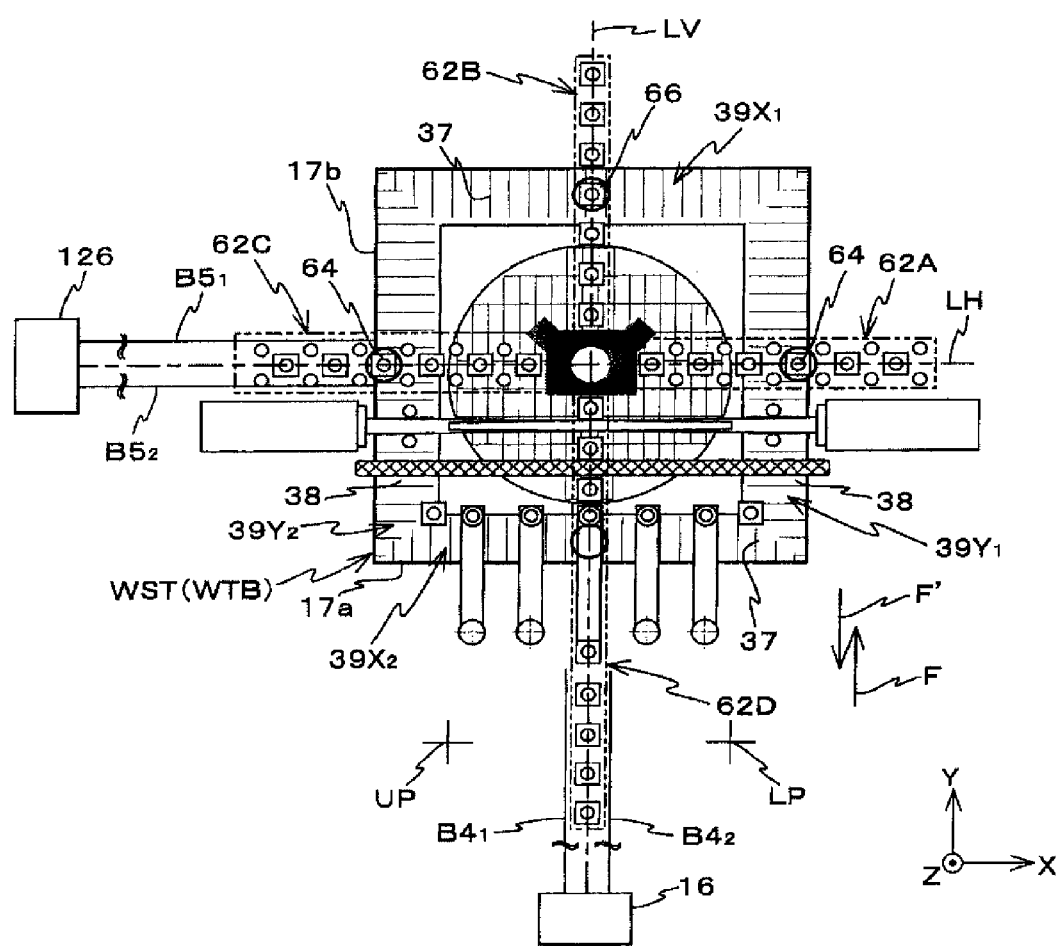
FIG. 34 is a view used to explain an acquisition operation of acquiring correction information of deformation of grating lines (warp of grating lines) of an X scale in the exposure apparatus of the second embodiment.

As is described above, after obtaining the correction information (e.g. correction map) of grating pitch of Y scales $39Y_1$ and $39Y_2$ respectively, main controller 20 moves wafer stage WST in the +Y direction as is shown in FIG. 34, in the similar procedures to those in the case of FIG. 32 or the like described above. In this case, as in the case of acquiring correction information (e.g. correction map) of grating pitch of Y scales $39Y_1$ and $39Y_2$, the measurement axes of X interferometer 126 and X heads 66 indicated by being circled in FIG. 34 that face X scales $39X_1$ and $39X_2$ respectively are not coaxial, and therefore, the influence of the apparent yawing amount of wafer stage WST that is measured by the interferometer due to air fluctuations is included in the measurement values of X heads 66 that face X scales $39X_1$ and $39X_2$ respectively (X encoders 70B and 70D), as an error (hereinafter, shortly referred to as a yawing-attributable error). In the second embodiment, however, the apparent yawing amount described above of wafer stage WST that is measured by the interferometer due to air fluctuations can be measured using a pair of Y heads 64 indicated by being circled in FIG. 34 that face Y scales $39Y_1$ and $39Y_2$ respectively (Y encoders 70A and 70C). That is, while correcting the count values of the pair of Y encoders 70A and 70C using the correction information of grating pitch of Y scales $39Y_1$ and $39Y_2$ that have been obtained in advance, main controller 20 can obtain the apparent yawing amount described above of wafer stage WST based on the count values after the correction of the pair of Y encoders 70A and 70C. Then, main controller 20 can correct the yawing-attributable error described above using the apparent yawing amount that has been obtained in the manner described above.

While correcting the yawing-attributable error as is described above during the movement of the wafer stage WST in the +Y direction, main controller 20 sequentially loads the count values (the measurement values of X linear encoders 70B and 70D), which are obtained from a plurality of X heads 66 of head units 62B and 62D that are sequentially placed facing X scales $39X_1$ and $39X_2$ according to the movement, into the internal memory at predetermined sampling intervals. Then, for the similar reason to the above-described reason, main controller 20 also obtains correction information of deformation (warp) of grating lines 37 that sequentially face the plurality of X heads 66, by performing statistical processing of, for example, averaging (or performing weighed averaging of) the count values loaded in the internal memory.

Further, also in the case of obtaining the correction information (e.g. correction map) of grating pitch of Y scales $39Y_1$ and $39Y_2$ and/or the correction information of deformation (warp) of grating lines 37 by driving wafer stage WST in the −Y direction indicated by arrow F' in FIGS. 32, 33, and 34 taking into consideration the so-called reciprocal difference, the process similar to the process described above should be performed.

Meanwhile, when acquiring the correction information of deformation of the grating lines (warp of the grating lines) of the Y scales and of the grating pitch of the X scales, main controller 20 performs the same process as in the case described above, with the X-axis direction and the Y-axis direction interchanged. Details on such processing will be omitted.

Since each scale (diffraction grating) has a width, the correction information of the grating pitch can be acquired, for example, by obtaining the correction information described above along three lines in the width direction, on the right, left, and in the center, and when the correction information of the grating line warp is acquired, a grating line can be representatively chosen and its warp can be measured. This seems to be preferable, from the viewpoint of accuracy and workability.

In the second embodiment, the other control operations of main controller 20 and the configuration of the apparatus are similar to those of the first embodiment described above.

According to the exposure apparatus related to the second embodiment described so far, the effects equivalent to those of the first embodiment described above can be obtained, and besides, since wafer stage WST does not always have to be moved at an extremely low speed when acquiring the correction information of grating pitch of the scales and/or the correction information of deformation of the grating lines (warp of the grating lines) of the scales, the acquisition operation of the correction information can be performed in a short period of time.

Incidentally, in each of the embodiments described above, correction information of grating pitch of the diffraction grating that a scale has is to be decided so that a measurement error of the encoder caused by the flatness of the scale is corrected. However, the present invention is not limited thereto, and wafer stage WST may also be driven in a measurement direction of an encoder based on information on the flatness of a scale and the measurement value of the encoder, independently of acquisition of the correction information of grating pitch of the diffraction grating that the scale has. That is, when driving wafer stage WST in the Y-axis direction or the X-axis direction, the measurement value of the Y encoder or the X encoder may also be corrected based on information on the flatness of the Y scale or the X-scale. In this case, as the scale-attributable error, the measurement error of the encoder that occurs due to the flatness of the scale is corrected. Further, for example, in the cases such as when the flatness of the scale is favorable, the measurement error of the encoder that occurs due to a grating formation error of the scale (e.g. including pitch error and/or deformation of grating lines or the like) may only be corrected as the scale-attributable error.

In this case, the flatness of the scale includes not only the unevenness but also the inclination of the surface of the scale. That is, even if the grating surface of the scale has the high flatness degree, in the case the scale itself inclines, a measurement error (scale-attributable error) of the encoder occurs due to the inclination. In each of the embodiments described above, such a scale-attributable error can also be corrected. Incidentally, the pitch error of the grating occurs due to not only the flatness (including inclination) of the scale but also the manufacturing error.

Further, in each of the embodiments described above, the case has been described where main controller 20 performs movement control of wafer stage WST in the Y-axis direction or the X-axis direction using Y linear encoders 70A and 70C or X linear encoders 70B and 70D while correcting the measurement values of the encoders that are obtained from the head units based on the correction information of grating pitch, the correction information of deformation (warp) of the grating lines, and the stage-position-attributable-error correction information described above, but the present invention is not limited thereto. For example, in the case the position of wafer stage WST is controlled using one Y head (or X head) and a single Y scale (or X scale), for example, correction of the stage-position-attributable error described above does not always have to be performed.

Further, if an error amount of grating pitch of a diffraction grating, which a scale has, that is caused by the flatness of the scale is remarkably larger than an error amount of grating pitch of the diffraction grating caused by other factors, correction information of grating pitch (e.g. correction map) does not need to be obtained in advance, and when driving wafer stage WST on exposure or the like, position information of wafer stage WST in a predetermined direction (the Y-axis direction or the X-axis direction) may be measured using the encoder, and based on the measurement value and information on the flatness of the scale, wafer stage WST may be driven in the predetermined direction. Further, the measurement value of the encoder may also be corrected using the stage-position-attributable-error correction information in accordance with position information of wafer stage WST in a non-measurement direction measured by interferometer system 118 on this driving.

Incidentally, in each of the embodiments described above, the stage-position-attributable error and the head-attributable error do not always have to be corrected simultaneously, but may be corrected individually.

Further, in each of the embodiments described above, the case has been described where the acquisition of unevenness information of each scale is performed using the corresponding encoder, but the present invention is not limited to thereto and the flatness (unevenness) of each scale may also be measured using another measurement unit that is separate from the encoder.

Incidentally, in each of the embodiments described above, for the sake of simplification of the description, main controller 20 is to control respective constituents of the exposure apparatus, such as the stage system, the interferometer system and the encoder system, but the present invention is not limited to thereto, and it goes without saying that at least part of the above-described control performed by main controller 20 may be shared and performed by a plurality of controllers. For example, a stage controller that performs the control of wafer stage WST and the like based on the measurement values of the encoder system, the Z sensors and the interferometer system may be arranged under the control of main controller 20. Further, the above-described control performed by main controller 20 does not always have to be realized by hardware, but it may be realized in software-wise by a computer program that sets an operation of main controller 20 or each of several controllers that share and perform the control as is described above.

Incidentally, the configuration and the placement of the encoder system, the interferometer system, the multipoint AF system and the Z sensors in each of the embodiments are merely examples, and it goes without saying that the present invention is not limited to them. For example, in each of the embodiments above, the case has been exemplified where a pair of Y scales $39Y_1$ and $39Y_2$ used for the Y-axis direction position measurement and a pair of X scales $39X_1$ and $39X_2$ used for the X-axis direction position measurement are arranged on wafer table WTB, and so as to correspond to them, a pair of head units 62A and 62C are placed on one side and the other side of the X-axis direction of projection optical system PL and a pair of head units 62B and 62D are placed on one side and the other side of the Y-axis direction of projection optical system PL. However, the present invention is not limited to this, and only one scale of at least either pair of Y scales $39Y_1$ and $39Y_2$ for Y-axis direction position measurement or X scales $39X_1$ and $39X_2$ for X-axis direction position measurement may be arranged alone, not in pairs on wafer table WTB, or only one head unit of at least either pair of head units 62A and 62C or head units 62B and 62D may be arranged. Further, the direction in which the scales are arranged and the direction in which the head units are arranged are not limited to orthogonal directions such as the X-axis direction and the Y-axis direction as in each of the embodiments above, but only have to be directions that intersect each other. Further, the periodic direction of the diffraction grating may be a direction orthogonal to (or intersecting) a longitudinal direction of each scale, and in this case, a plurality of heads of the corresponding head unit only have to be arranged in the direction orthogonal to the periodic direction of diffraction grating. Further, each head unit may have a plurality of heads that are densely arranged in a direction orthogonal to the periodic direction of the diffraction grating.

Further, in each of the embodiments above, the case has been exemplified where the encoder system is employed that has the configuration in which a grating section (the X scales and the Y scales) are arranged on the wafer table (wafer stage), and so as to face the scale section, the head units (the X heads and the Y heads) are placed outside the wafer stage. However, the present invention is not limited to such an encoder system, and an encoder system having the configuration in which encoder heads are arranged on a wafer stage and so as to face the encoder heads, two-dimensional gratings (or two-dimensionally placed one-dimensional grating sections) are placed outside the wafer stage may also be employed. In this case, when Z sensors are also placed on the upper surface of the wafer stage, the two-dimensional gratings (or two-dimensionally placed one-dimensional grating sections) may also be used as the reflection surfaces that reflect the measurement beams from the Z sensors. Also in the case the encoder system having such a configuration is employed, basically in the similar manner to that in each of the embodiments above, wafer stage WST can be driven in the measurement direction of the encoder based on the measurement value of the encoder and information on the flatness of the scale. With this operation, wafer stage WST can be driven in a desired direction with high accuracy using the encoder, without being affected by the unevenness of the scale.

Incidentally, in each of the embodiments above, rotation information in the θx direction (the pitching amount) of wafer stage WST is to be measured by interferometer system 118, but the pitching amount may also be obtained from, for example, the measurement values of a pair of Z sensors $74_{ij}$ or Z sensors $76_{pq}$. Or, for example, one or a pair of Z sensor (s) is/are arranged adjacent to each head of heads units 62B and 62D, similarly to head units 62A and 62C, and the pitching amount may also be obtained from the measurement values of the Z sensors that face X scales $39_1$ and $39X_2$ respectively. With this operation, position information of wafer stage WST in directions of six degrees of freedom, that is, the X-axis, Y-axis, Z-axis, θx, θy and θz directions can be measured using the encoders and the Z sensors, without using interferometer system 118. The above-described measurement of position information of wafer stage WST in directions of six degrees of freedom by the encoders and the Z sensors may be performed not only in the exposure operation, but also in the alignment operation and/or the focus mapping operation described earlier.

Further, in each of the embodiments above, the measurement values of the encoder system are to be corrected based on the correction information described earlier so that the measurement error of the encoder system, which occurs due to the displacement of wafer stage WST (relative displacement of the head and the scale) in a direction different from a predetermined direction in which wafer stage WST is driven, is compensated. However, the present invention is not limited thereto, and for example, a target position at which the position of wafer stage WST is set may be corrected based on the correction information described above, while driving wafer stage WST based on the measurement values of the encoder system. Or, in the exposure operation in particular, while driving wafer sage WST based on, for example, the measurement values of the encoder system, the position of reticle stage RST may be corrected based on the correction information described above.

Further, in each of the embodiments above, only wafer stage WST is to be driven based on the measurement values of the encoder system, for example, when exposure is performed, but for example, an encoder system that measures the position of reticle stage RST is additionally arranged and reticle stage RST may also be driven based on the measurement values of this encoder system and based on correction information according to position information of the reticle stage in the non-measurement direction that is measured by reticle interferometer 116.

Further, in each of the embodiments above, the case has been explained where one fixed primary alignment system and four movable secondary alignment systems are equipped, and alignment marks arranged in 16 alignment shot areas on the wafer are detected in the sequence that is proper for the five alignment systems. However, the secondary alignment systems do not have to be movable, and the number of secondary alignment systems may be any number. The point is that at least one alignment system that can detect alignment marks on a wafer only has to be arranged.

Incidentally, in each of the embodiments above, the exposure apparatus equipped with measurement stage MST separately from wafer stage WST, which is similar to the exposure apparatus that is disclosed in, for example, the pamphlet of International Publication No. WO 2005/074014 and the like, is described. The present invention is not limited to this type of exposure apparatus, but as is disclosed in, for example, Kokai (Japanese Unexamined Patent Application Publication) No. 10-214783 and the corresponding U.S. Pat. No. 6,341,007, and the pamphlet of International Publication No. WO 98/40791 and the corresponding U.S. Pat. No. 6,262,796, and the like, also in a twin-stage type exposure apparatus in which an exposure operation and a measurement operation (e.g. mark detection by an alignment system) can be executed substantially in parallel using two wafer stages, position control of each wafer stage can be performed using the encoder system described above (refer to FIG. 3 and the like). In this case, by appropriately setting the placement and the length of each head unit, position control of each wafer stage can be performed using the encoder system described above without any change, not only when the exposure operation is performed but also the measurement operation is performed. But, another head unit that can be used during the measurement operation may also be arranged separately from the head units described above (62A to 62D). For example, four head units that are placed in the cross arrangement assuming one or two alignment system (s) as its center are arranged, and position information of each wafer stage WST may also be measured using these head units and corresponding moving scales (62A to 62D) when the measurement operation is performed. In the twin-stage type exposure apparatus, at least two moving scales are arranged on each of two wafer stages, and when an exposure operation of a wafer mounted on one stage is finished, the other stage on which a next wafer whose mark detection and the like have been performed at a measurement position is to be mounted is placed at an exposure position, in order to replace the one stage. Further, the measurement operation performed in parallel with the exposure operation is not limited to mark detection of a wafer and the like by an alignment system, but detection of surface information (level difference information) of the wafer may also be performed instead of the mark detection or in combination with the mark detection.

Incidentally, in each of the embodiments above, the case has been explained where while each wafer replacement is being performed on the wafer stage WST side, the Sec-BCHK (interval) is performed using CD bar 46 on the measurement stage MST side. However, the present invention is not limited to this, and at least one of uneven illuminance measurement (and illuminance measurement), aerial image measurement, wavefront aberration measurement and the like may be performed using the measuring instruments (measurement members) of measurement stage MST, and the measurement result may also be reflected in exposure of a wafer to be performed after that. Specifically, for example, adjustment of projection optical system PL can be performed by adjustment unit 68 based on the measurement result.

Further, in each of the embodiments above, the scales are arranged also on measurement stage MST and position control of the measurement stage may also be performed using the encoder system (head units) described above. That is, a movable body whose position information is measured by the encoder system is not limited to the wafer stage.

Incidentally, in view of decrease in size and weight of wafer stage WST, the scales are preferably placed as close as possible to wafer W on wafer stage WST. When it is allowed that the size of the wafer stage is increased, however, two each in the X-axis direction and the Y-axis direction, that is, a total of four pieces of position information may be constantly measurable at least in an exposure operation of a wafer by increasing the size of the wafer stage and increasing the distance between a pair of scales placed facing each other. Further, instead of increasing the size of the wafer stage, for example, by arranging the scale so that a portion of the scale protrudes from the wafer stage, or placing a scale on the outer side of the wafer stage main section using an auxiliary plate on which at least one scale is arranged, the distance between a pair of scales arranged facing each other may also be increased similarly.

Further, in each of the embodiments above, in order to prevent reduction in measurement accuracy due to adherence of foreign particles or stains to Y scales $39Y_1$ and $39Y_2$ and X scales $39X_1$ and $39X_2$, for example, coating may be applied to the surface so as to cover at least the diffraction gratings, or a cover glass may be arranged. In this case, in a liquid immersion exposure apparatus in particular, a liquid repellent protective film may also be coated on the scales (grating surfaces), or a liquid repellent film may also be formed on the surface (upper surface) of the cover glass. Moreover, each scale is to have diffraction gratings that are consecutively formed on the substantially entire area in its longitudinal direction, but for example, diffraction gratings may also be intermittently formed on a plurality of divided areas, or each moving scale may be constituted by a plurality of scales. Further, in each of the embodiments above, the case has been exemplified where an encoder by a diffraction interference method is used as the encoder. However, the present invention is not limited to such an encoder, and an encoder by a so-called pickup method, or a magnetic method may also be used, and in addition, a so-called scan encoder that is disclosed in, for example, the U.S. Pat. No. 6,639,686 and the like may also be used.

Further, in each of the embodiments above, as the Z sensors, instead of the sensor by the optical pickup method described earlier, for example, a sensor having the following configuration may also be used, that is, the configuration which is equipped with: a first sensor (which may be a sensor by an optical pickup method or other optical displacement sensors) that optically reads the displacement of a measurement-subject surface in the Z-axis direction by projecting a probe beam to the measurement-subject surface and receiving the reflected light; a drive section that drives the first sensor in the Z-axis direction; and a second sensor (such as an encoder) that measures the displacement of the first sensor in the Z-axis direction. In the Z sensor having such configuration, the following modes can be set, that is, a mode (a first servocontrol mode) in which the drive section drives the first sensor in the Z-axis direction based on the output of the first sensor so that a distance in the Z-axis direction between the measurement-subject surface, for example, the surface of the scale and the first sensor is constant at all times, and a mode (a second servocontrol mode) in which the target value of the second sensor is given from the outside (the controller) and the drive section maintains the position of the first sensor in the Z-axis direction so that the measurement value of the second sensor coincides with the target value. In the case of the first servocontrol mode, the output of the measurement section (second sensor) can be used as the output of the Z sensor, and in the case of the second servocontrol mode, the output of the first sensor can be used as the output of the Z sensor. Further, in the case such a Z sensor is used and an encoder is employed as the second sensor, as a consequence, position information of wafer stage WST (wafer table WTB) in directions of six degrees of freedom can be measured using the encoder. Further, in each of the embodiments above, as the Z sensor, sensors by other detection methods can also be employed.

Further, in each of the embodiments above, the configuration and the combination of a plurality of interferometers that measure position information of wafer stage WST are not limited to the configuration and the combination described above. Any configuration and any combination of the interferometers may be employed as far as position information of wafer stage WST in directions other than the measurement direction of the encoder system can be measured. The point is that a measurement unit (regardless of whether it is an interferometer), which can measure position information of wafer stage WST in directions other than the measurement direction of the encoder system, only has to be equipped in addition to the encoder system described above. For example, the above-described Z sensors may also be used as the measurement unit.

Further, in each of the embodiments above, the Z sensors are to be arranged besides the multipoint AF system. However, for example, if the multipoint AF system can detect surface position information at exposure-subject shot areas of wafer W when exposure is performed, the Z sensors do not always have to be arranged.

Incidentally, in each of the embodiments above, pure water (water) is to be used as liquid, however, the present invention is not limited to this as matter of course. As the liquid, liquid that is chemically stable, having high transmittance to illumination light IL and safe to use, such as a fluorine-containing inert liquid may be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 may be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of the above-described predetermined liquids may be used, or a liquid obtained by adding (mixing) the predetermined liquid to (with) pure water may also be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water may also be used. Moreover, a liquid obtained by adding (mixing) particles of Al oxide or the like to (with) pure water may also be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protective film (topcoat film), an antireflection film, or the like) coated on the surface of a wafer, is preferable. Further, in the case an $F_2$ laser is used as the light source, fomblin oil may be selected.

Further, in each of the embodiments above, the recovered liquid may be reused, and in this case, a filter that removes impurities from the recovered liquid is preferably arranged in a liquid recovery unit, a recovery pipe or the like.

Incidentally, in each of the embodiments above, the case has been described where the exposure apparatus is a liquid immersion type exposure apparatus. However, the present invention is not limited to thereto, but can also be suitably applied to a dry type exposure apparatus that performs exposure of wafer W without liquid (water).

Further, in the each of the embodiments above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted using encoders, occurrence of position measurement error caused by air fluctuations can substantially be nulled likewise. In this case, it becomes possible to set the position of the stage with high precision based on the measurement values of the encoders and each of the correction information described above, and as a consequence, highly accurate transfer of a reticle pattern onto the object can be performed. Further, the present invention can also be applied to a reduction projection exposure apparatus by a step-and-stitch method that synthesizes a shot area and a shot area, an exposure apparatus by a proximity method, a mirror projection aligner, or the like.

Further, the magnification of the projection optical system in the exposure apparatus in each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, the exposure area to which illumination light IL is irradiated via projection optical system PL is an on-axis area that includes optical axis AX within the field of projection optical system PL. However, for example, as is disclosed in the pamphlet of International Publication No. WO 2004/107011, the exposure area may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, but may also be circular arc, trapezoidal, parallelogram or the like.

Incidentally, a light source of the exposure apparatus in each of the embodiments above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating unit of a YAG laser or the like can also be used. Besides, as is disclosed in, for example, the pamphlet of International Publication No. WO 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytterbium), and by converting the wavelength into ultraviolet light using a nonlinear optical crystal, may also be used.

Further, in each of the embodiments above, illumination light IL of the exposure apparatus is not limited to the light having a wavelength equal to or more than 100 nm, and it is needless to say that the light having a wavelength less than 100 nm may be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides, the present invention can also be applied to an exposure apparatus that uses charged particle beams such as an electron beam or an ion beam.

Further, in each of the embodiments above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed may also be used. In the case such a variable shaped mask is used, a stage on which a wafer, a glass plate or the like is mounted is scanned with respect to the variable shaped mask, and therefore, by measuring the position of the stage using the encoder and by driving the stage based on the measurement values of the encoder and correction information according to position information of the stage in the non-measurement direction that is measured by the interferometer, the effect equivalent to that of each of the embodiments above can be obtained.

Further, as is disclosed in, for example, the pamphlet of International Publication No. WO 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the above-described embodiments and modified example is not limited to a wafer, but may be other objects such as a glass plate, a ceramic substrate, a film member, or a mask blank.

The usage of the exposure apparatus is not limited to the exposure apparatus used for manufacturing semiconductor devices. The present invention can be widely applied also to, for example, an exposure apparatus for manufacturing liquid crystal display devices which transfers a liquid crystal display device pattern onto a square-shaped glass plate, and to an exposure apparatus for manufacturing organic EL, thin-film magnetic heads, imaging devices (such as CCDs), micromachines, DNA chips or the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Incidentally, the movable body drive system and the movable body drive method of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus for specimen or a wire bonding apparatus in other precision machines.

Further, the exposure apparatus (the pattern formation apparatus) in each of the embodiments above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the above disclosures of the various publications, the pamphlets of the International Publications, and the U.S. patent application Publications and the U.S. patents that are cited in each of the embodiments above and related to exposure apparatuses and the like are each incorporated herein by reference.

Next, an embodiment of a device manufacturing method in which the foregoing exposure apparatus (pattern formation apparatus) is used in a lithography process will be described.

Figure 35:
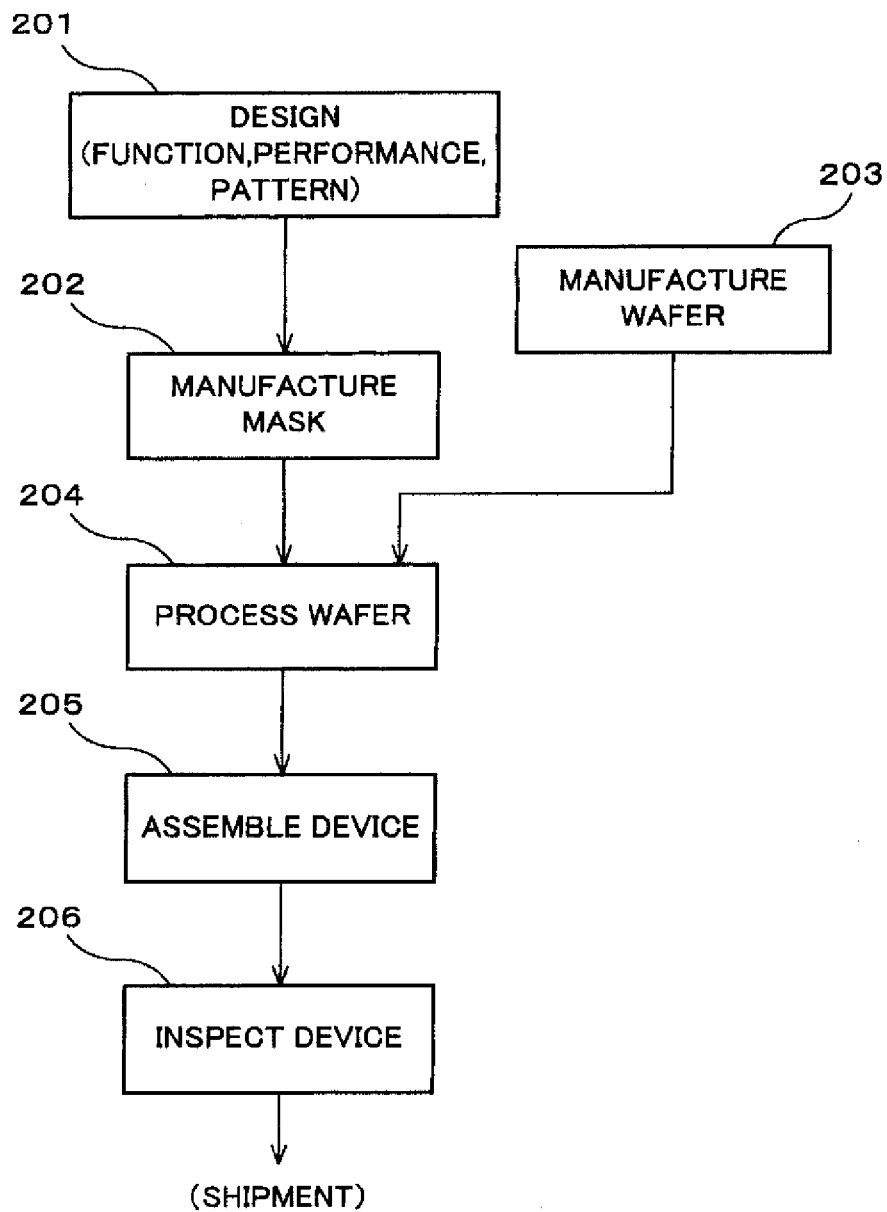
FIG. 35 is a flowchart used to explain an embodiment of a device manufacturing method.

FIG. 35 shows a flowchart of an example when manufacturing a device (a semiconductor chip such as an IC or an LSI, a liquid crystal panel, a CCD, a thin film magnetic head, a micromachine, and the like). As is shown in FIG. 35, first of all, in step 201 (design step), function and performance design of device (such as circuit design of semiconductor device) is performed, and pattern design to realize the function is performed. Then, in step 202 (mask manufacturing step), a mask on which the designed circuit pattern is formed is manufactured. Meanwhile, in step 203 (wafer manufacturing step), a wafer is manufactured using materials such as silicon.

Next, in step 204 (wafer processing step), the actual circuit and the like are formed on the wafer by lithography or the like in a manner that will be described later, using the mask and the wafer prepared in steps 201 to 203. Then, in step 205 (device assembly step), device assembly is performed using the wafer processed in step 204. Step 205 includes processes such as the dicing process, the bonding process, and the packaging process (chip encapsulation), and the like when necessary.

Finally, in step 206 (inspection step), tests on operation, durability, and the like are performed on the devices made in step 205. After these steps, the devices are completed and shipped out.

Figure 36:
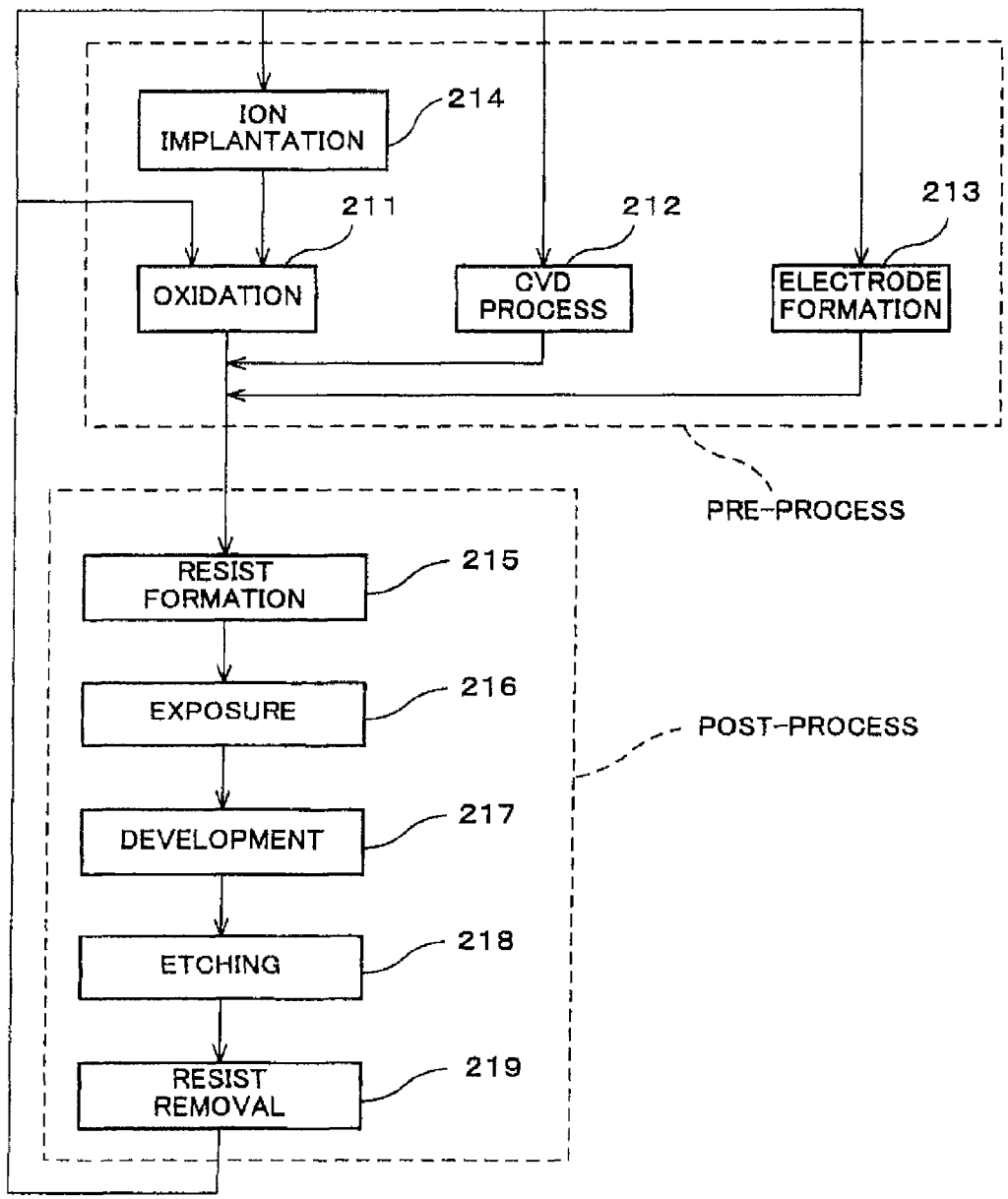
FIG. 36 is a flowchart showing a specific example of step 204 in FIG. 35.

FIG. 36 is a flowchart showing a detailed example of step 204 described above. Referring to FIG. 36, in step 211 (oxidation step), the surface of wafer is oxidized. In step 212 (CDV step), an insulating film is formed on the wafer surface. In step 213 (electrode formation step), an electrode is formed on the wafer by deposition. In step 214 (ion implantation step), ions are implanted into the wafer. Each of the above steps 211 to 214 constitutes the pre-process in each stage of wafer processing, and the necessary processing is chosen and is executed at each stage.

When the above-described pre-process ends in each stage of wafer process, post-process is executed as follows. In the post-process, first in step 215 (resist formation step), a photosensitive agent is coated on the wafer. Then, in step 216 (exposure step), the circuit pattern of the mask is transferred onto the wafer by the exposure apparatus (pattern formation apparatus) described above and the exposure method (pattern formation method) thereof. Next, in step 217 (development step), the wafer that has been exposed is developed, and in step 218 (etching step), an exposed member of an area other than the area where resist remains is removed by etching. Then, in step 219 (resist removing step), when etching is completed, the resist that is no longer necessary is removed.

By repeatedly performing the pre-process and the post-process, multiple circuit patterns are formed on the wafer.

By using the device manufacturing method of the embodiment described above, because the exposure apparatus (pattern formation apparatus) in each of the embodiments above and the exposure method (pattern formation method) thereof are used in the exposure step (step 216), exposure with high throughput can be performed while maintaining the high overlay accuracy. Accordingly, the productivity of highly integrated microdevices on which fine patterns are formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure method in which an object is exposed with an energy beam, the method including:
   mounting the object on a movable body that can move in at least a first and a second directions that are orthogonal within a predetermined plane; and
   driving the movable body within the predetermined plane, based on measurement information of an encoder system in which one of a grating section and a head unit is arranged on the movable body on which the object is mounted and the other of the grating section and the head unit is arranged facing the movable body and which measures position information of the movable body within the predetermined plane, and based on information on flatness of the grating section, wherein
   the information on flatness of the grating section relates to a measurement error of the encoder system due to a deviation or a displacement of a grating surface of the grating section from a plane that is parallel to the predetermined plane.

2. The exposure method according to claim 1, wherein
   the movable body is driven also based on information on a formation error of the grating section.

3. The exposure method according to claim 1, wherein the movable body is driven also based on position information of the movable body in a direction different from the first and the second directions.

4. The exposure method according to claim 1, wherein the movable body is driven also based on inclination information of the movable body with respect to the predetermined plane.

5. The exposure method according to claim 1, wherein the movable body is driven also based on characteristic information of the head unit that is a factor causing a measurement error of the encoder system.

6. The exposure method according to claim 1, wherein the grating section is arranged extending in the first direction as a longitudinal direction, the head unit has a plurality of heads placed at different positions in the second direction, and position information of the movable body is measured by a head that faces the grating section out of the plurality of heads.

7. The exposure method according to claim 1, wherein the grating section is arranged on the movable body, and the head unit is arranged facing the movable body.

8. The exposure method according to claim 1, wherein by further using a measurement system that measures position information of the movable body in a third direction orthogonal to the predetermined plane by a first sensor that faces the grating section out of a plurality of sensors placed on the same side as the head unit, a position of the movable body in the third direction is controlled based on measurement information of the measurement system.

9. The exposure method according to claim 8, wherein the measurement system measures position information in the third direction and inclination information of the movable body by a second plurality of sensors including the first sensor that faces the grating section.

10. The exposure method according to claim 8, wherein out of position information of the movable body in directions of six degrees of freedom, position information in directions of three degrees of freedom including the first direction, the second direction and a rotation direction within the predetermined plane is measured by the encoder system, and position information in directions of the remaining three degrees of freedom is measured by the measurement system.

11. The exposure method according to claim 10, wherein a position of the movable body at least when performing an exposure operation is controlled based on the measured position information in directions of six degrees of freedom.

12. The exposure method according to claim 8, wherein in addition to the encoder system and the measurement system, a position measurement unit that measures position information of the object in the third direction is further used in a measurement operation of surface position information of the object.

13. The exposure method according to claim 8, wherein the encoder system and a mark detection system that detects a mark on the object are used in a detection operation of the mark.

14. The exposure method according to claim 1, wherein in order to drive the movable body, the measurement information of the encoder system is used in an exposure operation and measurement information of an interferometer system that measures position information of the movable body in at least the first and the second directions is used in an operation different from the exposure operation.

15. The exposure method according to claim 14, wherein the measurement information of the encoder system is used in a detection operation of a mark and/or surface position information of the object.

16. The exposure method according to claim 14, wherein at least part of the measurement information of the interferometer system is used in the exposure operation.

17. A device manufacturing method including a lithography process, wherein
in the lithography process, a sensitive object is exposed and a pattern is formed on the sensitive object using the exposure method according to claim 1.

18. An exposure method in which an object is exposed with an energy beam, the method including:
mounting the object on a movable body that can move in at least a first and a second directions that are orthogonal within a predetermined plane; and
controlling a position of the movable body within the predetermined plane, based on measurement information of an encoder system in which one of a grating section and a head unit is arranged on the movable body on which the object is mounted and the other of the grating section and the head unit is arranged facing the movable body and which measures position information of the movable body within the predetermined plane, and based on correction information to compensate a measurement error of the encoder system that occurs due to flatness of the grating section with respect to a plane that is parallel to the predetermined plane.

19. The exposure method according to claim 18, wherein by the correction information, a measurement error of the encoder system that occurs due to a formation error of the grating section is also compensated.

20. The exposure method according to claim 18, wherein by the correction information, a measurement error of the encoder system that occurs due to a displacement of the movable body in a different direction from the first and the second directions is also compensated.

21. The exposure method according to claim 20, wherein the different direction includes at least one of a direction orthogonal to the predetermined plane, a rotation direction around an axis orthogonal to the predetermined plane, and a rotation direction around an axis parallel to the predetermined plane.

22. The exposure method according to claim 21, wherein by the correction information, a measurement error of the encoder system that occurs due to at least a formation error of the grating section is compensated.

23. The exposure method according to claim 18, wherein by the correction information, a measurement error of the encoder system that occurs due to inclination of the movable body with respect to the predetermined plane is also compensated.

24. The exposure method according to claim 23, wherein by the correction information, a measurement error of the encoder system that occurs due to at least a formation error of the grating section is compensated.

25. The exposure method according to claim 18, wherein by the correction information, a measurement error of the encoder system that occurs due to the head unit is also compensated.

26. The exposure method according to claim 25, wherein by the correction information, a measurement error of the encoder system that occurs due to at least optical characteristics of the head unit is compensated.

27. The exposure method according to claim 25, wherein by the correction information, a measurement error of the encoder system that occurs due to at least a formation error of the grating section is compensated.

28. The exposure method according to claim 18, wherein the measurement information of the encoder system or a target position at which the movable body is positioned is corrected based on the correction information.

29. The exposure method according to claim 18, wherein the object is exposed by the energy beam via a mask, and when the exposure is performed, a position of the mask is controlled based on the correction information so that the measurement error is compensated, while driving the movable body based on the measurement information of the encoder system.

30. The exposure method according to claim 18, wherein the grating section is arranged extending in the first direction as a longitudinal direction, the head unit has a plurality of heads placed at different positions in the second direction, and position information of the movable body is measured by a head that faces the grating section out of the plurality of heads.

31. The exposure method according to claim 18, wherein the grating section is arranged on the movable body, and the head unit is arranged facing the movable body.

32. The exposure method according to claim 18, wherein by further using a measurement system that measures position information of the movable body in a third direction orthogonal to the predetermined plane by a first sensor that faces the grating section out of a plurality of sensors placed on the same side as the head unit, a position of the movable body in the third direction is controlled based on measurement information of the measurement system.

33. The exposure method according to claim 32, wherein the measurement system measures position information in the third direction and inclination information of the movable body by a second plurality of sensors including the first sensor that faces the grating section.

34. The exposure method according to claim 32, wherein out of position information of the movable body in directions of six degrees of freedom, position information in directions of three degrees of freedom including the first direction, the second direction and a rotation direction within the predetermined plane is measured by the encoder system, and position information in directions of the remaining three degrees of freedom is measured by the measurement system.

35. The exposure method according to claim 34, wherein a position of the movable body at least when performing an exposure operation is controlled based on the measured position information in directions of six degrees of freedom.

36. The exposure method according to claim 32, wherein in addition to the encoder system and the measurement system, a position measurement unit that measures position information of the object in the third direction is further used in a measurement operation of surface position information of the object.

37. The exposure method according to claim 32, wherein the encoder system and a mark detection system that detects a mark on the object are used in a detection operation of the mark.

38. The exposure method according to claim 18, wherein:
in order to drive the movable body, the measurement information of the encoder system is used in an exposure operation and measurement information of an interferometer system that measures position information of the movable body in at least the first and the second directions is used in an operation different from the exposure operation.

39. The exposure method according to claim 38, wherein the measurement information of the encoder system is used in a detection operation of a mark and/or surface position information of the object.

40. The exposure method according to claim 38, wherein at least part of the measurement information of the interferometer system is used in the exposure operation.

41. A device manufacturing method including a lithography process, wherein
in the lithography process, a sensitive object is exposed and a pattern is formed on the sensitive object using the exposure method according to claim 18.

42. An exposure apparatus that exposes an object with an energy beam, the apparatus comprising:
a movable body that can move in at least a first and a second directions that are orthogonal within a predetermined plane, holding the object;
an encoder system in which one of a grating section and a head unit is arranged on the movable body on which the object is held and the other of the grating section and the head unit is arranged facing the movable body and which measures position information of the movable body within the predetermined plane; and
a drive unit that drives the movable body within the predetermined plane based on measurement information of the encoder system and information on flatness of the grating section, wherein
the information on flatness of the grating section relates to a measurement error of the encoder system due to a deviation or a displacement of a grating surface of the grating section from a plane that is parallel to the predetermined plane.

43. The exposure apparatus according to claim 42, wherein the movable body is driven also based on information on a formation error of the grating section.

44. The exposure apparatus according to claim 42, wherein the movable body is driven also based on position information of the movable body in a direction different from the first and the second directions.

45. The exposure apparatus according to claim 42, wherein the movable body is driven also based on inclination information of the movable body with respect to the predetermined plane.

46. The exposure apparatus according to claim 42, wherein the movable body is driven also based on characteristic information of the head unit that is a factor causing a measurement error of the encoder system.

47. The exposure apparatus according to claim 42, wherein the grating section is arranged extending in the first direction as a longitudinal direction, the head unit has a plurality of heads placed at different positions in the second direction, and position information of the movable body is measured by a head that faces the grating section out of the plurality of heads.

48. The exposure apparatus according to claim 42, wherein the grating section is arranged on the movable body, and the head unit is arranged facing the movable body.

49. The exposure apparatus according to claim 42, further comprising:

a measurement system that measures position information of the movable body in a third direction orthogonal to the predetermined plane by a first sensor that faces the grating section out of a plurality of sensors placed on the same side as the head unit, wherein a position of the movable body in the third direction is controlled based on measurement information of the measurement system.

50. The exposure apparatus according to claim 49, wherein the measurement system measures position information in the third direction and inclination information of the movable body by a second plurality of sensors including the first sensor that faces the grating section.

51. The exposure apparatus according to claim 49, wherein out of position information of the movable body in directions of six degrees of freedom, position information in directions of three degrees of freedom including the first direction, the second direction and a rotation direction within the predetermined plane is measured by the encoder system, and position information in directions of the remaining three degrees of freedom is measured by the measurement system.

52. The exposure apparatus according to claim 51, wherein a position of the movable body at least when performing an exposure operation is controlled based on the measured position information in directions of six degrees of freedom.

53. The exposure apparatus according to claim 49, further comprising:

a position measurement unit that measures position information of the object in the third direction, wherein the encoder system, the measurement system and the position measurement unit are used in a measurement operation of surface position information of the object.

54. The exposure apparatus according to claim 49, further comprising:

a mark detection system that detects a mark on the object, wherein the encoder system and the mark detection system are used in a detection operation of the mark.

55. The exposure apparatus according to claim 42, further comprising:

an interferometer system that measures position information of the movable body in at least the first and the second directions, wherein in order to drive the movable body, the measurement information of the encoder system is used in an exposure operation and measurement information of the interferometer system is used in an operation different from the exposure operation.

56. The exposure apparatus according to claim 55, wherein the measurement information of the encoder system is used in a detection operation of a mark and/or surface position information of the object.

57. The exposure apparatus according to claim 55, wherein at least part of the measurement information of the interferometer system is used in the exposure operation.

58. An exposure apparatus that exposes an object with an energy beam, the apparatus comprising:

a movable body that can move in at least a first and a second directions that are orthogonal within a predetermined plane, holding the object;

an encoder system in which one of a grating section and a head unit is arranged on the movable body on which the object is held and the other of the grating section and the head unit is arranged facing the movable body and which measures position information of the movable body within the predetermined plane; and a controller that controls a position of the movable body within the predetermined plane, based on correction information to compensate a measurement error of the encoder system that occurs due to flatness of the grating section with respect to a plane that is parallel to the predetermined plane and based on measurement information of the encoder system.

59. The exposure apparatus according to claim 58, wherein by the correction information, a measurement error of the encoder system that occurs due to a formation error of the grating section is also compensated.

60. The exposure apparatus according to claim 58, wherein by the correction information, a measurement error of the encoder system that occurs due to a displacement of the movable body in a different direction from the first and the second directions is also compensated.

61. The exposure apparatus according to claim 60, wherein the different direction includes at least one of a direction orthogonal to the predetermined plane, a rotation direction around an axis orthogonal to the predetermined plane, and a rotation direction around an axis parallel to the predetermined plane.

62. The exposure apparatus according to claim 61, wherein by the correction information, a measurement error of the encoder system that occurs due to at least a formation error of the grating section is compensated.

63. The exposure apparatus according to claim 58, wherein by the correction information, a measurement error of the encoder system that occurs due to inclination of the movable body with respect to the predetermined plane is also compensated.

64. The exposure apparatus according to claim 63, wherein by the correction information, a measurement error of the encoder system that occurs due to at least a formation error of the grating section is compensated.

65. The exposure apparatus according to claim 58, wherein by the correction information, a measurement error of the encoder system that occurs due to the head unit is also compensated.

66. The exposure apparatus according to claim 65, wherein by the correction information, a measurement error of the encoder system that occurs due to at least optical characteristics of the head unit is compensated.

67. The exposure apparatus according to claim 65, wherein by the correction information, a measurement error of the encoder system that occurs due to at least a formation error of the grating section is compensated.

68. The exposure apparatus according to claim 58, wherein the measurement information of the encoder system or a target position at which the movable body is positioned is corrected based on the correction information.

69. The exposure apparatus according to claim 58, wherein the object is exposed by the energy beam via a mask, and when the exposure is performed, a position of the mask is controlled based on the correction information so that the measurement error is compensated, while driving the movable body based on the measurement information of the encoder system.

70. The exposure apparatus according to claim 58, wherein the grating section is arranged extending in the first direction as a longitudinal direction, the head unit has a plurality of heads placed at different positions in the second direction, and position information of the movable body is measured by a head that faces the grating section out of the plurality of heads.

71. The exposure apparatus according to claim 58, wherein the grating section is arranged on the movable body, and the head unit is arranged facing the movable body.

72. The exposure apparatus according to claim 58, further comprising:
   a measurement system that measures position information of the movable body in a third direction orthogonal to the predetermined plane by a first sensor that faces the grating section out of a plurality of sensors placed on the same side as the head unit, wherein a position of the movable body in the third direction is controlled based on measurement information of the measurement system.

73. The exposure apparatus according to claim 72, wherein the measurement system measures position information in the third direction and inclination information of the movable body by a second plurality of sensors including the first sensor that faces the grating section.

74. The exposure apparatus according to claim 72, wherein out of position information of the movable body in directions of six degrees of freedom, position information in directions of three degrees of freedom including the first direction, the second direction and a rotation direction within the predetermined plane is measured by the encoder system, and position information in directions of the remaining three degrees of freedom is measured by the measurement system.

75. The exposure apparatus according to claim 74, wherein a position of the movable body at least when performing an exposure operation is controlled based on the measured position information in directions of six degrees of freedom.

76. The exposure apparatus according to claim 72, further comprising:
   a position measurement unit that measures position information of the object in the third direction, wherein
   the encoder system, the measurement system and the position measurement unit are used in a measurement operation of surface position information of the object.

77. The exposure apparatus according to claim 72, further comprising:
   a mark detection system that detects a mark on the object, wherein
   the encoder system and the mark detection system are used in a detection operation of the mark.

78. The exposure apparatus according to claim 58, further comprising:
   an interferometer system that measures position information of the movable body in at least the first and the second directions, wherein
   in order to drive the movable body, the measurement information of the encoder system is used in an exposure operation and measurement information of the interferometer system is used in an operation different from the exposure operation.

79. The exposure apparatus according to claim 78, wherein the measurement information of the encoder system is used in a detection operation of a mark and/or surface position information of the object.

80. The exposure apparatus according to claim 78, wherein at least part of the measurement information of the interferometer system is used in the exposure operation.

* * * * *

UNITED STATES PATENT AND TRADEMARK OFFICE
CERTIFICATE OF CORRECTION

| | | |
|---|---|---|
| PATENT NO. | : 8,947,639 B2 | Page 1 of 1 |
| APPLICATION NO. | : 13/469828 | |
| DATED | : February 3, 2015 | |
| INVENTOR(S) | : Shibazaki | |

It is certified that error appears in the above-identified patent and that said Letters Patent is hereby corrected as shown below:

On the Title Page

Item (56), Line 7, change "DE 221 563 A1" to -- DD 221 563 A1 --
Item (56), Line 8, change "DE 224 448 A1" to -- DD 224 448 A1 --

Signed and Sealed this
Eleventh Day of August, 2015

Michelle K. Lee
*Director of the United States Patent and Trademark Office*